United States Patent
Koike-Akino et al.

(10) Patent No.: US 11,463,114 B2
(45) Date of Patent: Oct. 4, 2022

(54) PROTOGRAPH QUASI-CYCLIC POLAR CODES AND RELATED LOW-DENSITY GENERATOR MATRIX FAMILY

(71) Applicant: Mitsubishi Electric Research Laboratories, Inc., Cambridge, MA (US)

(72) Inventors: Toshiaki Koike-Akino, Boston, MA (US); Ye Wang, Boston, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 17/181,819

(22) Filed: Feb. 22, 2021

(65) Prior Publication Data

US 2022/0278698 A1 Sep. 1, 2022

(51) Int. Cl.
| | |
|---|---|
| *H03M 13/00* | (2006.01) |
| *H03M 13/45* | (2006.01) |
| *H03M 13/13* | (2006.01) |
| *G06F 13/42* | (2006.01) |
| *G06F 13/40* | (2006.01) |

(52) U.S. Cl.
CPC ...... *H03M 13/458* (2013.01); *G06F 13/4027* (2013.01); *G06F 13/4282* (2013.01); *H03M 13/13* (2013.01); *H03M 13/616* (2013.01)

(58) Field of Classification Search
CPC .. H03M 13/458; H03M 13/13; H03M 13/616; G06F 13/4282; G06F 13/4027
See application file for complete search history.

(56) References Cited

U.S. PATENT DOCUMENTS

| | | |
|---|---|---|
| 7,343,539 B2 | 3/2008 | Divsalar et al. |
| 8,239,746 B2 | 8/2012 | Divsalar et al. |
| 8,347,186 B1 | 1/2013 | Arikan et al. |
| 8,595,589 B2 | 11/2013 | Yedidia et al. |
| 9,176,927 B2 | 11/2015 | Gross et al. |
| 9,294,130 B1 | 3/2016 | Chaichanavong et al. |
| 9,503,126 B2 | 11/2016 | Vardy et al. |
| 10,153,787 B2 * | 12/2018 | El-Khamy ............ G06F 30/398 |
| 10,312,946 B2 | 6/2019 | Wang et al. |
| 10,313,056 B2 | 6/2019 | Koike-Akino et al. |
| 2018/0083655 A1 | 3/2018 | El-Khamy et al. |
| 2019/0036550 A1 | 1/2019 | Koike-Akino |

* cited by examiner

*Primary Examiner* — Samir W Rizk
(74) *Attorney, Agent, or Firm* — Gennadiy Vinokur; Hironori Tsukamoto

(57) ABSTRACT

Data communications and storage systems require error control techniques to be transferred successfully without failure. Polar coding has been used as a state-of-the-art forward error correction code for such an error control technique. However, the conventional decoding based on successive cancellation has a drawback in its poor performance and long latency to complete. Because the factor graph of polar codes has a lot of short cycles, a parallelizable belief propagation decoding also does not perform well. The method and system of the present invention provide a way to resolve the issues by introducing a protograph lifting expansion for a polar coding family so that highly parallelizable decoding is realized to achieve a high coding gain and high throughput without increasing the computational complexity and latency. The invention enables an iterative message passing to work properly by eliminating short cycles through a hill-climbing optimization of frozen bits allocation and permutation.

27 Claims, 25 Drawing Sheets

PROTOGRAPH QUASI-CYCLIC POLAR CODES AND RELATED LOW-DENSITY GENERATOR MATRIX FAMILY

FIELD OF THE INVENTION

The present invention relates generally to the field of error-correcting codes for data storage and data transmission, and more particularly to a method and system for protograph-based quasi-cyclic polar codes and its generalized low-density generator matrix family.

BACKGROUND OF THE INVENTION

Capacity-approaching forward error correction (FEC) based on low-density parity-check (LDPC) codes have made a great contribution to improving the reliability of data storage, wireless and optical data transmission systems. LDPC codes use a parity-check matrix (PCM), H, of size M×N, where M and N denote the number of parity bits and the length of codeword bits, respectively. A code rate is defined as the net information bit per codeword length, i.e., K/N, where the number of information bits is at most K=N−M. For binary LDPC codes, the PCM is constructed with either '0' or '1'. For non-binary cases with a Galois field size of Q, the element of the PCM is formed with an integer from 0 to Q−1. The PCM restricts the valid codeword such that M parity equations for the N-bit codeword are all zeros; i.e., x $H^T$=0 (with $[.]^T$ denoting a transpose) in module-2 arithmetic for binary codes, where x is a row vector representing an N-bit binary codeword. The PCM of LDPC codes can be represented by a factor graph or bipartite graph, where N coded bits are expressed by variable nodes (VNs) and M parity checks are denoted by check nodes (CNs). When the (i, j)-th element of PCM is non-zero, the i-th CN and j-th VN are mutually connected in the factor graph. Typically, LDPC codes can be decoded by parallelizable belief-propagation (BP) decoding, which uses specific rules at VNs and CNs to propagate belief messages to correct potential errors given channel outputs, e.g., in the form of log-likelihood ratios (LLRs). The BP decoding uses iterative message passing such as the sum-product algorithm, delta-min algorithm, and min-sum algorithm according to a specific scheduling such as layered round-robin and flooding.

Protograph codes were introduced for designing LDPC codes or accumulate-repeat-accumulate (ARA) codes, where the 1's in the PCM are replaced with permutation matrices of size Q×Q and the 0's are replaced with the all-zero matrix of size Q×Q. The permutation size Q is also called a lifting size. From a compact protograph, the real factor graph is formed by lifting operation, which replicates the identical short graphs for Q times, and permutes the edges across the replicated graphs. This is equivalently the parallel use of Q-fold LDPC codes with coupling by permuted message exchanges. The total codeword length is increased to QN. The most typical choice of the permutation matrix is a weight-1 circulant matrix, obtained by cyclically right-shifting an identity matrix of size Q×Q by s positions, where s is a circulant shift value to design. For this case, the protograph LDPC codes are called quasi-cyclic (QC) LDPC codes. The QC LDPC codes have many practical advantages; e.g., i) The circulant permutation is easy to implement in hardware; ii) The base PCM is easier to design as its codeword length is Q-fold shorter; iii) The protograph codes can be lower-density with the lifting factor Q increases even if the original PCM is dense; and iv) Short cycles in factor graphs can be readily increased by circulant shift designs. It was shown that conventional regular QC LDPC codes have a maximum girth of 12; where the girth is the length of the shortest cycle in the code graph. It is particularly important to maximize the code girth for BP decoding to work properly in loopy graphs. For some irregular QC LDPC codes, the girth larger than 12 was shown feasible. Supposing that short cycles are eliminated by maximizing the girth, the performance of QC LDPC codes can be analyzed by protograph extrinsic information transfer (P-EXIT) technique, which tracks the mutual information across message paths in the protograph. As the protograph is Q-fold more compact than the exact factor graph, the P-EXIT analysis is more efficient for QC LDPC codes.

Using QC LDPC codes such as spatially-coupled (SC) LDPC codes, the error-correction performance close to the Shannon limit was practically realized in modern systems. However, the pursuit of high LDPC performance has led to a significant increase in power consumption and circuit size. Hence, attaining a good trade-off between performance and computational complexity is of greater importance for practical systems. In addition, recent high-performance LDPC codes usually require very large codeword lengths causing a long decoding latency, whereas shorter FEC codes are preferred for latency-constrained systems, such as Internet-of-Things (IoT) applications and machine-to-machine (M2M) communications. Furthermore, LDPC codes are not suited for efficient encoding in general because the code design is based on the PCM optimization, whereas the codeword generation requires the corresponding generator matrix (GM), G, of size N×K. The GM usually requires the Gaussian elimination of the PCM such that it satisfies G $H^T$=0 to generate an N-bit codeword x from a K-bit information data u as x=u G.

Recently, polar codes have received much attention as alternative capacity-approaching codes in place of LDPC codes for short block lengths. It has been proved that polar codes can asymptotically achieve channel capacity in any arbitrary channels due to the so-called polarization phenomenon, even with a simple algorithm of successive cancellation (SC) decoding. Besides encoder design methods such as density evolution (DE), a number of decoder algorithms were developed, including successive cancellation list (SCL) decoding and BP list decoding. With SCL decoding, polar codes have become highly competitive with state-of-the-art LDPC codes. Particularly, it was revealed that the SCL decoding performance highly depends on an embedded cyclic-redundancy check (CRC) polynomial, and that minimum Hamming distance of polar-CRC concatenation codes can be increased by properly designed CRC codes. To date, various extended versions based on polar coding have also been proposed in the literature; e.g., nonbinary polar codes, mixed-kernel polar codes, irregular polar codes, concatenated polar codes, convolutional polar codes, and polar turbo product codes.

An n-stage polar code with K information bits and N=$2^n$ encoded bits uses an N×N generator matrix G=$F^{\otimes n}$ for encoding, where $[\bullet]^{\otimes n}$ denotes the n-fold Kronecker power and F is an order-2 binary kernel matrix of size 2×2. Due to the nature of the Kronecker product, polar encoding and decoding can be performed at a complexity on the log-linear order of $\mathcal{O}[N \log_2 N]$, where $\mathcal{O}[.]$ denotes the big-o complexity order. The multi-stage operations of the Kronecker products give rise to the polarization phenomenon to asymptotically approach capacity in arbitrary channels. The polar coding maps the information bits to the K most reliable locations in u. The remaining M=N−K input bits are frozen bits, known to both the encoder and decoder. The frozen bit locations can be selected, e.g., by Bhattacharyya parameter, DE, Gaussian approximation, EXIT evolution, beta expansion, genetic algorithm, and deep learning.

The original SC decoder proceeds sequentially over the bits, from $u_1$ to $u_N$. For each index i, an estimate $\hat{u}_i$ for bit $u_i$ is made as follows. If $u_i$ is a frozen bit, then $\hat{u}_i$ is set to the known value of $u_i$, and otherwise $\hat{u}_i$ is set to the most likely value for $u_i$ given the channel outputs under an assumption that the previous estimates $[\hat{u}_1, \hat{u}_2, \ldots, \hat{u}_{i-1}]$ are correct. The SC decoding can be improved by the SCL decoder, which proceeds similarly to the SC decoder, except that for each data bit, the decoder retains both possible estimates, $\hat{u}_i=0$ and $\hat{u}_i=1$, in subsequent decoding paths. If left unchecked, this branching would double the number of paths each at information data leading to exponentially increasing paths being considered. Since handling an exponentially increasing number of paths is impractical, the list-decoding approach culls the number of paths to a fixed-size list of the most likely partial paths. This procedure produces a fixed-size list of full decoding paths to consider, from which the most likely full path is selected to produce the estimated data sequence. The combination of SCL decoding with an embedded CRC code to reject invalid paths yields significantly improved performance.

Since the polar codes are based on GM instead of PCM, unlike LDPC codes, both encoding and decoding can be systematically carried out without extra computations. Although the log-linear complexity of the polar SCL decoding is a major drawback in comparison to the linear complexity of LDPC BP decoding for long codeword lengths, it turns out to be an advantage when shorter block sizes are preferred in order to decrease decoding latency. It was demonstrated that the polar decoding is more efficient than typical LDPC decoding at short block lengths. This promoted the polar codes as a strong candidate for latency-critical systems.

Nevertheless, polar SCL decoding is not very amenable to parallel implementation due to the nature of the sequential decoding algorithm, which causes longer latency. Even though parallelizable BP decoding can be used for polar decoding, there has existed a long-standing issue that the BP decoding does not perform well for polar codes due to an inherently short girth of 4. Although nonbinary polar codes and polar product codes can partially provide a limited parallelism, the computational complexity for encoding and decoding is considerably increased in comparison to the regular binary polar codes.

SUMMARY OF THE INVENTION

Some embodiments of the present invention are based on the recognition that data communications and data storage require error control techniques to be sent successfully without failure. As a forward error correction, polar coding was demonstrated to achieve the channel capacity by using successive cancellation decoding. However, successive cancellation decoding has a drawback in its poor performance and long latency to complete. Because the factor graph of the polar codes has a lot of short cycles, a parallelizable belief propagation decoding also does not perform well. The method and system of the present invention provide a way to resolve the issues by introducing a protograph lifting expansion for a polar coding family so that highly parallelizable decoding is realized to achieve a high coding gain and high throughput without increasing the computational complexity and latency. The invention enables an iterative message passing to work properly by eliminating short cycles through a hill-climbing optimization of frozen bits allocation and protograph permutation. Some embodiments use quasi-cyclic (QC) permutation, realizing a highly parallelizable structure suited for a hardware implementation. Also, another embodiment uses an irregular pruning of proto-polarization units in the protograph to further reduce the complexity, the latency, and the number of short cycles. It enables shallow polarization stages to outperform conventional deep polarization stages without a protograph lifting. Some embodiments further generalize the generator matrix of any liner codes with a multi-stage decomposition to construct a polar-type low-density generator matrix (LDGM) code family. Some embodiments enable a low-latency windowed scheduling with a spatial coupling in a staircase manner.

The present disclosure provides a new polar coding based on protograph design, where fully parallel short polar codes are coupled with computation-free permuted message exchanges at intermediate polarization stages to realize high coding gain, low computational complexity, low decoding latency, and high-throughput processing at the same time. The method and system of the invention provide a novel family of protograph-based polar codes, called quasi-cyclic (QC) polar codes, which have circulant permutations at proto-polarization units, for some embodiments. With a proper circulant shift value, the QC polar codes can eliminate short cycles in the code graph, which achieves a remarkable breakthrough toward resolving a long-standing issue that the BP decoding does not perform well for the conventional polar codes. In the QC polar codes, highly parallel short polar codes are coupled to achieve performance comparable to longer polar codes while maintaining the computational complexity as low as that of shorter polar codes.

The present disclosure is different from any conventional protograph codes which have been based on lifting operations of the PCM for designing LDPC codes or accumulate-repeat-accumulate (ARA) codes. The method and system of the invention generalize the concept of the protograph towards lifting operations of the GM for designing a low-density generator matrix (LDGM), unlike LDPC codes. Because the codes are based on GM, there is no difficulty in encoding unlike the conventional protograph LDPC codes. In addition, the present invention provides a multi-stage structure by lifting the GM of polarization operations, which realize a new concept of proto-polarization, achieving a polarization phenomenon to approach the channel capacity. For some embodiments of the protograph LDGM codes, the protograph-based polar codes are realized to achieve a benefit of structured encoding and decoding inherent to polar coding. Specifically, a polarization unit used in the conventional polar codes is replaced with a proto-polarization unit which comprises of proto-variable nodes and proto-check nodes to process multiple bits at once through a lifting operation. Some embodiments use highly parallelizable QC polar codes replicated by a lifting operation, as a special case of protograph, using a circulant permutation at proto-polarization units. It realizes a hardware-friendly parallel encoding and decoding without increasing any computational complexity but increasing degrees of freedom in code design.

The QC polar codes can significantly reduce the computational complexity with a protograph lifting factor. Furthermore, the present invention can eliminate short cycles of the protograph polar codes to increase the girth via a hill-climbing method. Eliminating short cycles enables the BP decoding to properly work for the QC polar codes. The QC polar codes with shallow polarization stages can achieve competitive performance of deeper polarization codes. Further complexity reduction and performance improvement are realized with irregular pruning of proto-polarization units to cut loops in the protograph for some embodiments.

Some embodiments are based on recognition that the computational complexity and decoding latency of the polar codes are on the order of a log-linear function of the number of codeword bits, unlike the LDPC codes. Therefore, reducing the codeword lengths can significantly decrease the required computational complexity as well as decoding latency. The present disclosure provides a method and system to use multiple short polar encoders and decoders implemented in a fully parallel fashion with no additional complexity besides circulant message exchanges. It realizes a low computational complexity and low decoding latency equivalent to those of shorter polar codes, while performing better than the conventional short polar codes.

Some embodiments are based on another recognition that while the polar codes converges toward optimal coding performance close to the Shannon limit for deep polarization stages, its practical error correction performance for shorter code lengths can be improved by spatially coupling multiple polar codes. The method of the invention enables shallow polarization to achieve comparable performance to that deeper polarization offers without additional complexity. Some embodiments are realized with spatial coupling of inhomogeneous short polar codes, which have non-identical frozen bit locations. For example, a spatial coupling with a staircase lifting operation enables a low-latency windowed decoding for infinitely large codeword lengths for some embodiments.

For some embodiments, multiple cyclic redundancy check (CRC) codes are embedded across spatially coupled encoders so that each bit plane can be independently determined as incremental frozen bits. The method of the invention realizes an accelerated convergence of iterative message passing algorithms by using the incremental frozen bits. Some embodiments use a stochastic hard decision based on the magnitude of belief messages to create a list of hard-decision candidates to improve the possibility of being a valid CRC codeword. Using a high lifting factor, a rate loss due to multi-CRC redundancy can be negligible in some embodiments.

Some embodiments are based on the realization that the girth of polar codes can be increased significantly by using proper permutation matrices in the protograph, while the conventional polar codes are inherently of girth-4. Because of the short girth, the conventional polar codes do not work well with iterative decoding such as BP decoding since message passing is often trapped in a short cycle loop of the code graph. The method of invention provides a way to eliminate short cycles with protograph lifting operations having permutations and cyclic shifts without the need of additional complexity via a hill-climbing method. The BP decoding of QC polar codes can compete with the state-of-the-art SCL decoding. With the BP decoding, it realizes highly parallel decoding to increase the throughput of decoder processing.

Some embodiments are based on the realization that the protograph polar codes can use well-established techniques for conventional QC LDPC design in a similar manner. The proper cyclic shift values for QC polar codes can be designed with a greedy and hill-climbing method to increase the girth. As the protograph polar codes are compact compared to the whole factor graph, the code design can be more efficient. In addition, the invention provides a method and system to design frozen bit locations and irregular pruning as well as shift values through the use of P-EXIT evolution for finite-iteration BP decoding. In addition, the protograph polar codes have a benefit of increasing the flexibility of codeword lengths beyond powers-of-two by adjusting the lifting factor. Those protograph code specifications are adaptively controlled according to a prior knowledge of the channel statistics such as signal-to-noise ratio.

Some embodiments are based on the recognition that the generator matrix (GM) of polar codes is decomposed into multi-stage polarization operations. The method of the present disclosure provides a way to decompose any arbitrary generator matrix of linear block codes into multiple simpler stages. For example, cyclic codes such as Hamming and Bose-Chaudhuri-Hocquenghem (BCH) codes can be systematically expanded and decomposed into multiple polarization stages specified with the corresponding polynomial coefficients. The decomposed multi-stage operations are further represented as proto-polarization units to create a generalized LDGM protograph which has a high girth. The generalized LDGM protograph based on linear coding GM is called a polar-type LDGM code as it has multiple polarization stages and frozen bits analogous to polar codes. The LDGM protograph replicates the same multi-stage proto-polarizations with a lifting factor, and permutes polarization units among replicated stages to provides a large-scale factor graph based on a small-scale protograph. This process of replication and permutation is referred to as a lifting operation. The protograph LDGM codes have an advantage that the encoding and decoding share the same graphical structure based on its GM without the need for computing its PCM, whereas the conventional LDPC protograph is only good for decoding based on its PCM and its encoding requires additional complexity to generate its GM counterpart.

Some embodiments are based on the realization that a message passing is adaptively scheduled over a protograph to reduce the required number of BP decoding iterations for a protograph polar-type LDGM code. The message passing schedule is designed based on P-EXIT evolution with a greedy annealing optimization method. It can further accelerate the decoding convergence by taking finite lifting factor into consideration as a stochastic mutual information update. In one embodiment, the scheduling design is adaptively carried out given the channel output data. Yet another embodiment uses a look-up table given mutual information patterns to choose an adaptive scheduling policy, depending on a message passing rule and quantization precision.

Some embodiments are based on the realization that adaptability of the polar codes to the variations of the parameters of the communication channel depends on the values of parameters such as a combination of a parameter defining a number of data bits in the codeword, a parameter defining a data index set specifying locations of frozen bits in the encoded codeword, a parameter defining a number of parity bits in the encoded codeword, a parameter defining a polarization kernel, a parameter defining a depth of polarization stages, a parameter defining a lifting size, a parameter defining a base generator matrix, a parameter defining permutation at the proto-polarization units, a parameter defining spatial coupling, a parameter defining selection of de-activated polarization, a parameter defining CRC embedding, a parameter defining message passing rules, a parameter defining a decoding iteration strategy, a parameter defining an interleaver, and a parameter defining hard-decision rules.

Those parameters are referred herein as protograph specification parameters. A protograph code designed using the protograph specification parameters is referred herein as a protograph polar-type LDGM code. An encoder that encodes a source data using a protograph polar-type LDGM code is referred herein as a protograph polar encoder. A decoder that decodes a noisy codeword encoded by a protograph polar encoder is referred herein as a protograph polar decoder. A protograph polar encoder (decoder) using weight-1 circulant permutation matrices is referred herein as a QC polar encoder (decoder).

For example, some embodiments use replications of polar codes, whose codeword lengths are relatively short so that the decoding can be carried out with short latency and low complexity, wherein each decoding propagates belief message information back and forth to correct potential errors. For this iterative polar encoding and decoding architecture, the error correction performance is enhanced by coupling short polar codes, e.g., with different code rates, different frozen bit locations, different codeword lengths, different interleaving, and different polarization kernels. In yet another embodiment, the polar encoding architecture is permuted between different polarization stages, realizing convolutional encoding and windowed decoding to reduce decoding latency. A tail-biting is used with or without zero padding for long convolutional protograph polar-type LDGM codes. To reduce the complexity and improve the performance, this protograph polar-type LDGM code architecture is further generalized by de-activating several proto-polarization operations irregularly. In some embodiment, the de-activating proto-polarization operations are further generalized by having different non-binary and high-order kernels as well as multi-weight permutations.

Accordingly, some embodiments disclose a method for reliably transferring a data over a communication channel from a transmitter to a receiver. The method includes accepting source data; encoding the source data with a protograph polar-type LDGM code to produce an encoded codeword, wherein the protograph polar-type LDGM code is specified by a set of parameters including a combination of a parameter defining a number of data bits in the codeword, a parameter defining a depth of proto-polarization stages, a parameter defining a data index set specifying locations of frozen bits in the encoded codeword, and a parameter defining a number of parity bits in the encoded codeword, a parameter defining a protograph lifting size, a parameter defining a base generator matrix with shift values, a parameter defining an irregularity of permutation of the intermediate bits, a parameter defining an irregularity of polarization kernels in the polar code, a parameter defining an irregularity of spatial coupling, and a parameter defining an irregularity in selection of de-activated proto-polarization on different stages of the polar encoding, and wherein the protograph polar-type LDGM encoder encodes the source data using the parameters of the code; modulating the encoded codeword; transmitting the modulated message over the communication channel; receiving a noisy version of modulated message; and decoding the demodulated codeword to reliably retrieve the original source data via message passing.

Some embodiments disclose a system having a pair of transmitter and receiver for reliably transmitting a data over a communication channel. The transmitter performs the above-mentioned methods for reliably transmitting data over the communication channel. The receiver performs the above-mentioned methods for reliably retrieving the original source data via message passing.

According to some embodiments of the present invention, a computer-implemented encoding method for encoding digital data is provided. The encoding method can cause one or more computing processors to perform steps of defining a protograph structure of a polar-type low-density generator matrix (LDGM) code based on a code specification, wherein the code specification comprises at least two stages of proto-polarizations, at least one rule of frozen bits allocation, at least one rule of a protograph permutation, and at least one rule of a message passing; accessing a source bit stream as an input digital data; initializing a data array with the source bit stream and a set of frozen bits according to the rule of frozen bits allocation; propagating the data array according to the rule of the message passing over the all stages of the proto-polarizations, further comprising the steps of: (a) feeding the data array into the proto-polarization stages sequentially from one stage to another stage, wherein the proto-polarization stage comprises at least one proto-polarization unit; (b) permuting the data array at each of the proto-polarization unit according to the rule of the protograph permutation; and (c) modifying the data array at each of the proto-polarization unit according to the rule of the message passing; arranging the modified data array into a codeword in a specified order; and providing the codeword as an encoded digital data of the input digital data.

The present method for encoding can increase a robustness against unknown noise and errors which may occur through a communication channel. In addition, it is possible to further increase a robustness against the unknown noise and errors, when the rule of the frozen bits allocation and the rule of the protograph permutation are determined by an iterative method, which maximizes a code girth by eliminating short cycles in the protograph, and optimizes the locations of frozen bits so that the mutual information is maximized in a protograph extrinsic information transfer. This encoding method can resolve the long-standing issue that the conventional polar codes have inherent short cycles of length 4, which prevented the use of a parallelizable decoding such as the BP decoding.

Further, other embodiments of the present invention provide a computer-implemented decoding method for decoding a noisy codeword. The decoding method can cause one or more computing processors to perform steps of defining a protograph structure of a polar-type low-density generator matrix (LDGM) code based on a code specification, wherein the code specification comprises at least two stages of proto-polarizations, at least one rule of frozen bits allocation, at least one rule of a protograph permutation, and at least one rule of a message passing;

accessing an input data which represents a belief message for a noisy codeword;

initializing an array of leftward and rightward messages associated with each edge in the protograph, wherein the rightward messages feeding into a first stage of the proto-polarizations are fixed based on the rule of the frozen bits allocation and the leftward messages feeding into a last stage of the proto-polarizations are fixed based on the input data in a specified order; propagating the leftward and rightward messages according to the rule of the message passing across multiple stages of the proto-polarizations comprising at least one variable node and at least one check node, wherein the leftward and rightward messages are updated by an iterative method comprising the steps of: (a) selecting a parallelizable set of variable and check nodes according to the rule of message passing; (b) feeding a set of the leftward and rightward messages as incoming messages into the chosen variable and check nodes according to the rule of the protograph permutation; (c) calculating a set of outgoing messages based on the incoming messages at the chosen variable and check nodes, according to the rule of the message passing; (d) replacing a set of the leftward and rightward messages with the outgoing messages at the chosen variable and check nodes; and (e) repeating the above steps (a) through (d) for a specified number of times according to the rule of the message passing; selecting a set of the leftward messages as an output message in a specified order; and providing the output message as a decoded digital data.

Accordingly, the decoding method can reduce an error rate by correcting unknown noise and errors through the use of the iterative message passing. This decoding method of the present invention can resolve the long-standing issue that the conventional polar codes are not amenable to a parallel decoding due to the short girth-4, which prevented the use of a parallelizable decoding such as the BP decoding. The present method can increase the decoding throughput without increasing the decoding complexity because of the replicated use of short polar codes. Accordingly, a high coding gain is achievable at a complexity as low as the conventional short polar codes. In addition, the message passing decoding enables a highly parallel decoding to increase the speed of decoding.

Some embodiments of the present invention provide an encoder circuit configured to generate an encoded digital data from a source bit stream as an input digital data. The encoder circuit can increase a robustness against unknown noise and errors. The encoder may include an encoder interface configured to receive the source bit stream; at least one memory bank configured to store a computer-executable encoding method; one or more computing processors configured to generate a codeword as an encoded digital data from the input digital data by performing steps of the computer-executable encoding method, wherein the steps comprise: defining a protograph structure of a polar-type low-density generator matrix (LDGM) code based on a code specification, wherein the code specification comprises at least two stages of proto-polarizations, at least one rule of frozen bits allocation, at least one rule of protograph permutation, and at least one rule of a message passing; initializing a data array with the source bit stream and a set of frozen bits according to the at least one rule of frozen bits allocation; propagating the data array according to the at least one rule of the message passing over entire stages of the proto-polarizations, wherein the steps further including: (a) feeding the data array into the at least two stages of the proto-polarizations sequentially from one stage to another stage, wherein each stage of the proto-polarizations comprises at least one proto-polarization unit; (b) permuting the data array at each of the proto-polarization unit according to the at least one rule of the protograph permutation; and (c) modifying the data array at each of the proto-polarization unit according to the at least one rule of the message passing; and generating the codeword based on a specified order as the encoded digital data by arranging the modified data array. For instance, when the performing steps of the computer-executable encoding method are parallelized and serialized over a set of encoding methods with a data exchange according to the rules of protograph permutations, the encoder circuit can further increase a throughput of the encoder.

Further, some embodiments of the present invention provide a decoder circuit configured to generate a decoded digital data from a noisy version of an encoded codeword. According to the decoder circuit, it is possible to reduce unknown noise and errors. The decoder circuit may include a decoder interface configured to receive the noisy encoded codeword as an input data; at least one memory bank configured to store a computer-executable decoding method; one or more computing processors configured to generate the decoded digital data from the encoded codeword from the decoder interface by performing steps of the computer-executable decoding method, wherein the steps comprise: defining a protograph structure of a polar-type low-density generator matrix (LDGM) code based on a code specification, wherein the code specification comprises at least two stages of proto-polarizations, at least one rule of frozen bits allocation, at least one rule of protograph permutation, and at least one rule of a message passing; initializing an array of leftward and rightward messages associated with each edge in the protograph structure, wherein the rightward messages feeding into a first stage of the proto-polarizations are fixed based on the at least one rule of the frozen bits allocation and the leftward messages feeding into a last stage of the proto-polarizations are fixed based on the encoded codeword in a specified order; propagating the leftward and rightward messages according to the at least one rule of the message passing across the at least two stages of the proto-polarizations comprising at least one variable node and at least one check node, wherein the leftward and rightward messages are updated by an iterative method, wherein the iterative method comprises steps of: (a) selecting a parallelizable set of variable and check nodes according to the at least one rule of message passing; (b) feeding a set of the leftward and rightward messages as incoming messages into the selected variable and check nodes according to the at least one rule of the protograph permutation; (c) calculating a set of outgoing messages based on the incoming messages at the selected variable and check nodes, according to the at least one rule of the message passing; (d) replacing the set of the leftward and rightward messages with the set of outgoing messages at the selected variable and check nodes; and (e) repeating the steps (a) through (d) for a specified number of times according to the at least one rule of the message passing; and generating an output message as a decoded digital data by selecting a set of the leftward messages in a specified order.

Yet further, another embodiment of the present invention provides a system for transferring a digital data over a communication channel. The system may include at least one computing processor; at least one memory bank; a transmitter including: a source to accept a source data to be transferred; an encoder to encode the source data, wherein the encoder generates an encoded codeword by executing the computer-implemented encoding method; a modulator to convert an encoded codeword into a modulated signal, wherein the modulated signal is based on an amplitude modulation, a phase modulation, a quadrature-amplitude modulation, a phase-shift keying, a frequency modulation, an orthogonal frequency-division multiplexing, a spatial-division multiplexing, a pulse position modulation, or a variant thereof; and a front-end interface to transmit the modulated signal into the communication channel; a communication channel comprising a wired medium channel, a wireless medium channel, an optical fiber channel, a vacuum free-space channel, a data storage medium, or a variant thereof; a receiver comprising: a front-end interface to receive an output signal from the communication channel; a demodulator to demodulate the output signal of the channel, wherein the demodulator generates a likelihood information as an input belief message; a decoder to decode the input belief message, wherein the decoder generate a decoded codeword by executing the computer-implemented decoding method; and a sink to provide the decoded codeword; and a controller to define a code specification of a polar-type low-density generator matrix (LDGM) code to be used in the encoder and the decoder, depending on a knowledge of the channel, wherein the code specification comprises at least two stages of proto-polarizations, at least one rule of frozen bits allocation, at least one rule of a protograph permutation, and at least one rule of a message passing for encoding and decoding.

According to the system of the present invention, it becomes possible to reduce unknown noise and errors. Further, when each of the pipelined decoder further comprises a set of parallel decoders with a set of permutation interconnects, it can further increase a throughput of the decoder. Further, when each of the pipelined encoder further includes a set of parallel encoders with a set of permutation interconnects, a throughput of the encoder can be further increased. Hence, the disclosed encoder and decoder are both capable of processing a high-throughput data, such as a data-center interconnect requiring a data throughput beyond terabits per second. As the implementation complexity is maintained as low as the short polar codes, the disclosed system can realize a lower-power data transmission with those encoder and decoder for the polar-type LDGM codes.

Yet another embodiment discloses a non-transitory computer readable storage medium embodied thereon a program executable by a processor for performing the above-mentioned methods for reliably transferring a digital data.

A system and method for encoding of protograph polar codes and related LDGM codes according to embodiments of the present disclosure can improve the performance of error corrections and decoding throughput, and also reduce the computational complexity, decoding latency, and the power consumption of a real-time hardware processor.

DETAILED DESCRIPTION OF THE PREFERRED EMBODIMENTS

Figure 1:
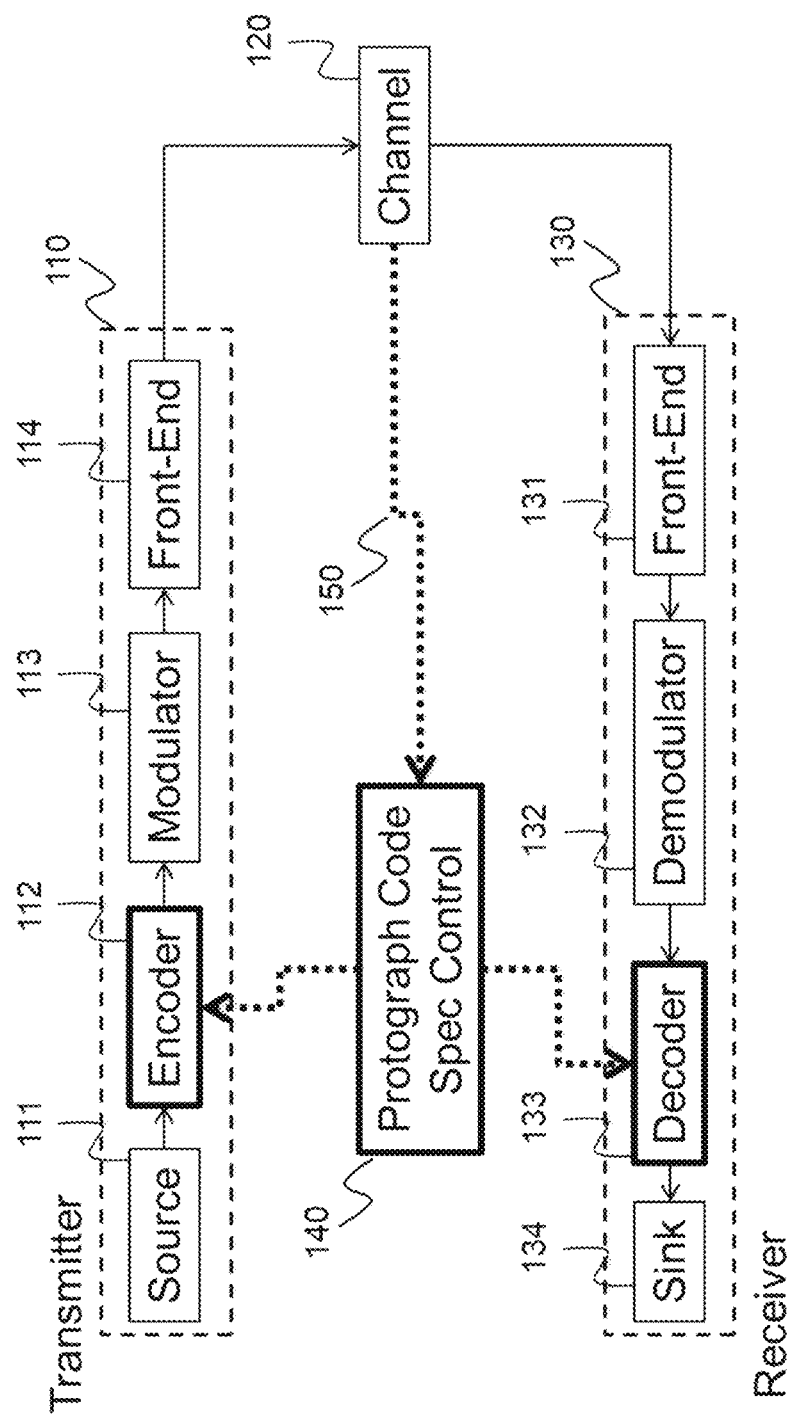
FIG. 1 is a function diagram of a communications system for transmissions of digital data according to some embodiments.

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

In the field of digital communications, forward error correction (FEC) through the application of an error correcting code (ECC) is a technique of encoding messages to add redundancy in order to mitigate uncertainty introduced by a noisy communication channel, allowing transmission errors to be reduced by a decoder. Generally, an ECC encoder is a system or a method for converting a sequence of data symbols (representing a source message or a source bit stream) into a more redundant sequence of code symbols (representing an encoded message or codeword) that are transmitted over a noisy channel. An ECC decoder is a system or a method for recovering an estimate of the original source data symbols from a noisy output of the channel, which introduced unknown random perturbation to be corrected.

A particular family of ECCs called polar codes was introduced by Arikan to provide an explicit code construction technique along with a decoder that converges toward optimal coding efficiency achieving the channel capacity in the asymptotic of coding over larger blocks of data. The polar codes encode a message, represented as a sequence of K data binary symbols ("bits"), into a sequence of N coded bits, where N is a power of two (N=$2^n$ for n-stage polarization operations) in general and larger than K. Specifically, the encoding procedure first writes the K data bits into an array u=($u_1, \ldots, u_N$) at K locations specified by a data index set $\mathbb{K} \subset \{1, \ldots, N\}$ with a cardinality of $|\mathbb{K}|$=K, while the remaining M=N−K locations are set to arbitrary, but known values at both the encoder and decoder sides. In some embodiments, the frozen bits are randomly generated by a rule known at both the encoder and decoder ends, e.g., a common seed is shared for a random number generator. Accordingly, a frozen bits allocation is set up to determine the locations of frozen bits and the values of frozen bits as well as how to map the source data.

The N coded bits, denoted by an array x=($x_1, \ldots, x_N$), are determined by a formula of x=uBF$^{\otimes n}$, where the matrix multiplications are carried out over the binary field (i.e., modulo-2 algebraic arithmetic) in general, B denotes an N×N bit-reversal permutation matrix, and F$^{\otimes n}$ is the n-fold Kronecker power of a binary order-2 kernel matrix $$F = \begin{bmatrix} 1 & 0 \\ 1 & 1 \end{bmatrix},$$

and n=$\log_2$ (N) is a number of polarization stages. A polar code is specified by the data index set K and the parameters N and K. Thus, the key to constructing a polar code is choosing a data index set $\mathbb{K}$ (equivalently, its complementary set, frozen bit location) suitable for the noisy channel.

A successive cancellation (SC) decoder proposed by Arikan helps explaining the specifics of the polar code construction technique. The SC decoder takes as input the noisy output of the channel denoted by y=($y_1, \ldots, y_N$), where each $y_i$ is a noisy observation of the corresponding code bit $x_i$. For example, the noisy observation is written as $y_i$=(1−2$x_i$)+$w_i$, where $w_i$ is an additive white Gaussian noise (AWGN) for binary phase shift-keying (BPSK) modulation. The SC decoder proceeds sequentially over the bits, from index 1 to N, where for each index i∈ {1, ..., N}, an estimate $\hat{u}_i$ for bit $u_1$ is made as follows: if i∉ $\mathbb{K}$ (i.e., frozen bit location), then $\hat{u}_i$ is set to the known value of $u_1$, otherwise, when i∈ $\mathbb{K}$, $\hat{u}_i$ is set to the most likely value for $u_1$ given the channel outputs y under an assumption that the previous estimates ($\hat{u}_1, \ldots, \hat{u}_{i-1}$) are correct. Each estimate $\hat{u}_i$ is made with respect to the conditional distribution Pr(y, $u_1, \ldots, u_{i-1}|u_i$), which follows from the polar code structure and underlying channel statistics, and can also be thought to represent a pseudo-channel for the bit $u_i$. With the aim of maximizing the accuracy of the estimates $\hat{u}_i$, the data index set K should be chosen to select the K most reliable pseudo-channels, e.g., with density evolution techniques. Polar codes can also be systematically encoded with a linear transform.

Although the polar codes asymptotically achieve the capacity limit for infinite codeword lengths, the SC decoding performance at finite codeword lengths can often be inferior to other state-of-the-art ECC codes such as LDPC codes. The code design for polar codes is conducted by selecting information index $\mathbb{K}$ having reliable pseudo-channels. Thus, there are limited degrees of freedom to optimize polar codes, specifically, the combination of selecting K locations out of N. In addition, the computational complexity of both encoding and decoding is log-linear, i.e., N log(N), which is more expensive than linear-complexity LDPC decoding for long codeword lengths. However, the SC decoding complexity of polar codes can be lower than LDPC decoding for short codeword lengths because of the nonlinearity. In addition, while LDPC codes require to create the corresponding generator matrix (GM) from the parity-check matrix (PCM) via Gaussian elimination for encoding, polar codes share the same GM both for encoding and decoding, resulting into a practical advantage for the encoder and the decoder implementations. Nevertheless, the conventional polar codes are not amenable to parallel hardware implementation due to the sequential nature of the SC decoding. Although parallelizable belief-propagation (BP) decoding can be still used for polar codes, the BP decoding performs poorly for the conventional polar codes. The method and system of the present disclosure provide a way to solve all the above issues of the polar codes by efficiently introducing the concept of protograph codes for a new polar-type low-density generator matrix (LDGM) code (which is based on the GM for both encoding and decoding), but not for LDPC codes (which is based on the PCM only for decoding).

FIG. 1 shows a communications system for transmissions of a digital data from a transmitter 110 to a receiver 130 over a channel 120 according to some embodiments. For example, the communication channel 120 includes but not limited to air medium for radio communications, copper cable for wired communications, solid-state drive for data storage transferring, vacuum for free-space satellite communications, and fiber cable for fiber-optic communications. During the communications to transfer the digital data from the transmitter to the receiver, the digital data can be corrupted by a noise such as AWGN occurred across the channel and data processing path between an encoder 112 and a decoder 133. For example, the noise includes but not limited to a thermal noise, a spontaneous emission amplifier noise, and impulsive shot noise. The transmitter 110 uses a forward-error correction (FEC) code specified by a protograph parameter 140 to realize reliable data transmissions. The receiver uses the decoder 133 specified by the protograph parameter to recover the original data from noisy message which was encoded by the encoder 112.

At the transmitter 110, the data to be sent comes from a source 111 configured to accept the original data. The source can include but not limited to a memory to store the data, an input port to receive the data, and/or a device to generate the data. For example, in one embodiment, the source includes a voice communication device transforming an input voice signal into the digital data. The input data from the source 111 are encoded by an FEC encoder 112. In some cases, the encoded data may be referred to as a codeword. The encoded data are modulated by a modulator 113, which uses various modulation formats, including but not limited to quadrature-amplitude modulation (QAM) with and without linear transforms such as orthogonal frequency-division multiplexing (OFDM). The modulation schemes include many other variants based on a combination of an amplitude modulation, a phase modulation, and a frequency modulation; e.g., an amplitude-shift keyng, a phase-shift keying, a frequency-shift keying, a spatial-division multiplexing, a pulse position modulation, a pulse amplitude modulation, and so on. The modulated data are transmitted into the channel via front-end circuits 114, which can include but not limited to electro-optic circuits for optical communications and radio-frequency circuits for radio communications. The front-end can also include digital-to-analog converter and signal pre-processing such as band-pass filter, pulse shaping, precoding, power loading, pilot insertion, and pre-distortion, for example.

The channel 120 distorts the transmitted signal. For example, the channel adds AWGN, co-channel interference, deep fading, impulsive noise, inter-symbol interference, Kerr-induced nonlinear interference, polarization crosstalk, and linear chromatic dispersion as well as residual hardware imperfection such as quantization error, clock jitter, overflows, laser linewidth, and carrier phase noise.

The receiver 130 first converts the channel output into electrical received signals via front-end circuits 131, which are typically complementary of the front-end 114 at the transmitter. For example, the front-end includes but not limited to analog-to-digital converter, linear equalization, nonlinear equalization, adaptive filtering, channel estimation, carrier phase recovery, synchronization, and polarization recovery. The received signals are demodulated at a demodulator 132 to produce an initial estimate of the bits of the transmitted codeword, which are used by the decoder 133 for recovering the source data. For example, the demodulator provides a log-likelihood ratio (LLR) value as a soft-input message to the decoder 133. In various embodiments, the decoder 133 takes the soft-input message to produce a soft-output message given a protograph code specification 140. Some embodiments are based on realization that adaptability of the protograph codes to the variations of the parameters of the communication channel depends on the values of parameters such as a parameter defining a number of data bits in the codeword, a parameter defining a data index set specifying locations of frozen bits in the encoding data, and a parameter defining a number of parity bits in the encoded codeword. Accordingly, the protograph code specification 140 is adaptively controlled according to a prior knowledge 150 of the channel. For example, code parameters such as a code rate and the codeword length are adaptively selected based on the channel knowledge of a signal-to-noise ratio (SNR), a power delay profile, a channel spectrum, and a nonlinear statistics. In some embodiments, the decoder 133 is a hard-decision (HD) decoder to produce values indicative of LLR of the bits based on the soft-input and soft-output messages of the decoder. The decoded data are fed into a data sink 134, including but not limited to a memory to store the data, an output port to send the data, and/or a device to receive the data. For example, in one embodiment, the sink includes a voice communication device transforming the decoded data into a sound signal.

The transmitter 110 and/or the receiver 130 can be implemented using a hardware processor operatively connected to a memory. Each of the transmitter 110 and the receiver 130 may include one or more processors. For example, the memory of the receiver 130 can store some information related to one or combination of the protograph coding, the soft-input and the soft-output of the decoder 133, results of intermediate calculations and parameters of the encoding and the decoding. For example, the digital data are encoded using an encoding GM formed as a Kronecker power of a polar kernel matrix F. To that end, the memory of the receiver can store the encoding matrix used by the processor of the decoder to decode the noisy codeword. All the components in the transmitter 110 and the receiver 130, including the encoder 112, the modulator 113, the demodulator 132 and the decoder 133, may be implemented by hardware, one or more hardware processors, computer software (program or program modules), or a combination of hardware and computer software.

Polar Encoding

Figure 2:
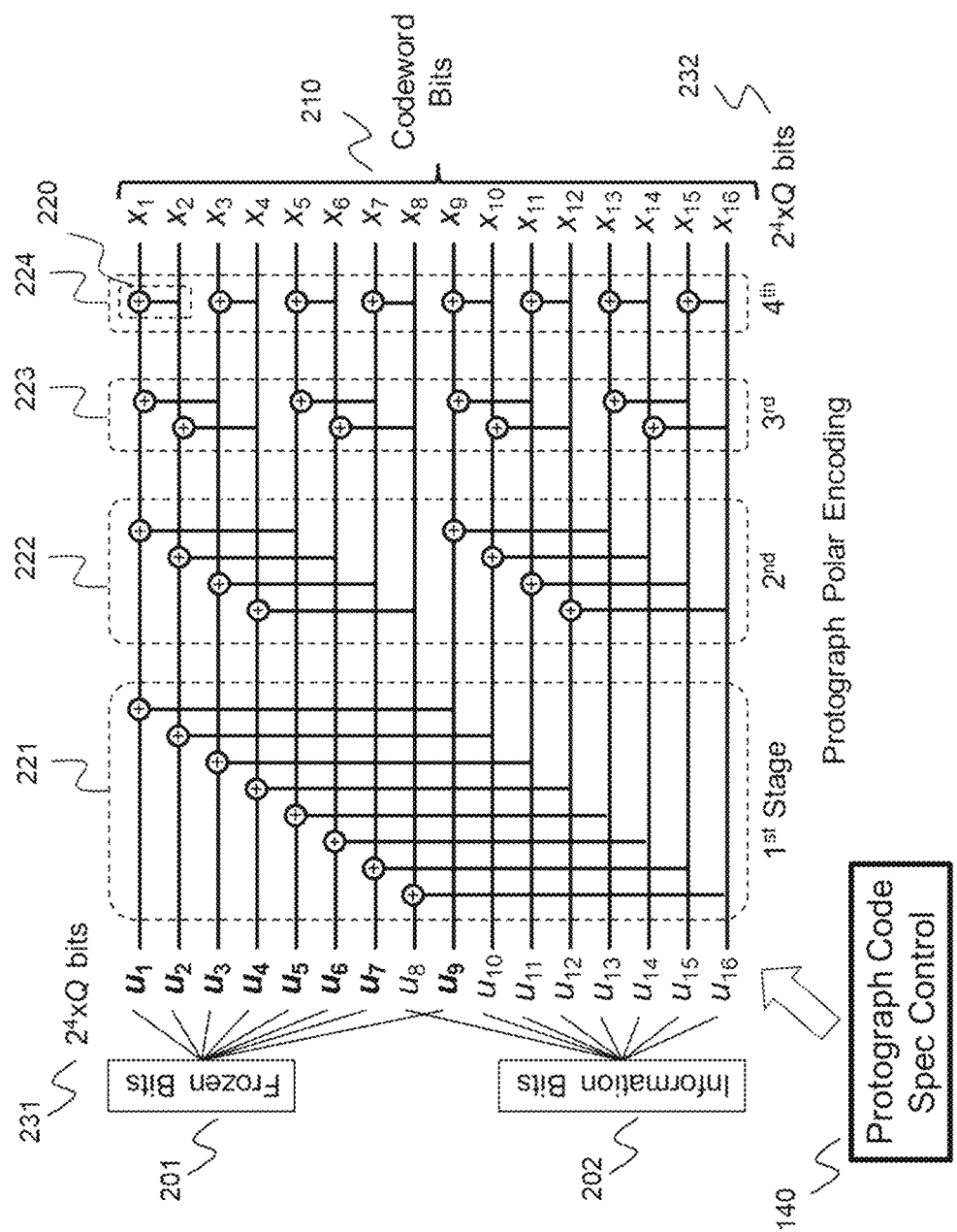
FIG. 2 is a schematic of an exemplar encoding employed by an encoder of the system according to some embodiments.

The encoder 112 is a computer-implemented method or a system, receiving (accessing) a digital data stream from the source 111 and sending (providing) an encoded codeword to the modulator 113. FIG. 2 shows a schematic of an exemplar encoding employed by the encoder 112 for an example polar code, where there are n=4 polarization stages for $N=2^4=16$ codeword bits 210, K=8 data bits 202, and M=N−K=8 frozen bits 201. The 8-bit data are written to the locations of the data bits $\mathbb{K}$ 202, while the frozen bits 201 are set to fixed, known values (which can be all zeros in some embodiments). Thus, in this example, an encoding array $u=(u_1, \ldots, u_N)$ is formed by setting the bits ($u_8, u_{10}, u_{11}, u_{12}, u_{13}, u_{14}, u_{15}, u_{16}$) to the values of the 8-bit data, the remaining bits ($u_1, u_2, u_3, u_4, u_5, u_6, u_7, u_9$) to frozen bit values. The data index set is $\mathbb{K}=\{1,2,3,4,5,6,7,9\}$, for this example, which along with the parameters n, K, and the fixed values of the frozen bits comprise the polar code specification 140. Accordingly, how to map a source bits stream and how to append frozen bits are specified by a set of rules to initialize the encoding array u. The schematic illustrates procedure to transform the encoding array $u=(u_1, \ldots, u_N)$ into the codeword array $x=(x_1, \ldots, x_N)$, which involves employing a binary exclusive-or (XOR) operation 220 as shown in the figure. These XOR operations follow a structured pattern such that the overall procedure is equivalent to the application of the polar encoding formula $x=uBF^{\otimes n}$. For regular polar coding, there are N/2 times XOR operations per polarization stage, resulting into N log$_2$(N)/2 operations in total. Each XOR operation 220 is referred herein as a polarization operation unit for convenience because this operation creates upgraded sub-channel and downgraded sub-channel like a polarizer. Accordingly, the encoder uses a set of rules for a message passing across the multiple polarization stages to produce the codeword x from the encoding array u through propagation of the encoding messages with permutation and modification. The encoder 112 can include a processor operatively connected to a memory and configured for implementing the encoding steps.

The same structure used in the encoder 112, defined by the code specification 140, is used for the decoder 133. Applying the polarization operation 220 through multiple n stages 221, 222, 223, 224, the soft-input messages feeding into the decoder can be gradually polarized into good and bad sub-channels. The fraction of good sub-channels with SC decoding converges asymptotically towards the Shannon limit for arbitrary channels in the long codewords. It is called a polarization phenomenon. The polarization unit 220 has an upper branch and a lower branch, whose stride is often different at each stage. For example, the first polarization stage 221 uses a stride of 8, the second polarization stage 222 uses a stride of 4, the third polarization stage 223 uses a stride of 2, and the last stage 224 uses a stride of 1.

This is because the GM of polar codes can be decomposed into n sparse sub-generator matrices having off-diagonal elements at power-of-two strides from diagonal locations. For example, the GM of 2-stage polarization is expressed as $$F^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} = \begin{bmatrix} 1 & 0 & 0 & 0 \\ 0 & 1 & 0 & 0 \\ 1 & 0 & 1 & 0 \\ 0 & 1 & 0 & 1 \end{bmatrix} \begin{bmatrix} 1 & 0 & 0 & 0 \\ 1 & 1 & 0 & 0 \\ 0 & 0 & 1 & 0 \\ 0 & 0 & 1 & 1 \end{bmatrix}.$$

The first sub-GM having two off-diagonal elements corresponds to the first-stage polarization with a stride of 2, and the last sub-GM corresponds to the second-stage polarization with a stride of 1. Each stage has N/2 off-diagonal elements, corresponding to the XOR operation of polarization unit. Accordingly, this decomposed GM representation provides a definition of multi-stage connection rules to construct the polar coding protograph.

Figure 3:
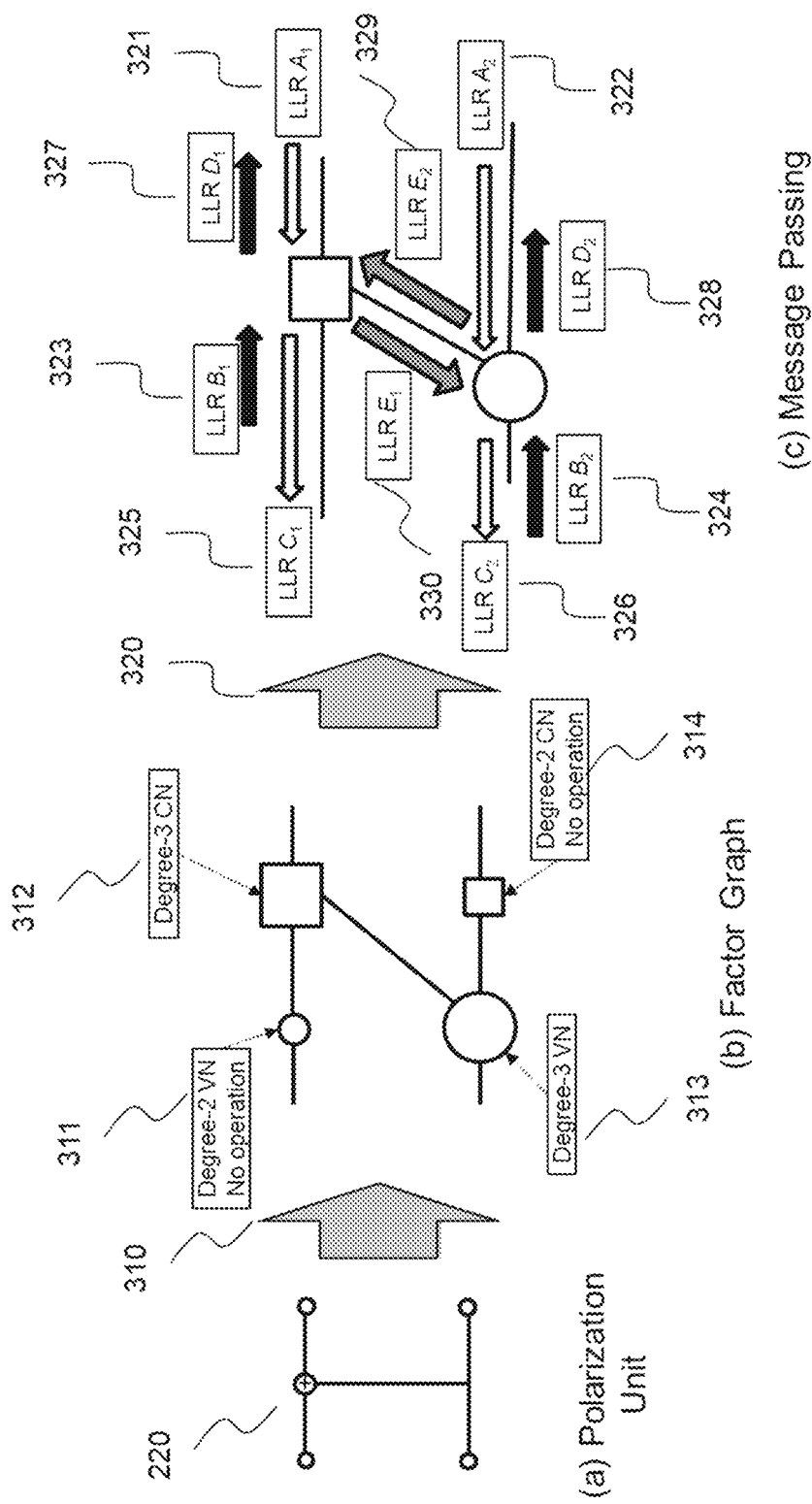
FIG. 3 is schematics of polarization unit, represented as a factor graph, to process message passing according to some embodiments.

The polarization unit 220 uses the XOR operation between upper and lower branches as shown in FIG. 3. This polarization unit 220 can be represented by a factor graph 310, which has an upper-branch variable node (VN) 311, a lower-branch VN 313, an upper-branch check node (CN) 312, and a lower-branch CN 314. The upper VN and lower CN are of degree two, i.e., the number of connected edges is two. For those degree-two factor nodes, no computational operations are involved, and thus they are often ignored. The remaining VN 313 and CN 312 have a degree of three, i.e., the number of connected edges is three. One of benefit of polar codes lies in its low-degree factor nodes at most degree of three, whose computational complexity is lowest for message passing. In contrast, typical irregular protogaph LDPC codes use high-degree factor nodes, leading to high computational complexity at such high-degree nodes for message passing.

Polar Decoding

The decoder 133 is a computer-implemented method or a system, receiving (accessing) an input belief message from the demodulator 132, and sending (providing) a recovered bit sequence to the sink 134. The polar decoder 133 uses a specific rule of message passing 320 to process soft-decision belief messages at each VN and CN of polarization units 220. For example, the upper CN 312 takes a leftward LLR value $A_1$ 321 and a rightward LLR value $B_1$ 323 to compute a downward LLR $E_1$ 330, according to a check-node decoder (CND) rule; $E_1$=CND $(A_i, B_1)$. The lower VN 313 takes a leftward LLR value $A_2$ 322 and a rightward LLR value $B_2$ 326 to compute an upward LLR value $E_2$ 329, according to a variable-node decoder (VND) rule; $E_2$=VND$(A_2, B_2)$. Then, leftward LLR values at upper and lower branches, $C_1$ 325 and $C_2$ 326, are propagated to next polarization stages through the CN 312 and VN 313 as follows; $C_1$=CND$(A_1, E_2)$ and $C_2$=VND$(A_2, E_1)$, respectively. Similarly when required, rightward LLR values at upper and lower branches, $D_1$ 327 and $D_2$ 328, are back-propagated to previous polarization stages through the CN 312 and VN 313 as follows; $D_1$=CND$(B_1, E_2)$ and $D_2$=VND $(B_2, E_1)$, respectively.

The VND and CND propagation rules include but not limited to a sum-product algorithm, a delta-min algorithm, a min-sum algorithm, an offset min-sum algorithm, a normalized min-sum algorithm, a modified min-sum algorithm, an attenuated min-sum, an extended min-sum, a quantized look-up table, or a variant thereof. For example, the sum-product algorithm for soft-decision binary decoding has message passing rules specified as follows:

$$\text{VND}(A,B)=A+B,$$

$$\text{CND}(A,B)=2 \tan h^{-1}(\tan h(A/2)\tan h(B/2)),$$

where tan h(.) is the hyperbolic tangent function and tan $h^{-1}$(.) is its inverse function. For some embodiments, the belief messages are not LLR values but non-log likelihood ratio (LR) ranging from 0 to 00, or the corresponding sigmoid probability domain ranging from 0 to 1. In another embodiment, the belief messages can be soft-decision values which are direct noisy version of the encoded codeword, or hard-decision values to represent erroneous codeword. In some embodiments, the VND and CND rules are implemented by a look-up table (LUT) to save computational complexity. In some embodiments, the belief messages are further quantized with a low precision to save the memory size of the LUT. The quantization level is adjusted at each polarization unit depending on the statistics. The decoder 133 can include a processor operatively connected to a memory and configured for implementing the decoding steps. The VND and CND rules are accordingly defined for non-binary coding cases in some embodiments.

Figure 4:
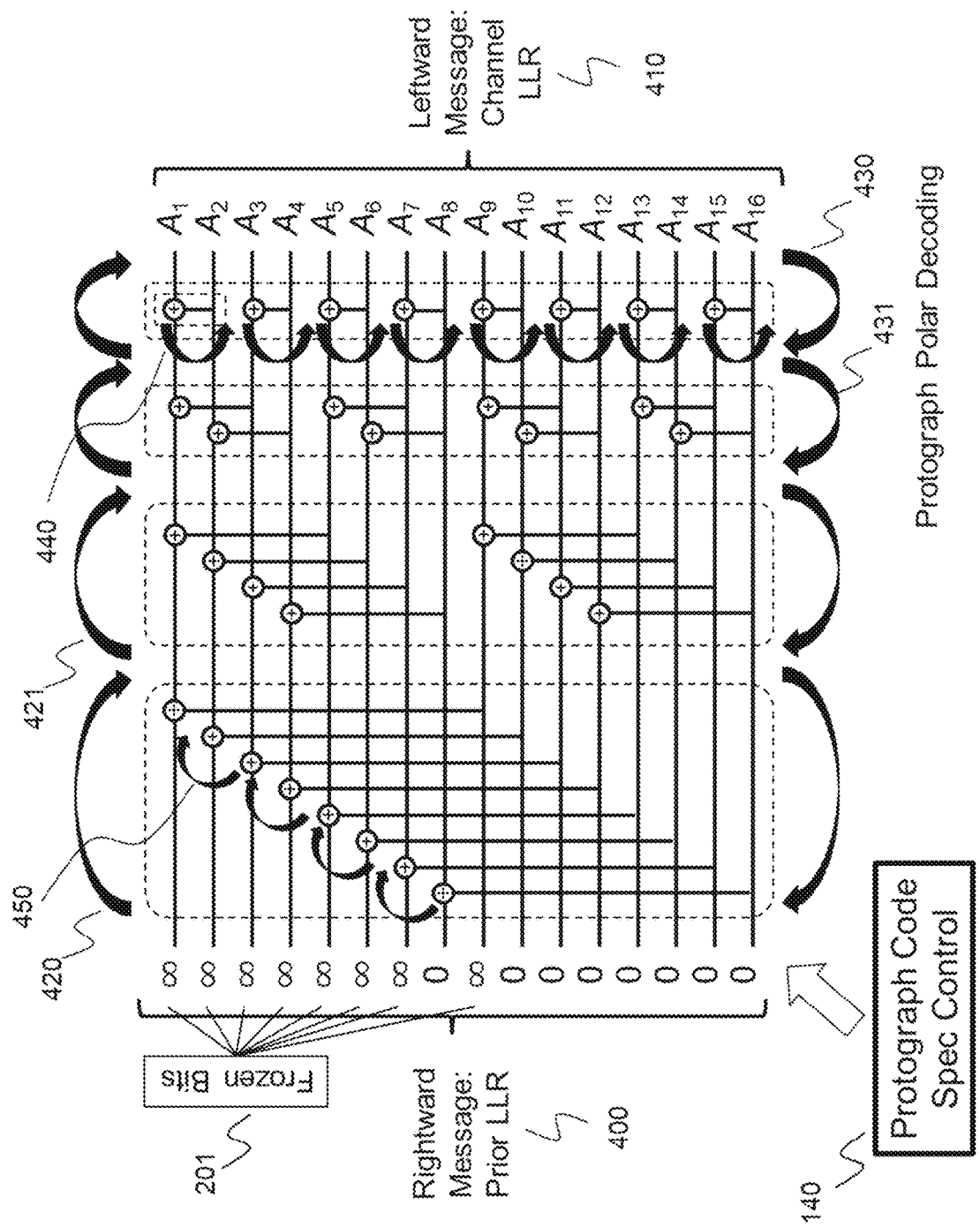
FIG. 4 is a schematic of an exemplar decoding employed by an decoder of the system according to some embodiments.

FIG. 4 shows an exemplar schematic of the decoder 133, which is controlled by the protograph specification 140. The decoder structure in FIG. 4 is same as the encoder structure in FIG. 2 in the sense that an identical graphical representation of n-stage polarization is used for both the encoding and the decoding. This is a great difference between GM-based coding such as LDGM codes and PCM-based coding such as LDPC codes, which requires GM calculation besides PCM. For message passing algorithms, all intermediate messages at each stage are first initialized to zeros, while the leftward messages 410 at the right-most stage (i.e., the last polarization stage) are set to be the soft-input message (e.g., channel LLR values) given from the demodulator 132, and the rightward messages 400 at the left-most stage (i.e., the first polarization stage) are set to be either one of {0, +∞, −∞} depending on frozen bits 201. Specifically, the location for frozen bit which is '0' has a prior belief message of +∞, the location for frozen bit which is '1' has a prior belief message of −∞, and otherwise a prior belief message is 0 for information data bits. When the belief message is not LLR domain, the initialization is modified accordingly, e.g., zero LLR value is equivalent to LR of one. Accordingly, the initializing the belief messages are defined depending on the frozen bits allocation. And then, a set of rules to propagate the belief messages are defined accordingly at each proto-polarization unit.

The protograph code specification 140 provides a scheduling parameter, which determines which messages are propagated in which order across multiple VNs and CNs in the protograph. Some embodiments use a round-robin scheduling, which propagates rightward belief messages from the first stage to the second stage 420, from the second stage to the third stage 430, and so on. Then, the leftward belief messages are propagated backward from the last stage to the second last stage 430, from the second last stage to the third last stage 431, and so on. This round-trip message passing, from left to right and from right to left, is carried out multiple iterations alternatingly to correct the potential errors. Within a stage, all messages can be updated at once in parallel, or sequentially either from top to bottom 440, or from bottom to top 450. For some embodiments, the message passing is done fully in parallel at all VNs and CNs regardless of stages as a flooding scheduling to realize highly parallel decoding. The final soft-output decision is the leftward message at the first stage after iterations. The hard decision is based on the sign of leftward message LLR values. The scheduling policy, the message passing rules, and the number of iterations are adaptively controlled by the protograph code specification 140 in some embodiments.

In some embodiments, a specific scheduling is used to sequentially obtain the left-most messages to realize the SC and SCL decoding, while the rightward LLRs are always based on hard-decision messages, ranging either one out of $\{0, +\infty, -\infty\}$, depending on the availability of hard decisions based on the left-most belief messages. This SC/SCL decoding schedule further reduces the computational complexity while decoding latency is increased in general. In some embodiment, random scheduling for message passing is used or adaptive scheduling is used depending on the instantaneous belief messages, e.g., its magnitude or derivative.

Note that the decoder 133 can be used as the encoder 112 with a specific message passing scheduling and rules of computations. Specifically, initializing the rightward message at the first stage by the encoding bits u, the codeword x can be generated by a rightward message passing from the first stage to the last stage to obtain, where the message passing rule is based on XOR operation (or, algebraic arithmetic operation for non-binary case) at proto-check nodes. Accordingly, some embodiments share the same module for both encoding and decoding, where the rule of the message passing is controlled by the code specification 140.

Protograph-Based Polar Codes

The method and system of the present disclosure provide a way to further improve the conventional polar coding and decoding, by introducing a concept of protograph, which was originally used for LDPC or repeat-accumulate codes. In 2003, Thorpe first introduced the concept of protograph codes, as a class of LDPC codes constructed from a protograph in such a way that the 1's in the PCM are replaced by Q×Q-permutation matrices and the 0's in the PCM by Q×Q-zero matrices. The permutation size Q is also called a lifting size, a lifting factor, or a QC size. If the permutation matrices are circulant, the protograph LDPC code reduces to a well-known quasi-cyclic (QC) LDPC code. However, there are no prior arts which used the protograph for designing polar codes and related LDGM codes.

The method and system of the present invention provide a way to construct protograph-based polar codes. Analogously in lifting operations of the PCM for LDPC codes, the method of the invention uses a lifting operation to replace the GM (not PCM) of the polar codes. Specifically, the 1's in the GM of polar codes are replaced by Q×Q-permutation matrices and the 0's in the GM by Q×Q-zero matrices. For example, the GM for 2-stage polar codes is replaced with permutation matrices in the lifting operation as follows:

$$F^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \Rightarrow \begin{bmatrix} P_{11} & O & O & O \\ P_{21} & P_{22} & O & O \\ P_{31} & O & P_{33} & O \\ P_{41} & P_{42} & P_{43} & P_{44} \end{bmatrix},$$

where O denotes an all-zeros matrix (i.e., a weight-zero permutation) of size Q×Q, and $P_{ij}$ is a permutation matrix of size Q×Q. This lifting operation expands the total codeword lengths by Q-folds, while the graphical structure of the original polar codes is remained. For some embodiments, the permutation matrices are chosen from a weight-1 circulant matrix: $P_{ij} = I(s_{ij}')$, where I(s) denotes the s-th circulant permutation matrix obtained by cyclically right-shifting a Q×Q identity matrix by s positions, and $s_{ij}'$ is a permutation shift value to design. Specifically, the circulant permutation matrix is expressed as follows:

$$I(s) = \begin{bmatrix} 0 & 1 & 0 & 0 & \ldots & 0 \\ 0 & 0 & 1 & 0 & \ddots & \vdots \\ \vdots & 0 & 0 & 1 & \ddots & 0 \\ 0 & \ddots & \ddots & \ddots & \ddots & 0 \\ 0 & 0 & \ddots & \ddots & \ddots & 1 \\ 1 & 0 & 0 & 0 & 0 & 0 \end{bmatrix}^s,$$

where the exponent of s just shifts the column by s positions cyclically. For this circulant permutation case, the protograph polar codes are called as QC polar codes. Using circulant permutation for a large lifting factor Q, any GM-based protograph codes can be sparse and they are referred to as a protograph-based generalized low-density generator matrix (LDGM). The protograph polar-type LDGM codes have a number of benefits in comparison to the conventional protograph LDPC codes.

Accordingly, the encoder 112 illustrated in FIG. 2 and the decoder 133 illustrated in FIG. 4 have more specification parameters to realize protograph-based polar codes, including a protograph lifting factor, i.e., an integer value Q. In the conventional polar codes, an n-stage polarization provides $N=2^n$ codeword bits. In the protograph polar codes of the present invention, the total number of codeword bits is increased 232 by the lifting factor Q as $N=2^n Q$, and also the number of information bits is increased 231 by Q-fold. Each encoding message $u_i$ and encoded message $x_i$ are not a single binary bit, but Q-bit tuple for the protograph polar codes. The XOR operation at each polarization unit is also expanded as a proto-polarization unit which processes Q bits in parallel. The protograph polar codes have a number of great features, including but not limited to the superior performance to the conventional polar codes with deeper polarization stages while the computational complexity is as low as that of the shallow polarization.

Figure 5:
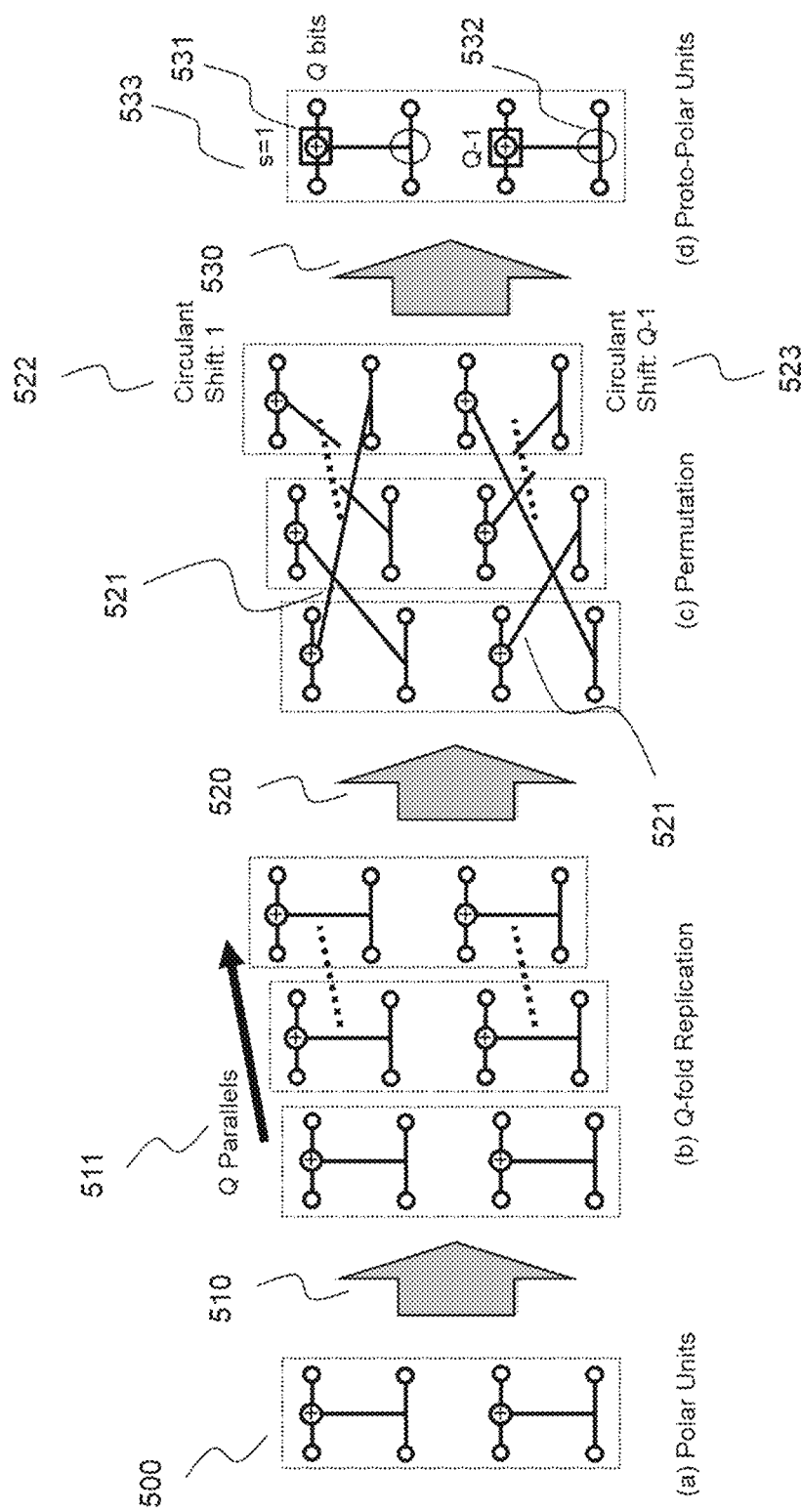
FIG. 5 is a schematic of an exemplar protograph lifting operation for proto-polarization unit, which propagate multiple bits at once by replication of multiple polarization units and permutations of edges to couple parallel encoders according to some embodiments.

Some embodiments of the present invention are based on realization that enables a hardware-friendly lifting operation at each polarization stage, which replicates Q-parallel polar encoders and permutes XOR incident bits among the parallel encoders. FIG. 5 shows an exemplar illustration of the proto-polarization units 220, which use a lifting operation based on replication and permutation steps. The original polar codes with the conventional polarization units 500 is first replicated 510 multiple times. This replication step generates Q parallel polar encoders 511, which are mutually independent and identical. The parallel encoders are then coupled by a permutation step 520, in which edges for the polarization units are permuted across the parallel encoders. For example, the XOR operation at the second polar encoder takes the lower branch of the polarization unit at the first polar encoder, as illustrated in edge permutation 521. Accordingly, for a circulant shift value of s, the XOR at the i-th encoder uses the lower-branch bit at the (i−s mod Q)-th encoder. The replicated and permuted polarization units are represented as a proto-polarization unit 531, which uses a proto-check node 531 and a proto-variable node 532 to process Q bits in parallel with circulant shift values 533 assigned at each proto-check nodes. The permutation operation does not require any computational complexity but message exchange among Q parallel encoders. The same applies to the protograph decoder 133, which uses the message passing over Q parallel decoders without increasing any computational complexity. The decoding complexity is hence reduced as an order of $O$ [N log(N/Q)/2] for the total codeword length of $N=2^nQ$. In consequence, the decoding computational complexity for the N-bit codeword of the protograph polar codes is as low as the conventional polar decoding of an N/Q-bit codeword.

High-Girth Design

In order to achieve good performance, we shall design the permutation shift values of the QC polar codes. One obviously poor choice is the case when all the shifting values are zeros, leading to mutually independent Q-parallel short polar codes without any coupling benefit. The conventional protograph LDPC codes are often designed to achieve a high girth—the "girth" of a code is the length of the shortest cycle in the code graph. It is known that the girth of any conventional QC LDPC code is upper bounded by 12. Tanner proposed a systematic way to optimize shift values to achieve girth-12. It was further shown that an irregular QC LDPC code can achieve a girth larger than 12.

For n-stage QC polar codes, there are $n2^{n-1}$ shift values to design for the proto-check nodes in the proto-polarization units. For example, 4-stage QC polar codes shown in FIG. 2 have a total of 32 proto-polarization units to assign permutation shift values. The shift values are expressed with a shift base matrix of size $n \times 2^{n-1}$ as follows:

$$S = \begin{bmatrix} s_{11} & \cdots & s_{12^{n-1}} \\ \vdots & \ddots & \vdots \\ s_{n1} & \cdots & s_{n2^{n-1}} \end{bmatrix},$$

whose (i,j)-th shift value $s_{ij}$ is assigned for the j-th proto-polarization unit at the i-th stage. Given the shift base matrix, the generator matrix is specified. For example, 2-stage QC polar codes having $$S = \begin{bmatrix} s_{11} & s_{12} \\ s_{21} & s_{22} \end{bmatrix}$$

correspond to the codes with the 2-stage decomposed generator matrix lifted as follows:

$$F^{\otimes 2} = \begin{bmatrix} 1 & 0 & 0 & 0 \\ 0 & 1 & 0 & 0 \\ 1 & 0 & 1 & 0 \\ 0 & 1 & 0 & 1 \end{bmatrix} \begin{bmatrix} 1 & 0 & 0 & 0 \\ 1 & 1 & 0 & 0 \\ 0 & 0 & 1 & 0 \\ 0 & 0 & 1 & 1 \end{bmatrix} \Rightarrow$$

$$\begin{bmatrix} I(0) & O & O & O \\ O & I(0) & O & O \\ I(s_{11}) & O & I(0) & O \\ O & I(s_{12}) & O & I(0) \end{bmatrix} \begin{bmatrix} I(0) & O & O & O \\ I(s_{21}) & I(0) & O & O \\ O & O & I(0) & O \\ O & O & I(s_{22}) & I(0) \end{bmatrix}.$$

The factor graph of polar codes are inherently loopy and there exist a large number of short cycles in the code graph, and hence the BP decoding cannot work well for the conventional polar codes. Nonetheless, by optimizing shift values, we can increase the girth for QC polar codes when $Q>1$.

Figure 6:
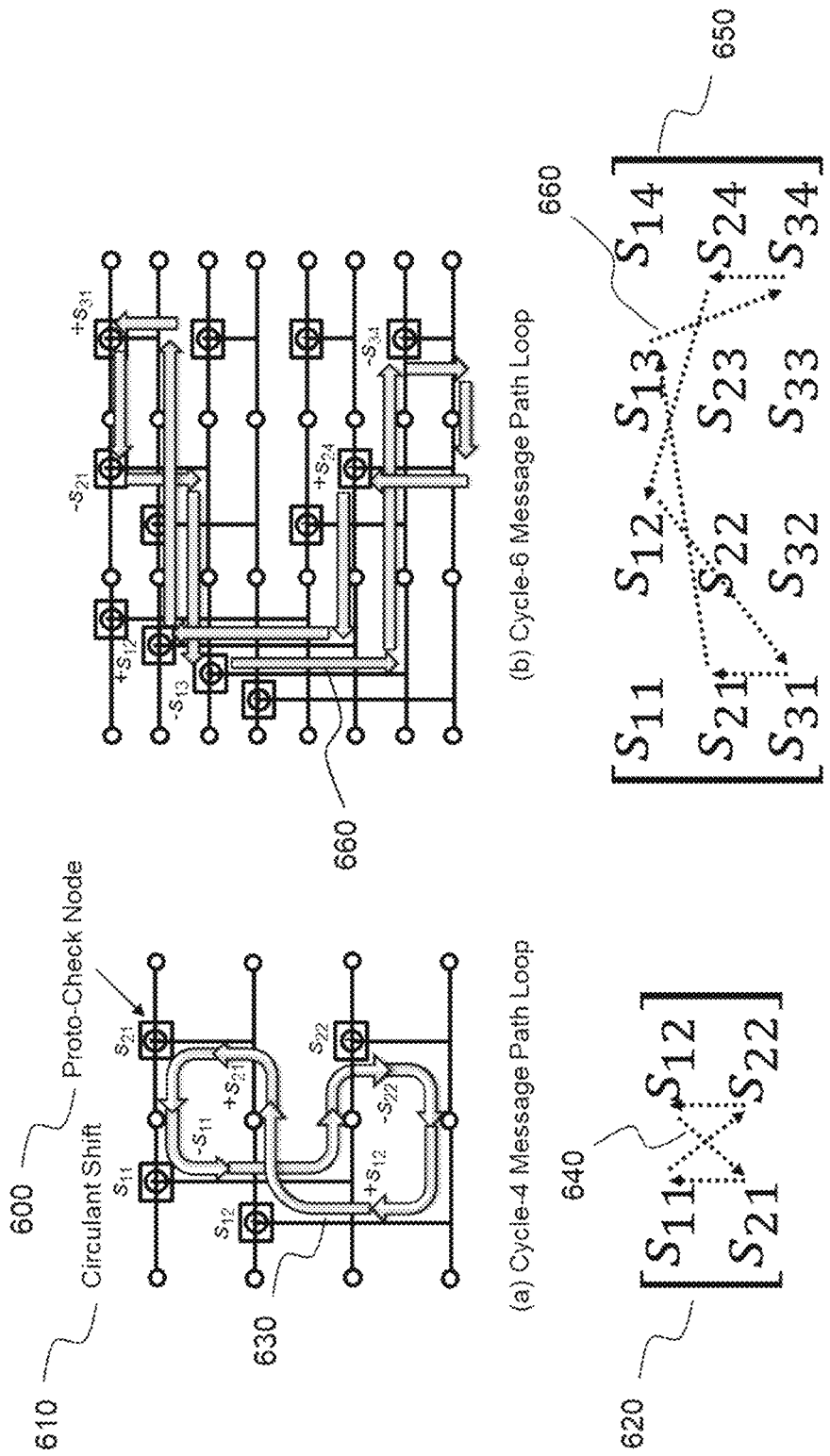
FIGS. 6A and 6B show exemplar illustrations of short cycles in protograph polar codes and circulant shift values to increase a girth of the code graph according to some embodiments.

The method and system of the present disclosure provides a way to eliminate short cycles of the protograph polar codes so that message passing algorithms can work properly. FIG. 6A shows an example of short cycle whose loop length is four, where two proto-polarization units at two different stages are involved. Each proto-polarization unit has one proto-check node 600, each of which also has a permutation shift value 610. In total, there are four shift values, $$S = \begin{bmatrix} s_{11} & s_{12} \\ s_{21} & s_{22} \end{bmatrix}$$

as a base matrix 620. In this protograph, there is a short cycle of length 4, across a loop path 640 of $s_{11} \to s_{22} \to s_{12} \to s_{21}$. This cycle-4 loop can be eliminated if an accumulated permutation does not return to the same check-node by satisfying a condition:

$$-s_{11}-s_{22}+s_{12}+s_{21} \neq 0 (\text{mod } Q),$$

where shift values of all proto-CNs along the loop are accumulated. Here, the shift values are negated when the path goes downwards in the loop of the code graph. This explains a long-lasting problem that the BP decoding performs very poorly for the conventional polar codes (Q=1), i.e., the accumulated shifts will be always zero, resulting in a small girth of 4. The QC polar codes of the present invention can resolve this issue by maximizing the girth in the protograph. For example, the cycle-4 loop is eliminated by a shift base matrix of $$S = \begin{bmatrix} 0 & 0 \\ 0 & 1 \end{bmatrix}$$

since the accumulated shifts value is not zero for any $Q>1$. Higher cycles can be also eliminated if the following condition is satisfied for m-round cycle-4 loops:

$$m(-s_{11}-s_{22}+s_{12}+s_{21}) \neq 0 (\text{mod } Q),$$

for all m=1, 2, . . . , M' up to 4M' cycles in the loop.

FIG. 6B shows another example of short cycles for 3-stage QC polar codes, which have 12 proto-polarization units with shift values, forming a base matrix of size 3×4 as follows:

$$S = \begin{bmatrix} s_{11} & s_{12} & s_{13} & s_{14} \\ s_{21} & s_{22} & s_{23} & s_{24} \\ s_{31} & s_{32} & s_{33} & s_{34} \end{bmatrix}.$$

It contains many short cycles including a cycle-6 loop 660 in a message path of $s_{13} \to s_{34} \to s_{24} \to s_{12} \to s_{31} \to s_{21}$. Similarly, this cycle-6 loop can be eliminated if the accumulated shifts value is non-zero as follows:

$$-s_{13}-s_{34}+s_{24}+s_{12}+s_{31}-s_{21} \neq 0 (\text{mod } Q),$$

where again the shift values are negative for downward paths in the loop of the code graph. When we eliminate both the cycle-4 loop and cycle-6 loop, the code girth can be at least 8. In practice, removing cycle-4 is most effective to achieve good performance. In a similar manner, higher cycles involving more polarization stages can be also eliminated. For a large lifting factor, even a random shift base matrix can effectively remove short cycles in general. Note that pruning proto-polarizatons can also remove some of short cycles, whereas the frozen bit locations can shorten the length of short cycles. Hence, the frozen bit allocations and shift values optimization are both important.

Figure 7:
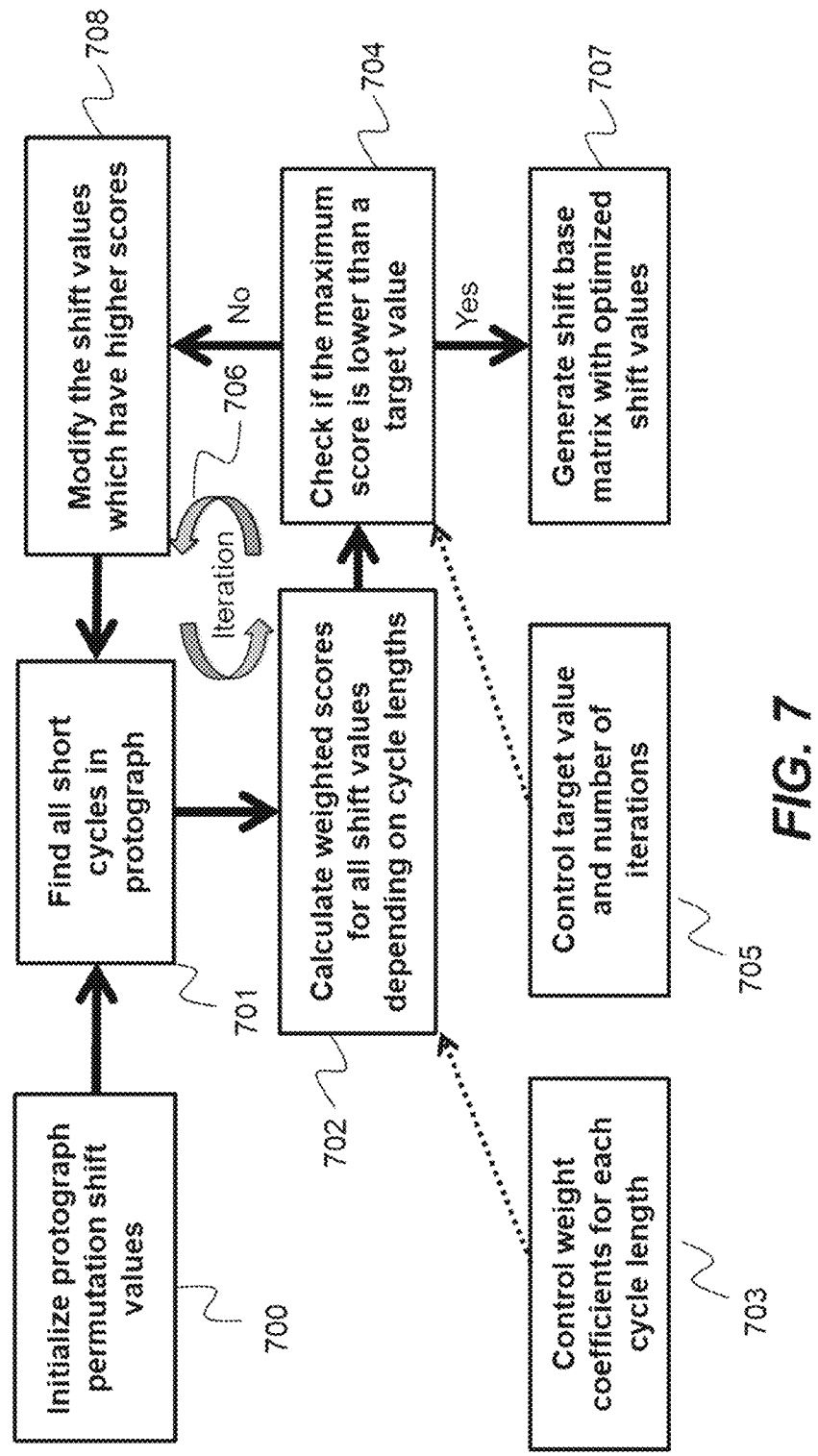
FIG. 7 shows a block diagram of the girth maximization procedure for eliminating short cycles in protograph by optimizing permutation shift values for QC polar codes according to some embodiments.

The method and system of the present disclosure provide a way to design high-girth shift values for the QC polar codes, through the use of a greedy hill-climbing method to find circulant shift values which eliminate short cycles in the protograph polar codes. FIG. 7 shows a block diagram to design high-girth QC polar codes. First, permutation shift values in a base matrix S of size $n \times 2^{n-1}$ are initialized 700, e.g., by random integers uniformly distributed between 0 and Q−1 for a lifting factor of Q. We then explore the n-stage protograph polar codes to find short cycle loops 701, including cycle-4, cycle-6, cycle-8, and cycle-10 loops involving 2 stages, 3 stages, 4 stages and 5 stages, respectively. A weighted score is calculated for all shift values 702. The score depends on the length of cycle based on a weighting control 703. For example, when a shift value is involved in a loop of cycle-4, the score is increased by 100 points, while it is increased by 10 points when a shift value is participated in a loop of cycle-6. As disclosed above, if the accumulated shifts value is non-zero, the score is not increased, unless otherwise the score is increased by the weighting point. Note that two-round cycle-4 loops are equivalent to cycle-8 loop. After calculating all scores at every shift value, a maximum among the scores is compared with a target value 704. If the maximum score is below the target value, an optimization iteration is terminated and the optimized shift base matrix having the optimized shift values is generated 707. Unless otherwise, an optimization iteration 706 continues. The target value is controlled depending on the number of iterations 705. For example, the target value is gradually increased to relax the requirement to remove short cycles.

When the maximum score is larger than the target value, we choose multiple shift values which have higher scores than others, and those shift values are randomly modified 708 by an integer number uniformly distributed from 0 to Q−1. For example, only one worst shift value is selected, or the worst 10% shift values are selected to be modified. After modification of the shift values, the optimization process is repeated 706.

The above hill-climbing procedure can eliminate short cycles in the protograph polar codes so that the message passing algorithm for decoding can perform appropriately. For example, 4-stage QC polar codes for a lifting factor of Q=256 as shown in FIG. 2 can eliminate cycle-6 and cycle-8 loops with the following shift base matrix optimized by the hill-climbing method:

$$S = \begin{bmatrix} 139 & 252 & 234 & 156 & 157 & 142 & 50 & 68 \\ 134 & 25 & 178 & 20 & 254 & 101 & 146 & 212 \\ 79 & 192 & 144 & 129 & 204 & 71 & 237 & 252 \\ 37 & 235 & 140 & 72 & 255 & 137 & 203 & 133 \end{bmatrix}.$$

This 4-stage QC polar codes with the above base matrix achieve significant gain greater than 2.4 dB over the conventional 4-stage polar codes, while the computational complexity is maintained at the same order.

Inhomogeneous Coupling

To further increase the error correction performance, some embodiments use a cyclic redundancy check (CRC) code embedded in the data bits. With this change, the decoder can easily exclude invalid codewords. If at least one of the decoding candidates corresponds to a data sequence with a valid CRC, then the most likely candidate with a valid CRC can be selected for the estimate. Specifically, the soft-decision decoder outputs have various confidence levels depending on the magnitude of the leftward LLR message values at the first stage of the decoder. Selecting several worst LLR values of the soft-output decision, we can flip the decision to check the validity of the CRC to improve the error correction capability.

Figure 8A:
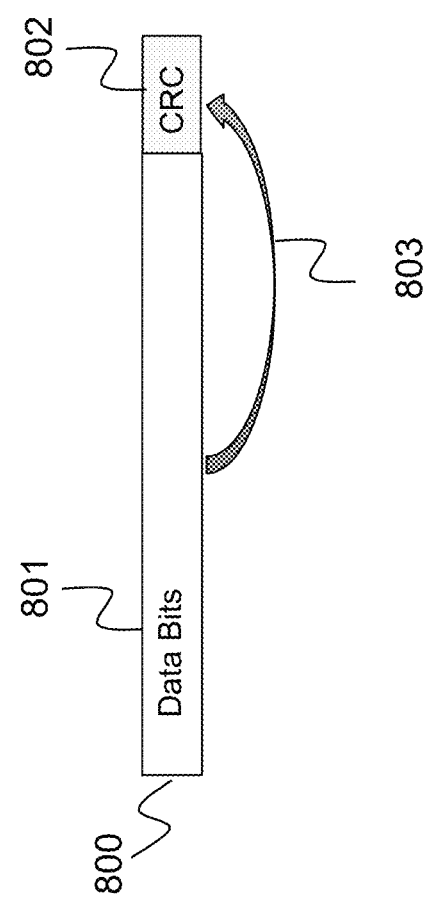
FIGS. 8A, 8B, 8C and 8D are exemplar schematics of embedding one or more CRC codes in the data bits for protograph polar codes according to some of embodiments.
Figure 8B:
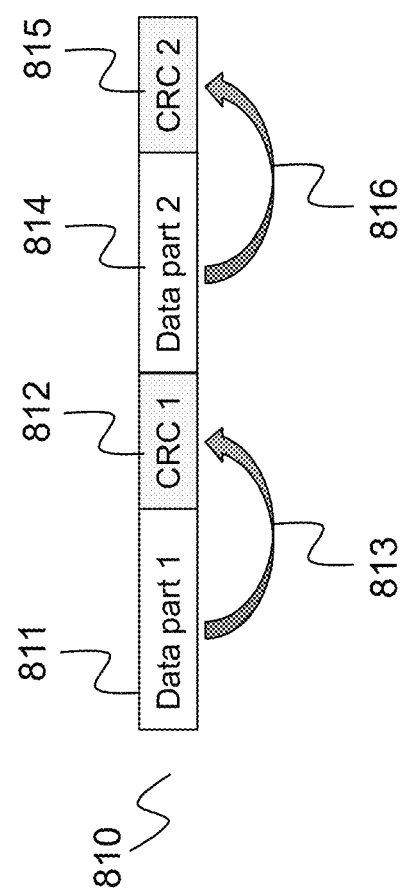

FIGS. 8A and 8B show schematics of embedding of at least one CRC code in the data bits feeding into the protograph encoder. For example, FIG. 8A shows an example where one CRC parity sequence is embedded at the end of the information bits to validate the correctness of the decoding. In this example, the bits of the codeword 800 are split into a single data part 801, containing actual message data, followed by a single CRC code 802 that is computed 803 from the data part 801. For example, C-bits CRC parity check sequence is appended to (QK−C)-bits data messages. The number of parity bits C is relatively small and the loss of net code rate, i.e., (QK−C)/Q$2^n$, is limited. For example, 1-bit parity uses CRC polynomial of D+1, 2-bit parity uses CRC polynomial of $D^2+D+1$, 3-bit parity uses CRC polynomial of $D^3+D^2+D+1$, 4-bit parity uses CRC polynomial of $D^4+D^2+D+1$, 8-bit parity uses CRC polynomial of $D^8+D^4+D^3+D^2+D+1$, 16-bit parity uses CRC polynomial of $D^{16}+D^2+1$, and so on, where D denotes a delay unit. The parity polynomial can be adaptively modified depending on the protograph code specification 140.

FIG. 8B shows another example using multiple CRC codes, where the first CRC is embedded in the middle of the data bits to improve performance of the polar decoding, and the second CRC at the end of the data bits. Such multiple CRC codes embedded within the data bits can be used to validate partial decoding candidates. In such a manner, the CRC can assist the polar decoder in pruning candidate codewords at intermediate steps in the decoding procedure. In addition, multiple CRC codes can prevent potential error propagation in the polar decoding. In the data bits 810, multiple CRC codes are embedded splitting the data bits into four parts. A first data part 811 is followed by a first CRC part 812 computed from 813 the first data part 811. The second data part 814 is followed by a second CRC part 815 computed from 816 the second data part 814.

Some embodiments use more than 2 CRC codes to split the data bits so that the decoder can check CRC validity at more segments of bit sequences. However, the use of more CRC codes can increase redundant parity bits, decreasing the net code rates when the codeword length is short. It was a critical issue for the conventional polar codes. The method and system of the present invention are based on realization that the rate loss due to multiple CRC codes is significantly reduced by using a high lifting factor Q. This embodiment also provides a non-obvious benefit that each proto-polarization unit in the first polarization stage can cancel the hard decision for the rightward message passing when CRC is validated across replicated Q-parallel encoders.

Figure 8C:
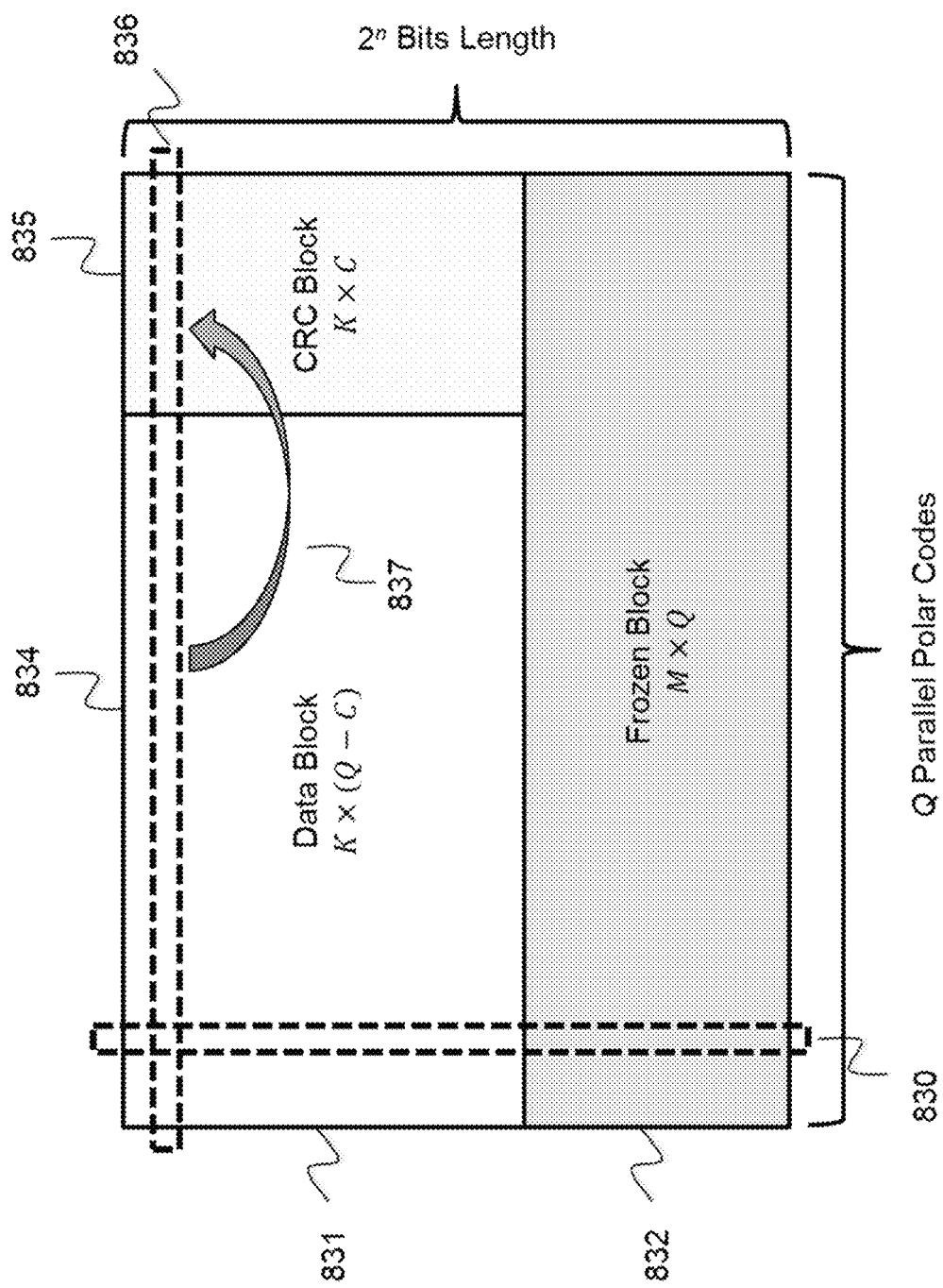

FIG. 8C shows an exemplar embodiment of embedding multiple CRC codes across parallel Q polar encoders. As shown in FIG. 2 and FIG. 5, the protograph polar codes replicate short polar codes with permutations across parallel encoders. The protograph polar encoder takes Q-fold increased data bits formed in a two-dimensional array of K×Q to encode into a Q-fold expanded codeword of N=Q×$2^n$ bits. The original data messages can be mapped in a 2-dimensional array 831 of size K×Q, where each column 830 is fed into one short polar encoder out of Q-parallel polar encoders. Along with the data bits 831, each column polar encoder feeds also a frozen bits array of size M×Q bits 832. The data bits 831 are further split into an information block 834 and a CRC parity block 835, which forms an array of K×C bits. In each row 836, CRC parity bits are computed 837 from the row of the information block 834. Even though it uses a large number of K-parallel CRC codes, the rate loss due to the CRC codes can be negligible as $R=(K(Q-C))/Q2^n$ when the lifting factor Q is large enough. Accordingly, the protograph decoder can check the CRC validity at every information bits plane $(u_1, \ldots, u_{2^n})$ as each $u_i$ has Q-bit data with CRC embedded. In some embodiments, the multiple CRC checks at each information bit plane enables a hybrid use of SC decoding and BP decoding. Specifically, after each iteration of the BP decoding, the CRC check is validated for the soft-decision leftward LLR message values, and the rightward message can be fixed as additional frozen bits from one of $\{\pm\infty\}$ if the CRC check passes. This hybrid SC and BP decoding can accelerate the decoding convergence.

Figure 8D:
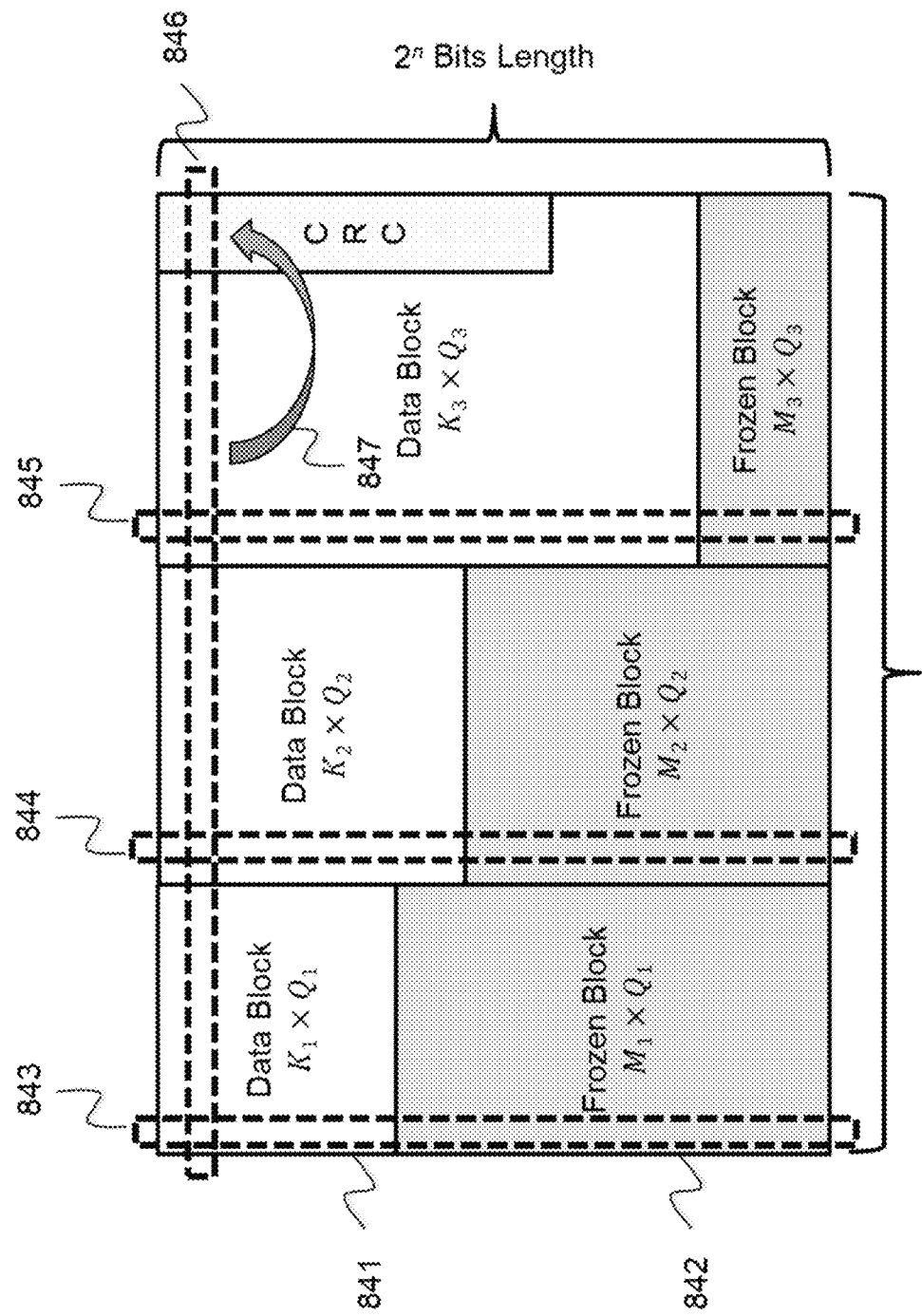

To have more degrees of freedom, some embodiments use inhomogeneous coupling operations with partial CRC codes. FIG. 8D shows an exemplar embodiment of inhomogeneous coupling. In the embodiments, the Q-fold replication of polar encoders use non-identical frozen bit locations and code rates. For example, the first $Q_1$ short polar encoders 843 use a lower code rate of $R_1=K_1/2^n$ for the first information array of size $K_1 \times Q_1$, the middle $Q_2$ short polar encoders 844 use a moderate code rate of $R_2=K_2/2^n$ for the second data array of size $K_2 \times Q_2$, and the last $Q_3$ short polar encoders 845 use a higher code rate of $R_3=K_3/2^n$ for the last data array of size $K_3 \times Q_3$. The frozen bit parts are now stair-case shaped 842. The row 846 across $Q=Q_1+Q_2+Q_3$ encoders is encoded with individual CRC codes 847. In some embodiments, the CRC parity bit lengths can be non-identical and some rows are not embedded with CRC codes. For example, 10% rows use 16-bit CRC codes, 20% rows use 8-bit CRC codes, and the reminder does not use any CRC codes Using this inhomogeneous coupling, the reliability at each $u_i$ bits plane can be more adjusted as soft frozen bits. The belief message can propagate from lower rate encoders to higher rate encoders. Some embodiments use a specific scheduling such as a windowed decoding from lower-rate encoder parts to higher-rate encoder parts. This windowed decoding can further improve the decoding latency. For some embodiments, besides CRC codes, other error correction codes are embedded with the protograph polar codes. For example, high-rate BCH codes are embedded to remove an error floor in such embodiments.

Figure 9:
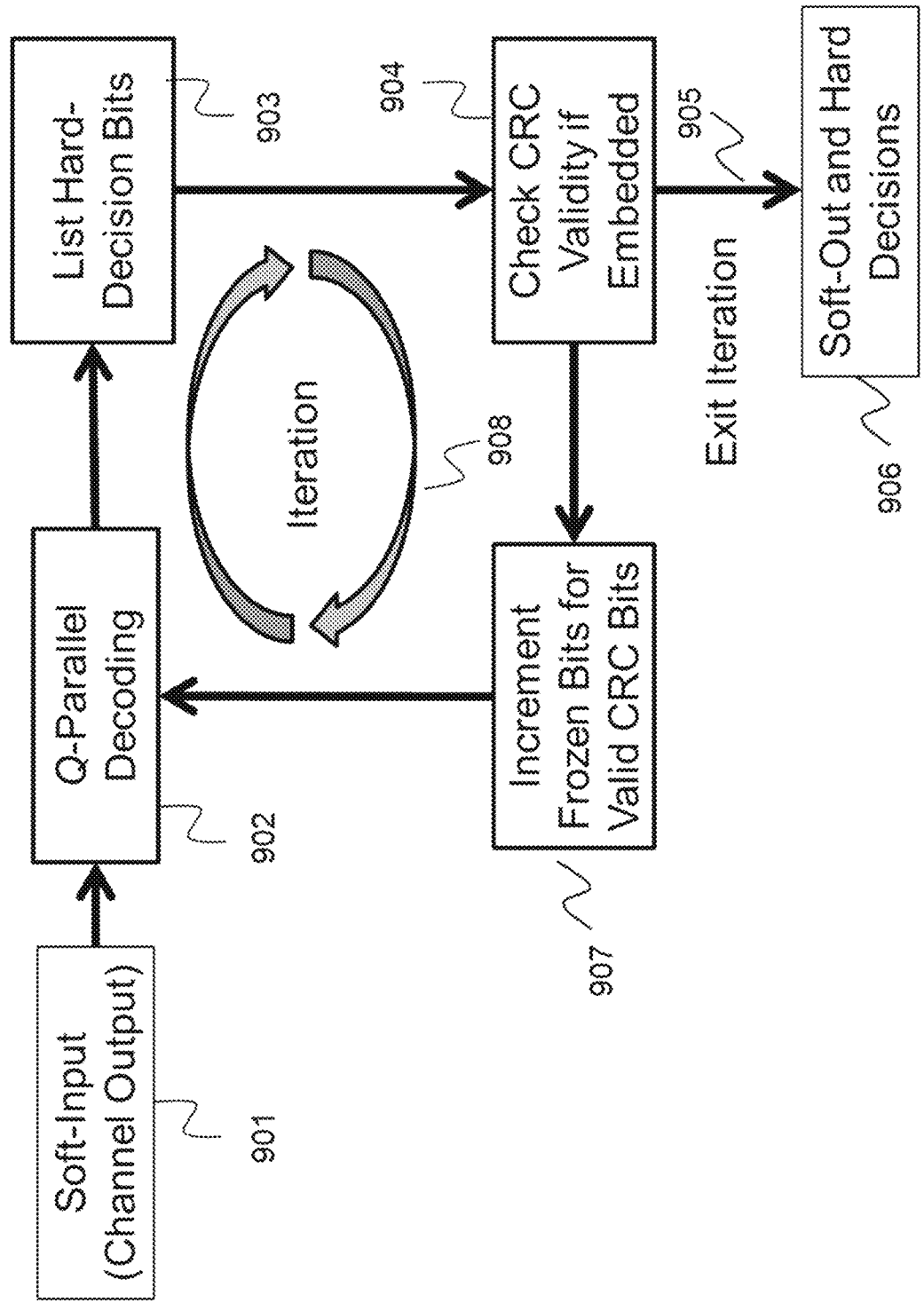
FIG. 9 is a block diagram of a method for decoding a codeword with embedded CRC codes transmitted over a channel according to some embodiments.

FIG. 9 shows a block diagram of protograph polar decoding with homogeneous or inhomogeneous coupling when multiple CRC codes are embedded, according to some embodiments. The protograph polar decoder takes soft-input message 902 to correct potential errors. The protograph polar decoder uses Q-parallel short polar decoders 902, where all belief messages are initialized according to the frozen bit locations. After one-round update of message passing across multiple stages and decoders, a hard-decision operation 903 is taken place for the rightward message at the first polarization stage. The hard-decision uses a sign of the belief messages to determine '0' or '1'. In some embodiments, the hard-decision is stochastically applied depending on the magnitude of the belief messages. For example, the estimate of the i-th data for $u_1$ is probabilistically determined as $$\hat{u}_i = \begin{cases} 0, & \text{at a probability of Sigmoid}(c_i) \\ 1, & \text{at a probability of Sigmoid}(-c_i) \end{cases}$$

where $c_i$ is the belief message in the LLR domain. The sigmoid function is defined as $$\text{Sigmoid}(c) = \frac{\exp\left(+\frac{c}{2}\right)}{\exp\left(-\frac{c}{2}\right) + \exp\left(+\frac{c}{2}\right)}.$$

This stochastic hard-decision can generate a list of multiple hard-decision candidates 903 for the data bits estimates. In some embodiments, simple bit flipping for some low-reliability bits having small LLR magnitude is used to generate the hard-decision list. All the candidates in the list are validated 904 at each CRC code segment. If all CRC checks pass the validity, an iterative decoding is terminated 905 and the soft-output and hard-decision results are produced 906. Unless otherwise, the decoding iteration 908 continues up to a pre-defined maximum count. Some embodiments use incremental frozen bits 907, where some partial hard-decision data which passed CRC validations (or highly reliable belief messages exceeded a threshold value) are fixed as additional frozen bits to update the next-round of message passing iteration 902. These incremental frozen bits can accelerate the decoding convergence. This is particularly effective if we use multiple CRC codes for the protograph polar codes since partial data can be frozen in a segment wise manner.

Frozen Bit Design

Some embodiments are based on recognition that the conventional polar coding construction assumes the situation where the communication channels and modulation schemes provide uniform transmission reliability for each transmitted codeword bit. However, some practical systems, such as higher-order modulation, frequency-selective fading channels, time-varying channels, and multiple-input multiple-output (MIMO) channels with multiple antennas, result in non-uniform reliability across the transmitted bits. Some embodiments are based on another recognition that the polar coding performance highly depends on frozen bit locations according to the channel statistics. The present invention discloses a way to optimize frozen bit locations for the proptograph polar codes in such a situation by using a protograph-based extrinsic information transfer (P-EXIT) analysis.

In some embodiments, the transmitter 110 and/or the receiver 130 include a channel estimator configured to determine parameters of the communication channel 120. For example, the parameters of the communication channel include values of non-uniform reliability for transmission of bits of the encoded codeword and/or other statistics of the channel such as SNR and power delay profile. The parameters of the communication channel can be determined using various methods such as least-squares channel estimation based on pilots and training symbols or a blind power estimation. The protograph code specification 140 includes a memory to store a mapping between different values of code parameters to different values of the parameters of the communication channel. In such a manner, the embodiment can select a combination of values of the code parameters of the protograph polar codes based on the parameters of the communication channel determined by the channel estimator.

To facilitate the protograph decoding, frozen bit locations are refined so that the polarization effect can be boosted up, by dealing with the statistics of the likelihoods during decoding. The frozen bit location design is particularly important for high-order modulation and frequency-selective fading channels, where different coded bits are corrupted with different noise strengths, causing non-uniform bit reliabilities. The embodiment exploits the knowledge of statistics of likelihoods for selecting frozen bit locations to improve the performance of soft-decision decoding. In addition, how to map the coded bits onto which modulation bit is important for such non-uniform reliability because different mapping can degrade the polarization effect. Therefore, careful interleaving design to map the coded bits onto modulation bits is required besides the frozen bit location design. The method of the invention provides a way to jointly design the frozen bit locations and interleaving for such high-order modulation and fading channels.

Figure 10A:
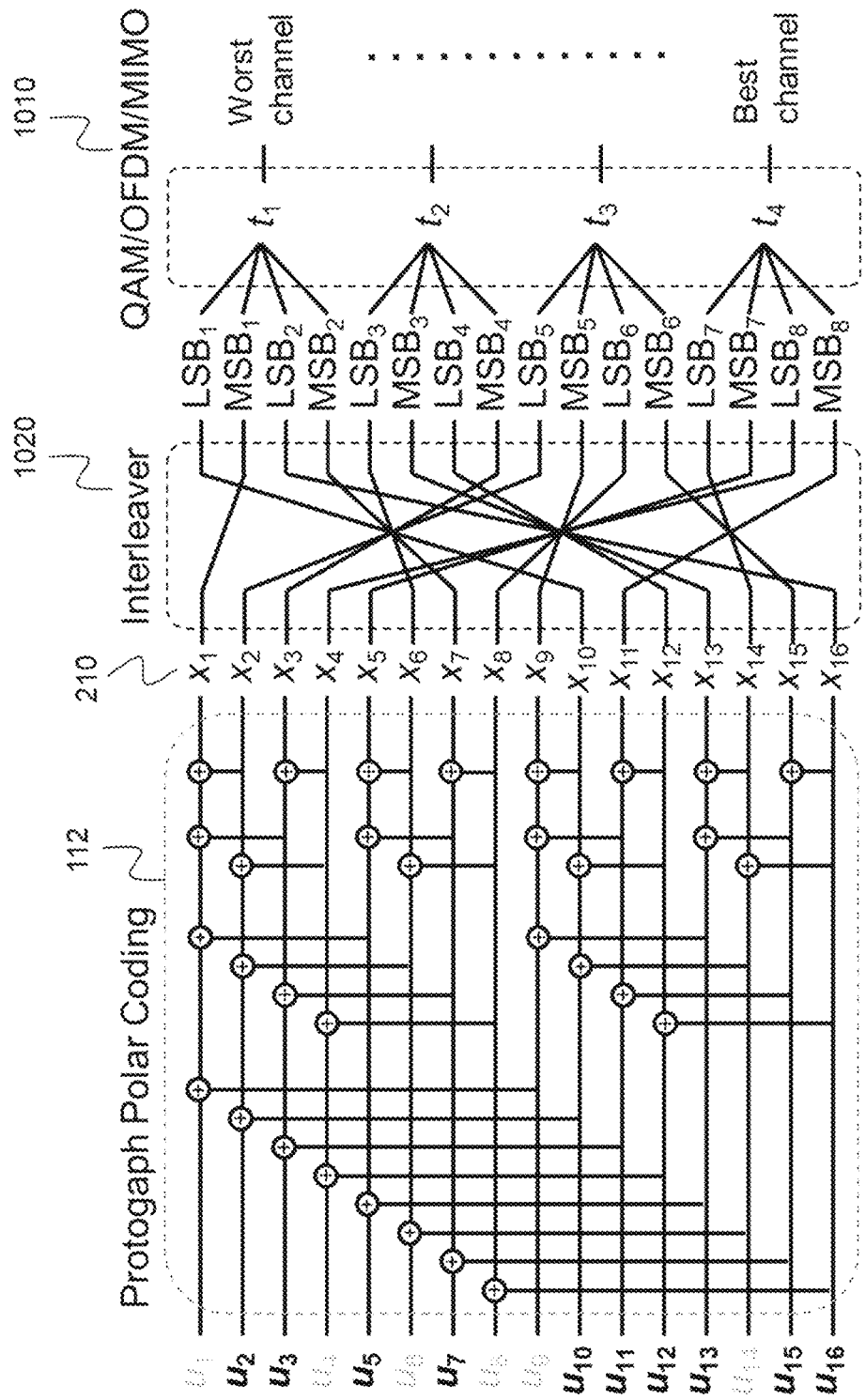
FIG. 10A is a schematic of bit-interleaved protograph polar-coded modulation for non-uniform channels according to some embodiments.

FIG. 10A shows an exemplar schematic of the transmitter with interleaving, where protograph polar coding 112 produces the coded bits $(x_1, \ldots, x_N)$, which are mapped by an interleaver 1020 to different modulation bits at a QAM modulator, MIMO antenna multiplexing, or OFDM modulator 1010, across the least-significant bit (LSB) to the most-significant bit (MSB) planes. LSB to MSB have different bit reliabilities. Besides bit significance, each modulated symbol $(t_1, \ldots, t_{N'})$ may have different channel noise level, e.g., due to frequency-selective fading channels and multi-antenna transmissions. The method of the invention carefully maps the important coded bits to the reliable modulation bits so that high decoding performance is realized.

Figure 10B:
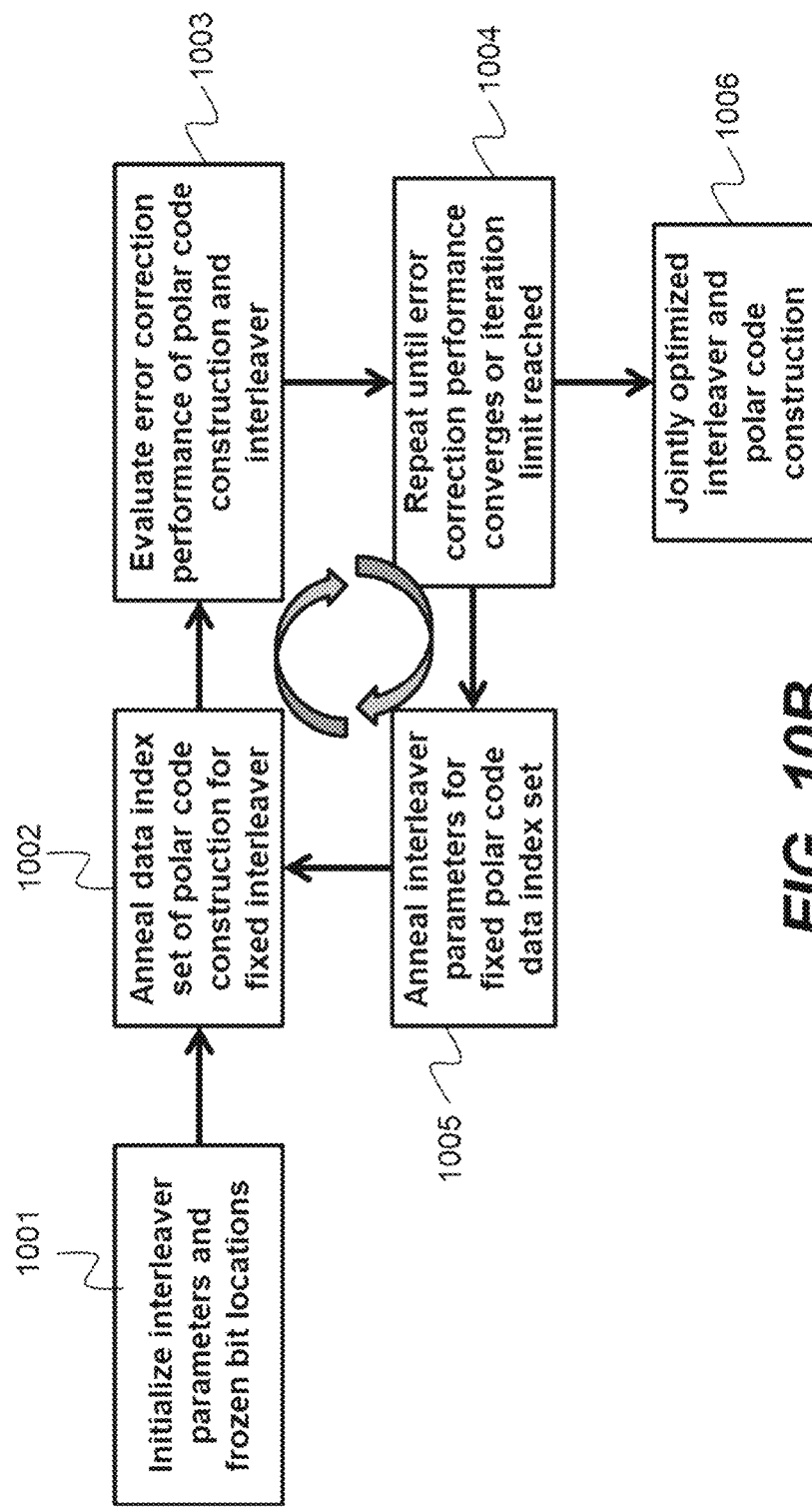
FIG. 10B is a block diagram of the joint optimization procedure for the interleaver and protograph polar code construction for non-uniform channels according to some embodiments.

FIG. 10B shows the procedure jointly optimizing the interleaver and frozen bit locations for non-uniform channels. This method employs an interleaver scheme where the permutation performed by the interleaver is determined by a set of parameters that can be tractably optimized, instead of considering all possible permutations. For example, one realization of interleaving is based on a polynomial permutation, including the quadratic polynomial permutation (QPP) interleaver, which re-orders the coded bit index i (0-base) to the modulation bit index as follows:

$$\Pi_{QPP}(i) = (f_0 + f_1 i + f_2 i^2) \bmod N,$$

where $(f_0, f_1, f_2)$ are the polynomial coefficients to design for the interleaving. Before and after the QPP interleaving, short lexicographical permutation tables can be used so that more degrees of freedom are available to design the interleaving for the protograph polar coding.

First, the interleaver is set to an initial permutation 1001. Then, the polar code construction is optimized for this initial interleaver permutation 1002, by selecting the data index set corresponding to the most-reliable pseudo-channels. Then, the error correction performance of polar code construction and interleaver is evaluated 1003. This evaluation could be performed empirically via simulations and/or analytically via the error bound computable from reliability of the pseudo-channels selected by the data index set. For example, at each polarization operation, the statistics of the likelihood can be traced by the Bhattacharyya parameter, the density evolution, the Gaussian approximation, or the extrinsic information transfer (EXIT) methods. In order to capture the non-uniform reliability for the protograph polar codes, the method of some embodiments uses an extended version of EXIT called P-EXIT in an un-conventional tracing.

Specifically, in order to consider soft-decision message propagation, the P-EXIT method traces the reliability in terms of extrinsic mutual information according to a decoding schedule as follows:

$$M_i^m = J_{TB}\left(\sqrt{[J_{TB}^{-1}(L_j^m)]^2 + [J_{TB}^{-1}(R_i^{m-1})]^2}\right),$$

$$M_j^m = 1 - J_{TB}\left(\sqrt{[J_{TB}^{-1}(1 - L_i^m)]^2 + [J_{TB}^{-1}(1 - R_i^{m-1})]^2}\right),$$

$$L_i^{m-1} = 1 - J_{TB}\left(\sqrt{[J_{TB}^{-1}(1 - M_j^m)]^2 + [J_{TB}^{-1}(1 - L_j^m)]^2}\right),$$

$$L_j^{m-1} = J_{TB}\left(\sqrt{[J_{TB}^{-1}(M_i^m)]^2 + [J_{TB}^{-1}(L_j^m)]^2}\right),$$

$$R_i^m = 1 - J_{TB}\left(\sqrt{[J_{TB}^{-1}(1 - M_j^m)]^2 + [J_{TB}^{-1}(1 - R_i^{m-1})]^2}\right),$$

$$R_j^m = J_{TB}\left(\sqrt{[J_{TB}^{-1}(M_i^m)]^2 + [J_{TB}^{-1}(R_j^{m-1})]^2}\right),$$

respectively for the downward extrinsic information, the upward extrinsic information, the leftward extrinsic information at the upper branch, the leftward extrinsic information at the lower branch, the rightward extrinsic information at the upper branch, and the rightward extrinsic information at the lower branch. Here, $R_i^m$ and $L_i^m$ are the mutual information propagated rightward and leftward, respectively, at the m-th stage. The rightward extrinsic information at the first stage is initialized depending on frozen bit locations; specifically, $R_i^0=0$ for information bits and $R_i^0=1$ for frozen bits. The P-EXIT uses the J-function $J_{TB}$ (.) and its inverse function $Ji_{TB}^{-1}$ (.), i.e., $$J_{TB}(x) = 1 - \int_{-\infty}^{\infty} \frac{1}{\sqrt{2\pi x^2}} e^{-\frac{\left(t - \frac{x^2}{2}\right)^2}{2x^2}} \log_2(1 + e^t) dt.$$

Once we calculate the mutual information after finite-iteration decoding according to a specified scheduling, the error rate at the i-th input bit is obtained by $$P_i = \frac{1}{2} erfc\left(\frac{1}{2\sqrt{2}} J_{TB}^{-1}(L_i^0)\right),$$

where erfc(x) is the complementary error function. Note that the mutual information calculation at each polarization stages should take into account the non-identical LUTs for quantized soft-decision decoding. Specifically, the above J-function is modified from continues Gaussian function to discrete-input and discrete-output function, whose mutual information can be readily calculated by the corresponding transition matrix. In addition, the P-EXIT evolution equations are modified for different decoding methods such as min-sum algorithm and also different scheduling such as round-robin scheduling. The frozen bit locations are initialized, e.g., by a conventional Reed-Muller code, Bhattacharyya parameters or beta expansion. Then, an annealing method is applied, where the frozen bit locations are perturbed to see if the analytic error rate is reduced.

Note that the P-EXIT analysis becomes more accurate when increasing the lifting factor Q because the dispersion inside proto-variable nodes and proto check-nodes will decrease in an inversely proportional manner. Specifically, the dispersion of the extrinsic information is modeled as $$\text{var}(I) \cong \frac{2.68 I (1 - I)}{Q},$$

where var(.) is a variance of a random variable, and I denotes an extrinsic information, e.g., $R_i^m$, $M_i^m$ and $L_i^m$. This explains another great benefit of the invention, as the conventional EXIT analysis is less accurate for the conventional polar codes having only single bit at each check node and variable node. For some embodiments, the P-EXIT analysis is based on a non-deterministic and stochastic method which generates a random sample from a Gaussian distribution having a nominal mean of $I_0$ and variance of var($I_0$) for the leftward, rightward, upward and downward extrinsic information. This embodiment with stochastic P-EXIT analysis can provide more accurate tracing of the mutual information updates in the protograph codes by taking a finite lifting factor of Q into account through the use of random perturbation with its variance.

Next, a decision to continue or end the iterative optimization procedure is made 1004, based on whether the error correction performance has converged (i.e., not changing significantly with respect to previous iterations) or if a limit on the total number of iterations has been reached. If continuing, the interleaver permutation is optimized while the polar code data set index is kept fixed 1005, then the data set index is again optimized while the interleaver is kept fixed 1002, then the performance of the protograph polar coding and interleaver is reevaluated 1003, and a decision to continue or end the iterative optimization is again made 1004. After ending these iterations, the final result is the jointly optimized interleaver and polar code construction 1006. This joint optimization of frozen bit locations and interleaving provides boosted polarization effect especially for wireless fading channels.

Irregular Pruning

In prior arts, it was shown that the conventional polar codes can be improved by introducing irregular pruning of polarization units, thereby it is often capable of reducing the encoding/decoding complexity, decoding latency, and even error rates due to improved Hamming weight distributions. The method and system of the present invention provide further improvement of the protograph polar codes by deactivating polarization units. This provides another benefit in the protograph polar codes; specifically pruning proto-polarization units can assist removing short cycles.

Figure 11A:
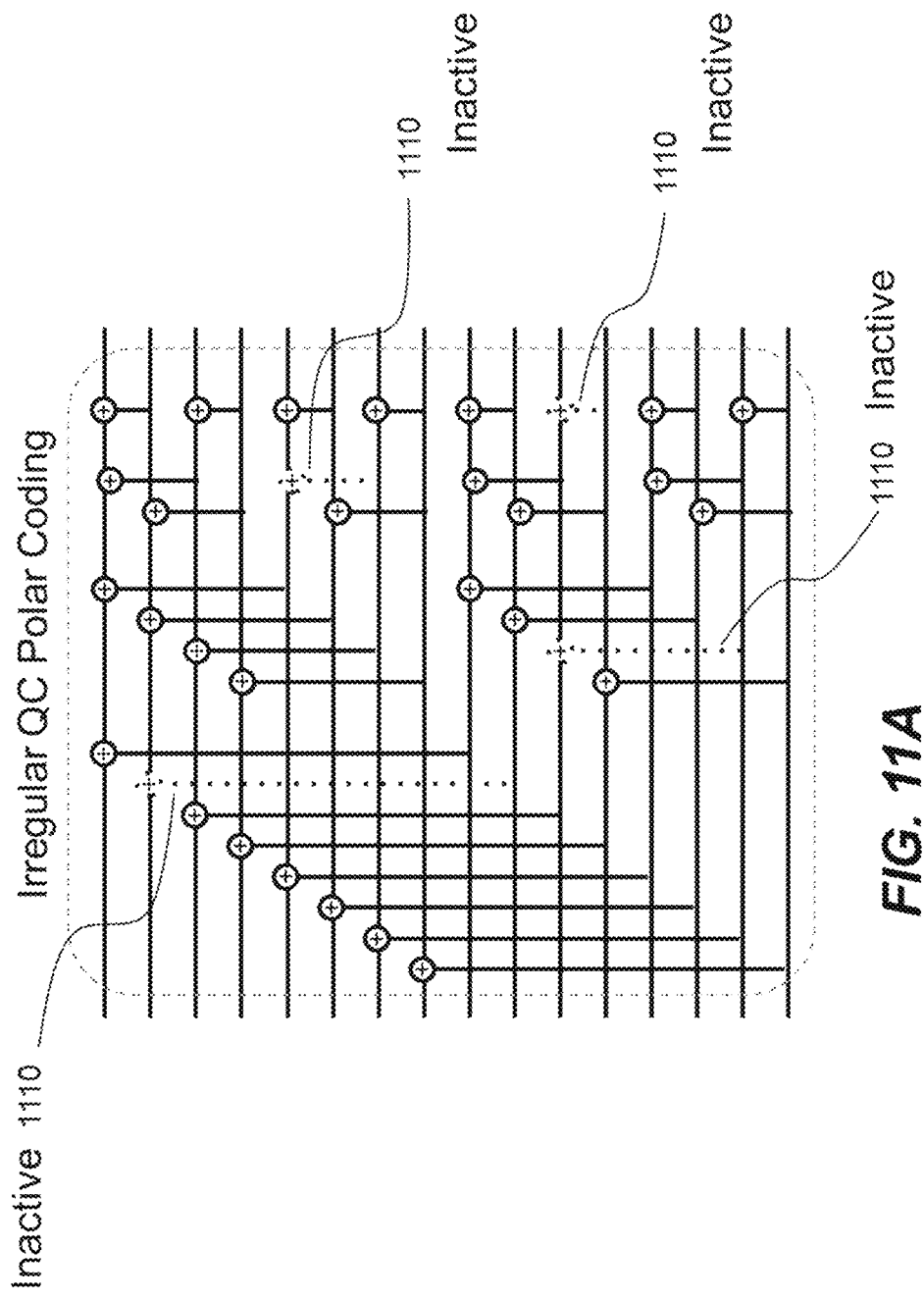
FIG. 11A is an illustration of an example irregular QC polar coding structure having sparsely chosen inactive proto-polarization unit according to some embodiments.

FIG. 11A illustrates an example of irregular protograph polar coding structure, where several proto-polarization units are de-activated 1110. By carefully selecting inactive proto-polarization units, the error correction performance can be improved and the computational complexity for encoding and decoding can be reduced. In addition, several set of inactivated proto-polarization units enable partially parallel decoding, leading to reduced latency of decoding. The location of inactive proto-polarization units is determined by analyzing the error bound with P-EXIT methods so that the error bound is minimized in a greedy fashion. Because most proto-polarizations do not drastically degrade the decoding performance, this irregular de-activation can significantly reduce the decoding complexity by choosing more inactive proto-polarization units.

Figure 11B:
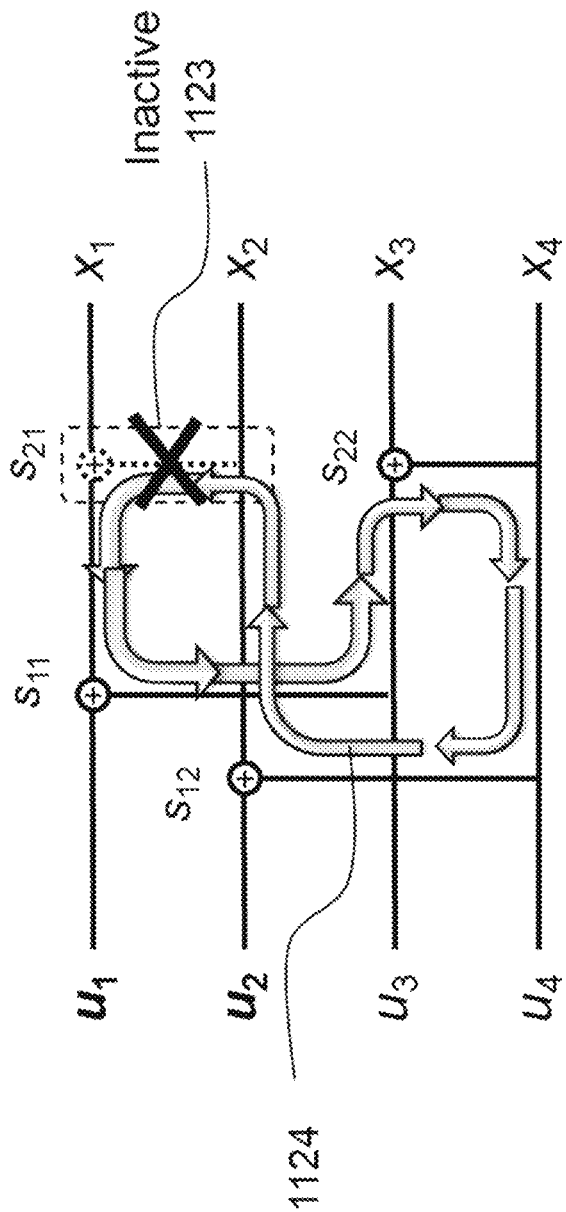
FIG. 11B is an illustration of an example irregular QC polar coding structures having in inactive proto-polarization unit for 2-stage QC polar codes, showing the impact of de-activated proto-polarizer to remove short cycles according to some embodiments.

In fact, de-activating proto-polarization units for protograph polar codes has another benefit, which remove some short cycles to improve the message passing capability. FIG. 11B shows an example of irregular QC polar coding structure for 2-stage polarizations to illustrate the benefits provided by de-activating proto-polarization units. The regular protograph polar coding has two proto-polarization stages, where each stage has two proto-polarization units. As addressed in FIG. 6A, such a protograph has cycle-4 loop 1124 through proto-check nodes of $s_{11} \to s_{22} \to s_{12} \to s_{21}$. This irregular QC polar coding de-activates 1123 the first proto-polarizer unit at the second stage. This inactive proto-polarization can cut the cycle-4 loop 1124 regardless of the shift values. This irregular QC polar code has 0.9 dB gain over the regular polar codes, while achieving 25% complexity reduction. This example suggests that de-activating proto-polarizer units can reduce not only the computational complexity but also the number of short cycles. Note that the short cycles are also depending on the frozen bit locations as the infinite confidence at some graph edges can remove lengths of cycles, and hence optimizing frozen bit locations are important as well as girth optimization.

The irregular QC polar coding with inactive proto-polarizer units can have more degrees of freedom to design than regular QC polar coding; specifically, there are $2^{n2^{n-1}}$ possibilities to select the locations of inactive polarizer units because there are $N'=n2^{n-1}$ proto-polarizer units for n-stage QC polar codes. Whether each proto-polarization unit is active or inactive can be indicated by the shift base matrix S of size n-by-$2^{n-1}$, whose (i, j)-th entry is a shift permutation value for the j-th proto-polarization unit at the i-th polarization stage. To indicate whether the i-th proto-polarizer unit at the j-th polarization stage is active or inactive, the shift base matrix can accept negative values, for which case the corresponding proto-polarization unit is inactive. For example, the regular QC polar coding of 2-stage polarizations has a shift base matrix of $$S = \begin{bmatrix} s_{11} & s_{12} \\ s_{21} & s_{22} \end{bmatrix},$$

while the irregular QC polar coding in FIG. 11B has $$S = \begin{bmatrix} s_{11} & s_{11} \\ -1 & s_{21} \end{bmatrix},$$

where the (2,1)-th proto-check node is pruned. Because the total number of possible irregular QC polar codes is huge, it is not straightforward to optimize the irregular shift base matrix for long irregular polar coding. In order to achieve good irregular QC polar coding, a greedy tree search is used in the method of the present invention.

Figure 12:
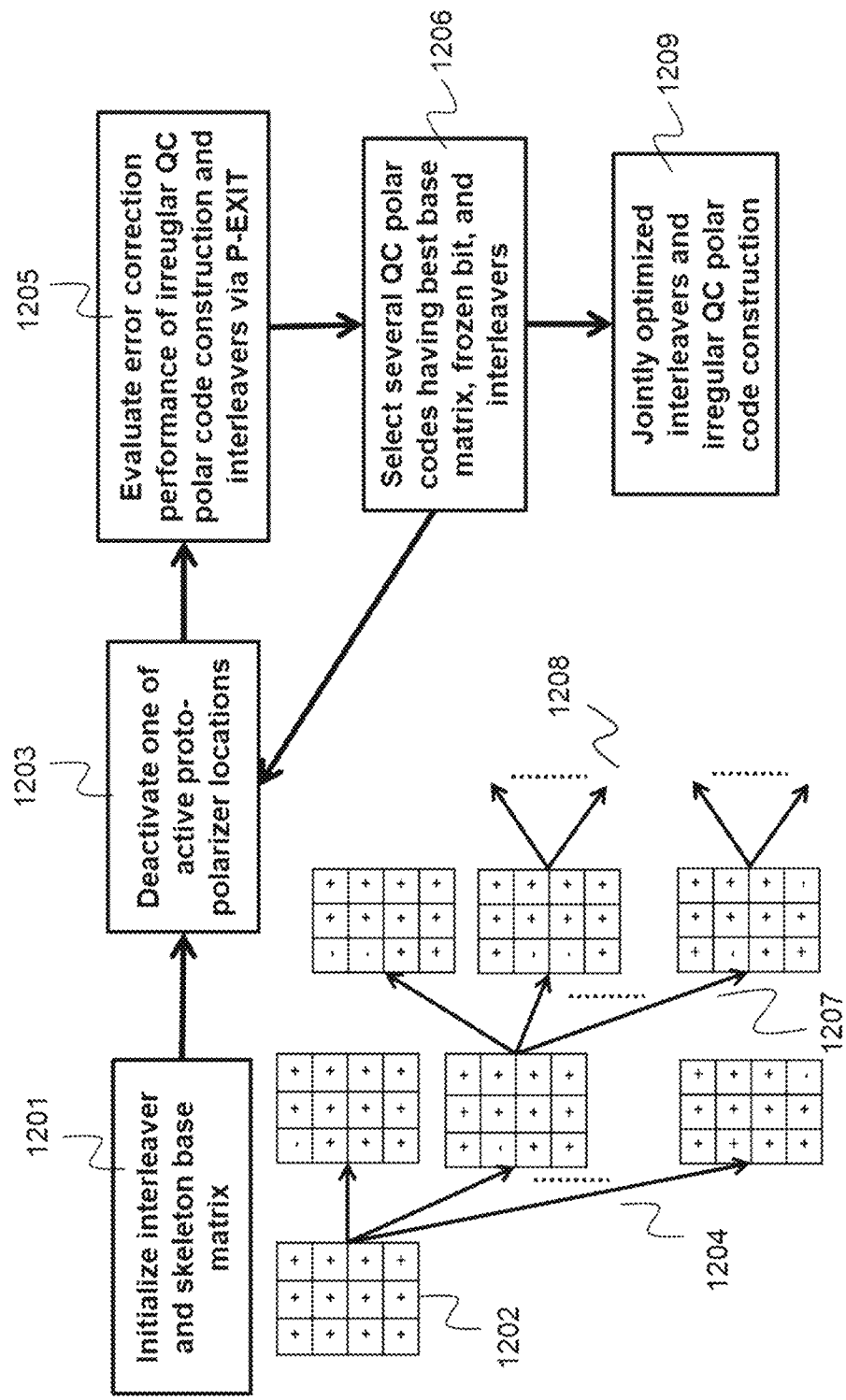
FIG. 12 is a block diagram of a method for selecting inactive proto-polarizers of the irregular QC polar coding structure according to some embodiments.

FIG. 12 shows a block diagram of a method for selecting inactive post-polarizers of the irregular QC polar coding structure according to some embodiments. The method initializes 1201 an activation matrix called skeleton base matrix to be '+' 1202, to indicate active post-polarization units. Next, the method deactivates 1203 the previous activation matrix, i.e., changing an element of '+' to '−' to indicate the deactivation. The deactivation is considered for all possible N' locations 1204. Then, the error rate probability is computed for each irregular QC polar coding. Here, the interleaver and frozen bit locations are optimized similarly as described in FIG. 11B, during the analysis of the error rate performance through P-EXIT evolution. The method selects 1206 the best L' irregular QC polar coding having the smallest error probability. For each selected irregular QC polar coding, the method further deactivates 1203 different proto-polarizer units 1207. The procedure continues 1208 until a termination condition is met. The termination condition includes, e.g., the case when the error rate performance is minimized or the case when the error rate performance becomes worse than that of the regular QC polar coding. After the list tree search is finished, the irregular QC polar coding with optimized activation table, interleaver and frozen bit locations is produced 1209. Note that the active proto-polarizations are indicated as '+' in the skeleton base matrix, and those active shift values are optimized to increase the girth similarly as described in FIG. 7 after the skeleton base matrix and frozen bit locations are designed. Accordingly, a set of rules to connect or dis-connect the multi-stage proto-polarization units is defined with the optimized skeleton base matrix.

For example for 6-stage QC polar codes having Q=1024, using the optimization method described in FIG. 12, pruning several tens of percentage of the proto-polarization units can improve the error correction performance over the regular counterpart. In addition, the irregular QC polar codes can be superior to the conventional polar codes even with pruning more than 60% of the polarization units. In consequence, the irregular QC polar codes can further reduce the decoding complexity with potential performance improvement.

Extended Kernel and Permutation

The deactivation of the XOR of a proto-polarization unit is equivalent to change the polar kernel from $$F = \begin{bmatrix} 1 & 0 \\ 1 & 1 \end{bmatrix}$$

to another full-rank identity kernel $$\begin{bmatrix} 1 & 0 \\ 0 & 1 \end{bmatrix}$$

at the inactive location. Some embodiments of the invention are based on this recognition to extend the irregular QC polar coding to non-binary and high-order kernels. For example, some embodiments use irregular QC polar coding with different full-rank non-binary kernels such as $$F = \begin{bmatrix} 1 & 0 \\ 2 & 3 \end{bmatrix}, \begin{bmatrix} 1 & 0 \\ 0 & 2 \end{bmatrix}, \begin{bmatrix} 2 & 0 \\ 1 & 1 \end{bmatrix}$$

for 4-ary Galois filed or 4-ary finite ring (i.e., modulo-4 algebraic arithmetic). Accordingly, the encoding and decoding operations are defined by an algebraic arithmetic operation, such as an addition, a subtraction, a multiplication, a division, or a combination thereof for a finite Galois field (and similarly for a finite ring). For some embodiments, the arithmetic operations are specified by a look-up table in place of the regular algebraic operations. Such different non-binary kernels are irregularly assigned for each proto-polarizer units to improve the error rate performance and to reduce the computational complexity. Accordingly, the XOR operation is not only the unique rule for message passing in the encoder as an exclusive not-or (XNOR) or not-and (NAND) can be used in some embodiments besides the Galois field arithmetic.

Yet another embodiment uses irregular mixture of high-order kernels; e.g., $$F = \begin{bmatrix} 1 & 0 & 0 \\ 0 & 1 & 0 \\ 1 & 1 & 1 \end{bmatrix}, \begin{bmatrix} 1 & 0 & 0 \\ 1 & 1 & 0 \\ 1 & 1 & 1 \end{bmatrix}, \begin{bmatrix} 1 & 0 & 0 \\ 0 & 1 & 0 \\ 0 & 0 & 1 \end{bmatrix}, \begin{bmatrix} 1 & 0 & 0 \\ 0 & 1 & 0 \\ 0 & 1 & 1 \end{bmatrix},$$

for order-3 kernels, and $$F = \begin{bmatrix} 1 & 0 & 0 & 0 \\ 1 & 1 & 0 & 0 \\ 1 & 0 & 1 & 0 \\ 1 & 0 & 0 & 1 \end{bmatrix}, \begin{bmatrix} 1 & 0 & 0 & 0 \\ 0 & 1 & 0 & 0 \\ 1 & 1 & 1 & 0 \\ 1 & 0 & 0 & 1 \end{bmatrix}, \begin{bmatrix} 1 & 0 & 0 & 0 \\ 0 & 1 & 0 & 0 \\ 0 & 0 & 1 & 0 \\ 0 & 0 & 0 & 1 \end{bmatrix}, \begin{bmatrix} 1 & 0 & 0 & 0 \\ 1 & 1 & 0 & 0 \\ 0 & 1 & 1 & 0 \\ 0 & 0 & 1 & 1 \end{bmatrix},$$

for order-4 kernels, in an irregular fashion. High-order and non-binary kernels can be combined as well for some embodiments. Note that the protograph lifting operation described in FIG. 5 is readily applicable for the high-order and non-binary kernels. Accordingly, the rule of the message passing for encoding and decoding is defined depending on the kernel.

For some embodiments, the protograph polar codes use non-circulant matrices for the permutation matrices $P_{ij}$ in the lifting operation. Some embodiments are based on the recognition that the circulant matrix $I(s)$ is not the only unique weight-1 permutation matrix. For example, another weight-1 permutation matrix is a reversed circulant matrix which flips the circulant matrix in the horizontal axis as follows:

$$\tilde{I}(s) = I(s) \begin{bmatrix} & & 1 \\ & \cdot^{\cdot^{\cdot}} & \\ 1 & & \end{bmatrix}.$$

In some embodiments, the weight-1 permutation is realized by a polynomial permutation such as the QPP interleaver with different parameters. Even a random permutation is used as a random weight-one permutation in some embodiments. For other examples, weight-2 and weight-3 permutation matrices such as $$P_{ij} = \begin{bmatrix} 1 & 1 & 0 & 0 \\ 0 & 1 & 1 & 0 \\ 0 & 0 & 1 & 1 \\ 1 & 0 & 0 & 1 \end{bmatrix}, \begin{bmatrix} 1 & 1 & 1 & 0 \\ 0 & 1 & 1 & 1 \\ 1 & 0 & 1 & 1 \\ 1 & 1 & 0 & 1 \end{bmatrix}$$

are used in some embodiments, where the permutation weight is determined by the average number of non-zero elements per column. Accordingly, random weight-two or random weight-three permutations are used in some embodiments. Some higher-weight permutation can be also realized by a combination of lower-weight permutations. Even though a higher-weight permutation can increase the computational complexity for encoding and decoding, it may improve the QC polar codes. The permutation is further extended for non-binary arithmetic in some embodiments. Accordingly, a rule of the protograph permutation is defined depending on the code specification.

Spatial Coupling

Some embodiments further increase the degrees of freedom in the design space to facilitate the soft-decision decoding by spatially coupling multiple polar codes in an unconventional way with different parameters such as code lengths, code rates, and frozen bit locations. Some embodiments use a lifting operation to couple replicated encoders in part, and in a convolutional way.

Figure 13:
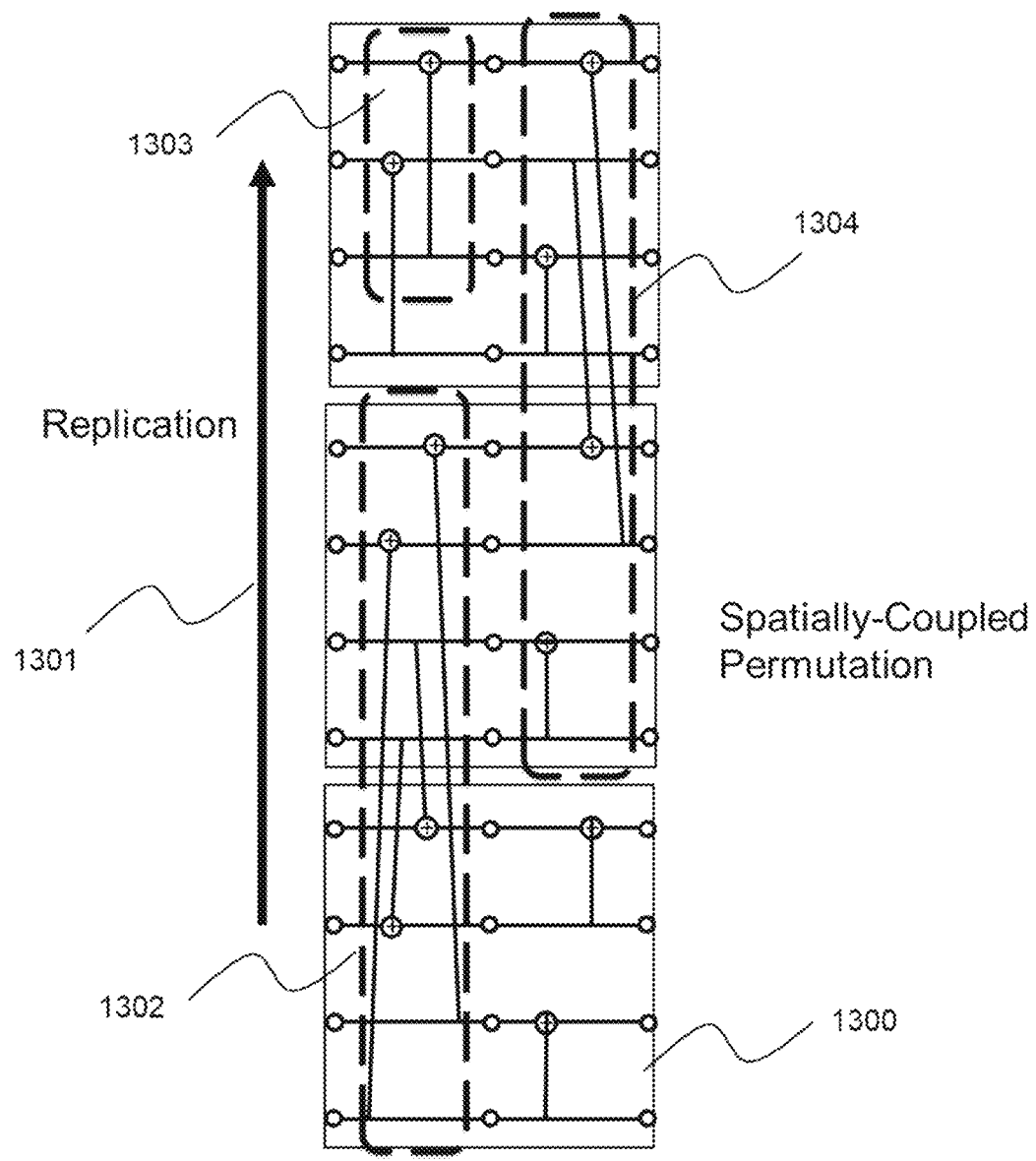
FIG. 13 is an exemplar schematic of a method for spatially coupling replicated polar encoders according to some embodiments.

FIG. 13 shows an exemplar schematic of spatial coupling, where a two-stage polar encoder 1300 is replicated 1301 by Q folds as in usual lifting, but the permutation is partially applied across a subset of encoders. For example, the first polarization stage is coupled for the first two encoders 1302, while the last encoder remains non-permuted 1303. For the second polarization stage, the last two (not all Q) encoders are coupled 1304. In this manner, spatially coupled polar encoders can be realized.

Figure 14:
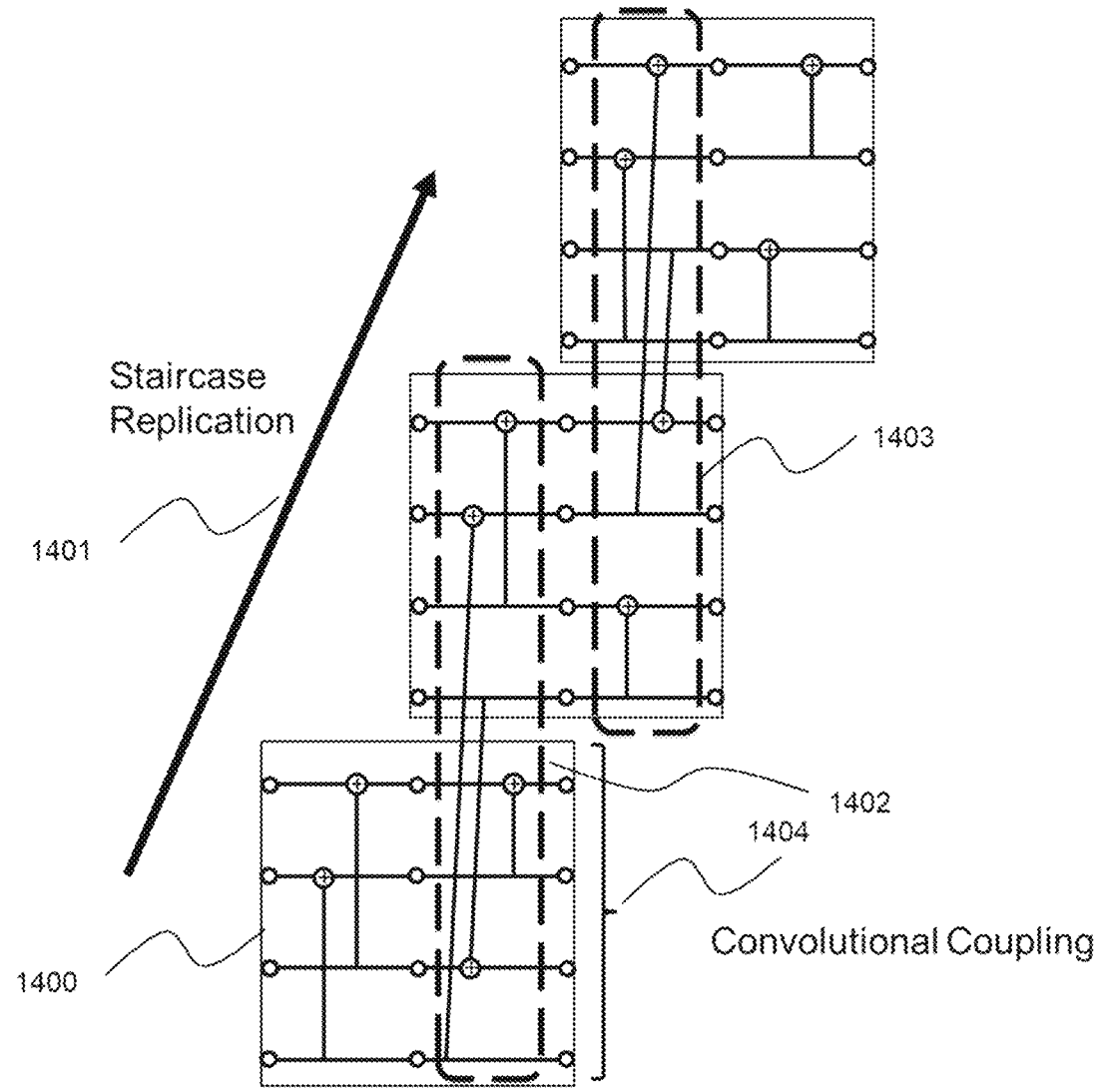
FIG. 14 is an exemplar schematic of a method for convolutionally coupling replicated polar encoders according to some embodiments.

FIG. 14 shows another exemplar schematic of spatial coupling, which employs a convolutional lifting operation. A two-stage polar encoder 1400 is replicated 1401. This embodiment aligns the replicated polar encoders in a staircase manner. The second polarization stage at the first encoder is coupled with the first polarization stage at the second encoder 1402. In a similar way, the second polarization stage a the second encoder is coupled with the first polarization stage at the third encoder 1403. In this manner, the encoding and decoding can be done convolutionally. Specifically, an encoded codeword at the first encoder 1404 depends on the first and second encoding bits, while it is independent from the other encoders. This windowed memory feature enables a windowed encoding and decoding. It can then reduce the decoding latency as infinitely large number of encoders can be convolutionally coupled while the encoding and decoding can be done without waiting to receive the whole codeword. Other embodiment examples of spatially-coupled protograph polar coding include, but not limited to, braided structure, cubic convolution, tail-biting, and torus tail-biting. Specifically, the tail-biting uses a cyclic padding of the input data, duplicating the end of sequence into the head of the sequence so that the spatial coupling can encode without caring the memory effect at the initial convolution.

In one embodiment, protograph-based polar coding structure is constructed, where parallel polar codes are mixed between polarizers at different locations by shift operations. Another embodiment uses an ever increasing staircase structure to provide rateless capability, where only parity bits are continuously generated by replicated polar codes until the receiver acknowledges the decoding completion. Therefore, the irregular protograph polar coding structure and application of various component polar codes with different coding parameters produces varying degrees of freedom (and hence varying degrees of error correction performance) across the overall codeword of the coupled codes. This overall codeword is serialized for transmission over the communications channel, and this serialization may be permuted via a permutation before transmission over a non-uniform channel to potentially obtain error correcting performance gains.

Protograph Polar-Type LDGM Codes

The method and system of the present invention provides a way to improve various other linear codes by introducing a concept of protograph for lifting the generator matrix of the base code. Some embodiments of invention further extend the application of protograph-based design method for GM-based linear codes to realize generalized LDGM codes, which we call polar-type LDGM codes.

For example, some embodiments improve a conventional cycle code, which uses a generator polynomial to encode a data bit. The well-known Hamming codes and BCH codes are such a family of cyclic codes. Specifically, the Hamming code uses a generator polynomial of $1+D+D^3$. The GM of the Hamming code (systematic) for K=4 information bits and N=7 codeword bits is expressed in a matrix size G of K×N as follows:

$$G_s = \begin{bmatrix} 1 & 0 & 0 & 0 & 1 & 1 & 0 \\ 0 & 1 & 0 & 0 & 1 & 0 & 1 \\ 0 & 0 & 1 & 0 & 0 & 1 & 1 \\ 0 & 0 & 0 & 1 & 1 & 1 & 1 \end{bmatrix}.$$

In some embodiments, a similar protograph lifting operation is applied to the GM of the above base code with permutation matrices to increase the codeword by Q folds as follows:

$$G_{proto} = \begin{bmatrix} P_{11} & O & O & O & P_{15} & P_{16} & O \\ O & P_{22} & O & O & P_{25} & O & P_{27} \\ O & O & P_{33} & O & O & P_{36} & P_{37} \\ O & O & O & P_{44} & P_{45} & P_{46} & P_{47} \end{bmatrix}.$$

Figure 15A:
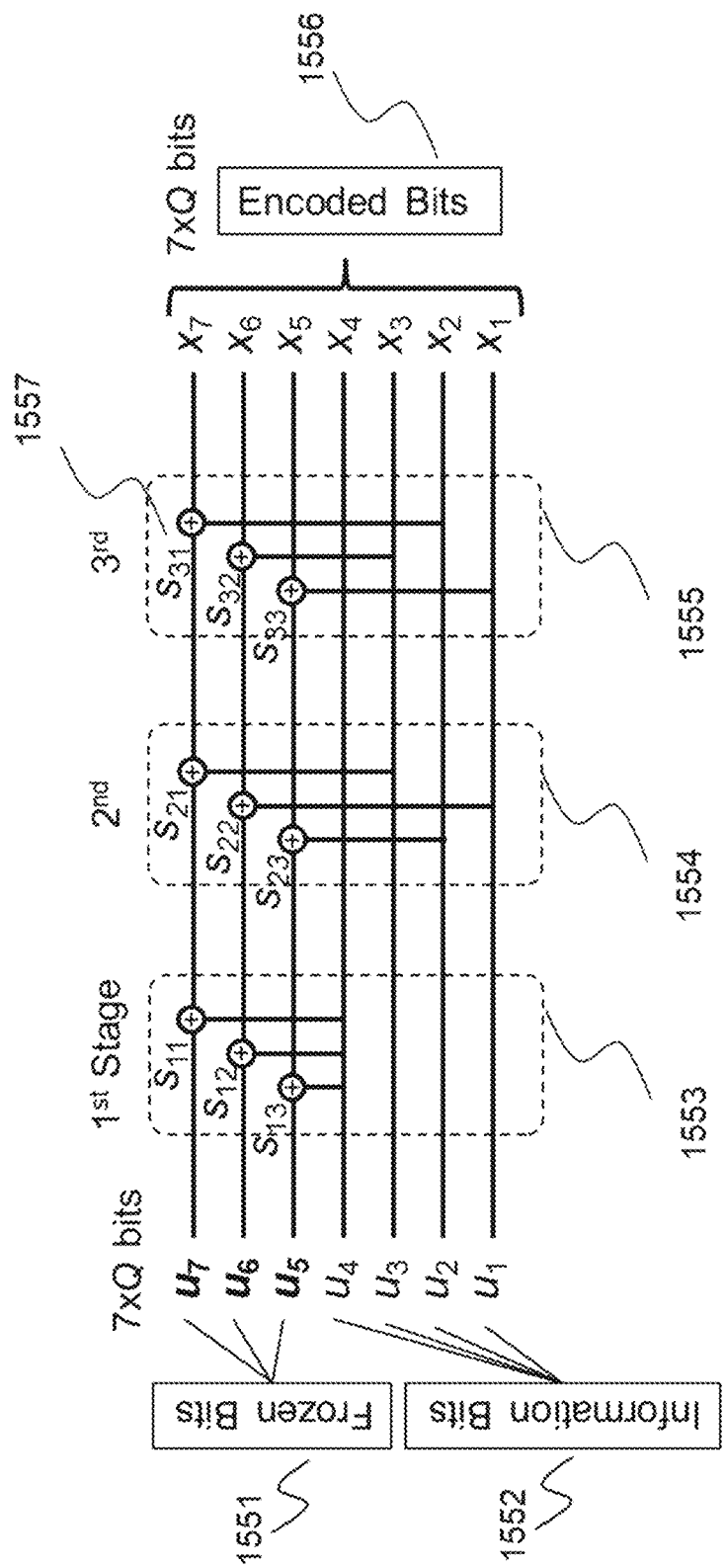
FIGS. 15A and 15B are exemplar schematics of a method for constructing a polar-type LDGM code generalized from a Hamming code, according to some embodiments.

This Q-fold lifting can decrease the density of the GM for any arbitrary linear codes, and they are called generalized LDGM codes. When the permutation matrices are circulant, they are also called QC LDGM codes. FIG. 15A shows an exemplar QC LDGM code based on the protograph of the above systematic Hamming code, where diagonal permutations are chosen to be identity matrices, i.e., $P_{ii}=I(0)$. The off-diagonal permutations are decomposed into 3-stage polarization units as follows:

$$G_{proto} = I(0) + \begin{bmatrix} O & O & O \\ I(0) & O & O & O \\ & O & O & O \\ & I(s_{13}) & I(s_{12}) & I(s_{11}) \end{bmatrix} + \begin{bmatrix} O & I(s_{22}) & O \\ I(0) & I(s_{23}) & O & O \\ & O & O & I(s_{21}) \\ & O & O & O \end{bmatrix} +$$

$$\begin{bmatrix} I(s_{33}) & O & O \\ I(0) & O & O & I(s_{31}) \\ & O & I(s_{32}) & O \\ & O & O & O \end{bmatrix}.$$

The top 3 bits planes are frozen to be '0' 1551, and the bottom 4 bits planes are allocated for the information bits 1552. Note that this figure uses a reversed-order bits plane from $u_7$ to $u_1$ for convenience. The size of the data array u is increased to N·Q with a lifting factor Q greater than 1. The first polarization stage 1553 corresponds to the last row of the base generator matrix $G_s$. After passing the second stage 1554 and the third stage 1555, an encoded array 1556 is generated. Each proto-polarization unit uses a permutation rule with a circulant shift value $s_{ij}$ 1557. This protograph has a cycle-2, while it can be eliminated by a shift value optimization. Also note that the protograph in FIG. 15A is not unique from the base generator matrix as different order of polarization stages can be constructed. Accordingly, a connectivity rule to construct the protograph is used to specify the code.

For some embodiments, the protograph LDGM codes are well-structured in a multi-stage polarization. It is known that the GM of the conventional Hamming code is also expressed for the non-systematic case as follows:

$$G_{ns} = \begin{bmatrix} 1 & 1 & 0 & 1 & 0 & 0 & 0 \\ 0 & 1 & 1 & 0 & 1 & 0 & 0 \\ 0 & 0 & 1 & 1 & 0 & 1 & 0 \\ 0 & 0 & 0 & 1 & 1 & 0 & 1 \end{bmatrix}.$$

Figure 15B:
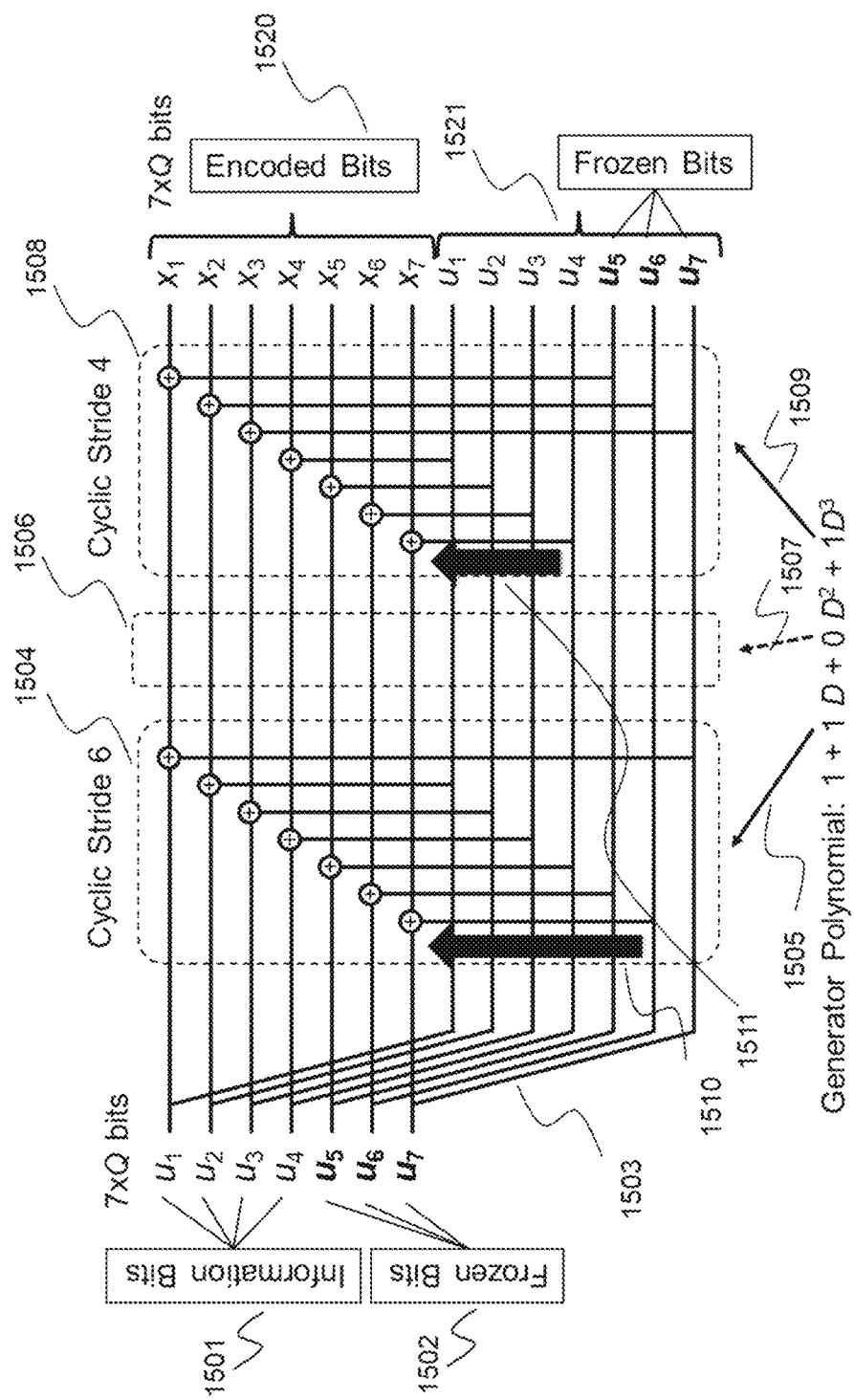

This GM can be further extended to an N×N matrix by introducing three zero frozen bits like polar codes for encoding $u=(u_1, u_2, u_3, u_4, 0, 0, 0)$ as follows:

$$G_{ex} = \begin{bmatrix} 1 & 1 & 0 & 1 & 0 & 0 & 0 \\ 0 & 1 & 1 & 0 & 1 & 0 & 0 \\ 0 & 0 & 1 & 1 & 0 & 1 & 0 \\ 0 & 0 & 0 & 1 & 1 & 0 & 1 \\ 1 & 0 & 0 & 0 & 1 & 1 & 0 \\ 0 & 1 & 0 & 0 & 0 & 1 & 1 \end{bmatrix},$$

where the coefficients [1,1,0,1] of the generator polynomial $1+D+D^3$ are cyclically shifted at each row. The GM of any cyclic codes can be extended in a similar manner. The method of the invention provides a way to represent the GM in a polar-type structure by decomposing the GM into multiple polarization stages. Specifically, the extended GM is further decomposed into multiple sub-GM composed of circulant matrices as follows:

$$G_{ex}=I(0)+I(1)+I(3),$$

where I(s) is a circulant matrix of an appropriate size (N×N). Accordingly, this GM decomposition procedure provides a multi-stage connection rule to construct a polar-type protograph. FIG. 15B shows an exemplar schematic of such a polar-type LDGM construction based on the Hamming codes. K=4 data bits 1501 and 3 frozen bits 1502 are fed into the polar-type LDGM encoder as an input message u= $(u_1, \ldots, u_N)$. Here, frozen bits are all zeros. The input message is first duplicated 1503 to have doubled bit planes of size 2N. Depending on the generator polynomial, the encoder uses multi-stage polarizations. A first stage 1504 is used according to the first-order monomial coefficient 1505. As the second order monomial coefficient is '0' 1507, a next polarization stage is skipped 1506. Another polarization stage 1508 is constructed for the third-order monomial coefficient 1509. Accordingly, the j-th polarization stage corresponds to the j-th coeffect of generator polynomial. Each stage has different stride of the polarization unit; specifically, the j-th polarization stage has a cyclic stride of N−j. In this example, the first stage has a cyclic stride 1510 of 6, and the third stage has a cyclic stride 1511 of 4. The top N bit planes are used a codeword 1520, while the last N bit planes 1521 are a copy of the encoding bits u. In this manner, the encoding and decoding of the conventional cyclic codes can be carried out in a similar way to the polar codes.

As the polar-type construction of cyclic codes described in FIG. 15B has a number of short cycles, the introduction of the protograph can resolve the issue by increasing the code girth so that message passing can work properly. The method and system of the present invention disclose such a way for the polar-type codes, by replacing '1' in the decomposed and extended GM with permutation matrices. Specifically, the polarization units in FIG. 15 are lifted as a proto-polarization in a same manner described in FIG. 5. By using a higher lifting factor Q to replicate cyclic codes, the short cycles can be eliminated as described in FIG. 7. We call it as a polar-type LDGM code, which is generalized from a conventional linear code including the polar code. The similar decomposition process to construct a polar-type LDGM code is possible for any arbitrary linear codes including binary and non-binary codes. For example, a conventional cyclic codes, specified by a generator polynomial $$\sum_{i=0}^{d} g_i D^i$$

with $g_i$ being the i-th coefficient, can have an extended and decomposed GM as $$\sum_{i=0}^{d} g_i I(i).$$

With a Q-fold lifting operation over each off-diagonal term with permutation matrices, a polar-type LDGM code is constructed in a similar manner described in FIG. 15. For some embodiments, the polar-type LDGM codes are further designed with annealed frozen locations as well as interleaver, irregular pruning, and cycle maximization as done for the protograph polar codes. Accordingly, the method and system of the present invention provide a way to construct polar-type LDGM codes using a lifting operation of the GM of any base code.

Parallel Processing

The above-described embodiments in the present invention have a number of great features, including but not limited to Encoding and decoding share the same graphical structure specified with the GM without computing the PCM;

Encoding and decoding can be fully parallelized;

Short cycles in protograph can be eliminated efficiently;

Code design can be simplified as a shorter base code is coupled;

Belief-propagation decoding can work properly with high-girth design;

Computational complexity for protograph decoding is maintained as low as that of the original short codes;

State-of-the-art performance is achievable;

Any arbitrary linear codes can be used as a base protograph to convert into polar-type LDGM codes having multiple polarization stages;

SC decoding and BP decoding can be combined with incremental frozen bits when partial CRC codes are embedded across replicated encoders;

Irregular coding is straightforward to adopt with pruning proto-polarization;

Nonbinary coding is easy to apply;

Spatial coupling can be used to adjust the decoding parallelism and decoding latency; and Well-established techniques used for protograph LDPC codes can be used for protograph LDGM codes, such as P-EXIT and girth maximization methods.

Most of the above benefits were not available for the conventional polar codes and for the conventional protograph LDPC codes. In particular, the capability of highly-parallel encoding and decoding is a great advantage of the present invention for practical applications which require high-throughput processing, such as fiber-optic communications requiring a data rate beyond terabits per second.

Figures 16A, 16B:
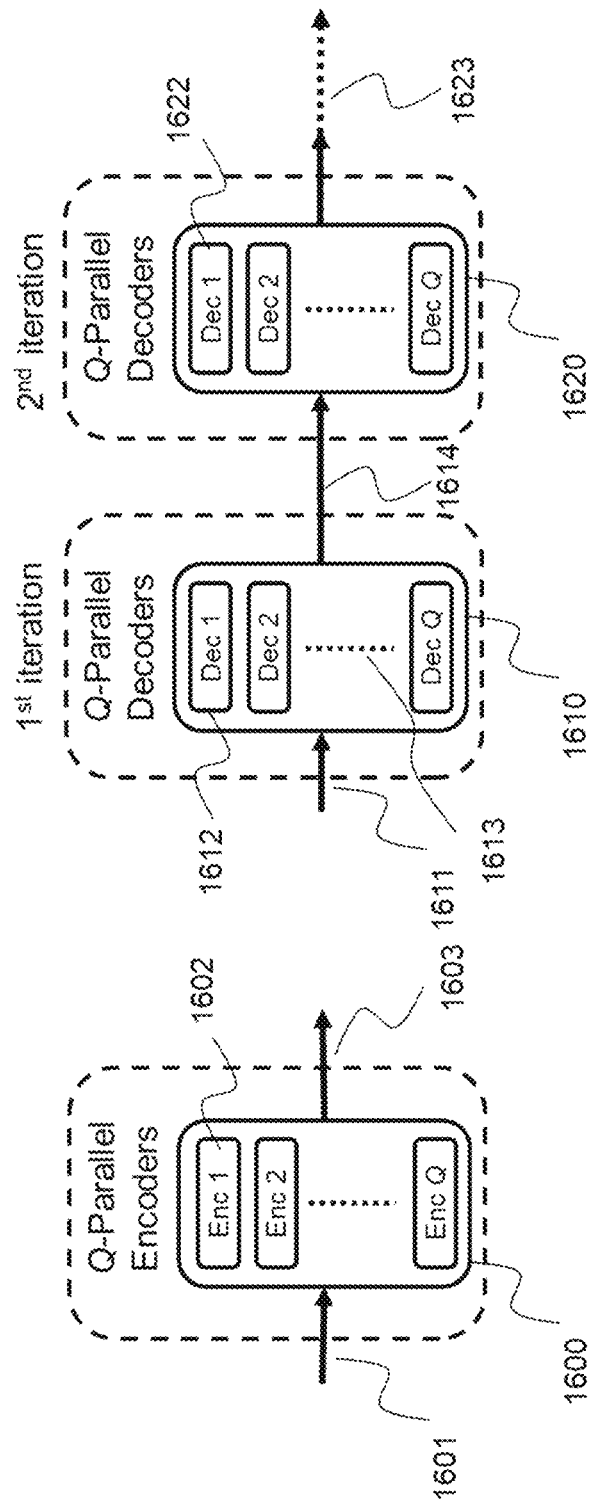
FIGS. 16A and 16B show examples of parallel encoding and decoding with for high-throughput systems according to some embodiments.

FIG. 16A shows an example of highly parallel and pipelined implementation of a polar-type LDGM encoder 1600 for high-throughput transmission according to the invention. For example, a QC polar code operates Q=256 polar encoders 1602 of n=8 stages in parallel, and then N=65536 bits are generated as an encoded codeword 1603 given a source data 1601 of size K×Q. Note that the lifting permutation to couple the multiple encoders does not involve any computational complexity but data exchange among the encoders at every stage. As each base encoder 1602 has a shallow stage of n=8, the encoding can be accomplished with 8 clocks to encode through 8 stages. In this manner, the encoding is highly parallelized for all N bits to generate a large codeword at a small number of 8-stage pipelining. Accordingly, the highly parallel implementation of the polar-type LDGM encoder described above can improve the effectiveness of the encoding process of the source data and enhance the performance of the processor (hardware processor) in a transmitter, increasing the throughput of the transmitter.

FIG. 16B illustrates an example of highly parallel and pipelined implementation of a polar-type LDGM decoder for high-throughput processing according to embodiments. For example, the polar-type LDGM decoder 1610 is fully parallelized for Q=256 short decoders 1612 regardless of message passing schedules (including SCL decoding or BP decoding). Each decoder takes soft-input belief message 1611 to generate the soft-output message 1614 with a message passing across multiple stages via permutation interconnects 1613 to exchange data across parallel decoders. Some embodiments further use pipelining the same decoding process with additional decoders 1620 to increase the decoding throughput rather than iterating message passing at the same decoders 1610. For example, the first round of decoding iteration is performed at the first set of parallel decoders 1610, and the second round of decoding iteration is performed at a second set of Q-parallel decoders 1620. Further iterations are un-rolled to pipelined decoders over serialized interconnects 1623. Note that each decoder 1612, 1622 can be processed in parallel as belief messages are just exchanged among different decoders without extra complexity. The capability of parallel and pipeline implementation is a great benefit of polar-type LDGM codes for high-throughput transceivers. Accordingly, the implementation of the polar-type LDGM decoder described above can improve the effectiveness of the decoding process of codewords and enhance the performance of the processor (hardware processor) in a receiver, increasing the throughput of the receiver.

Other Relevant Features

Figure 17A:
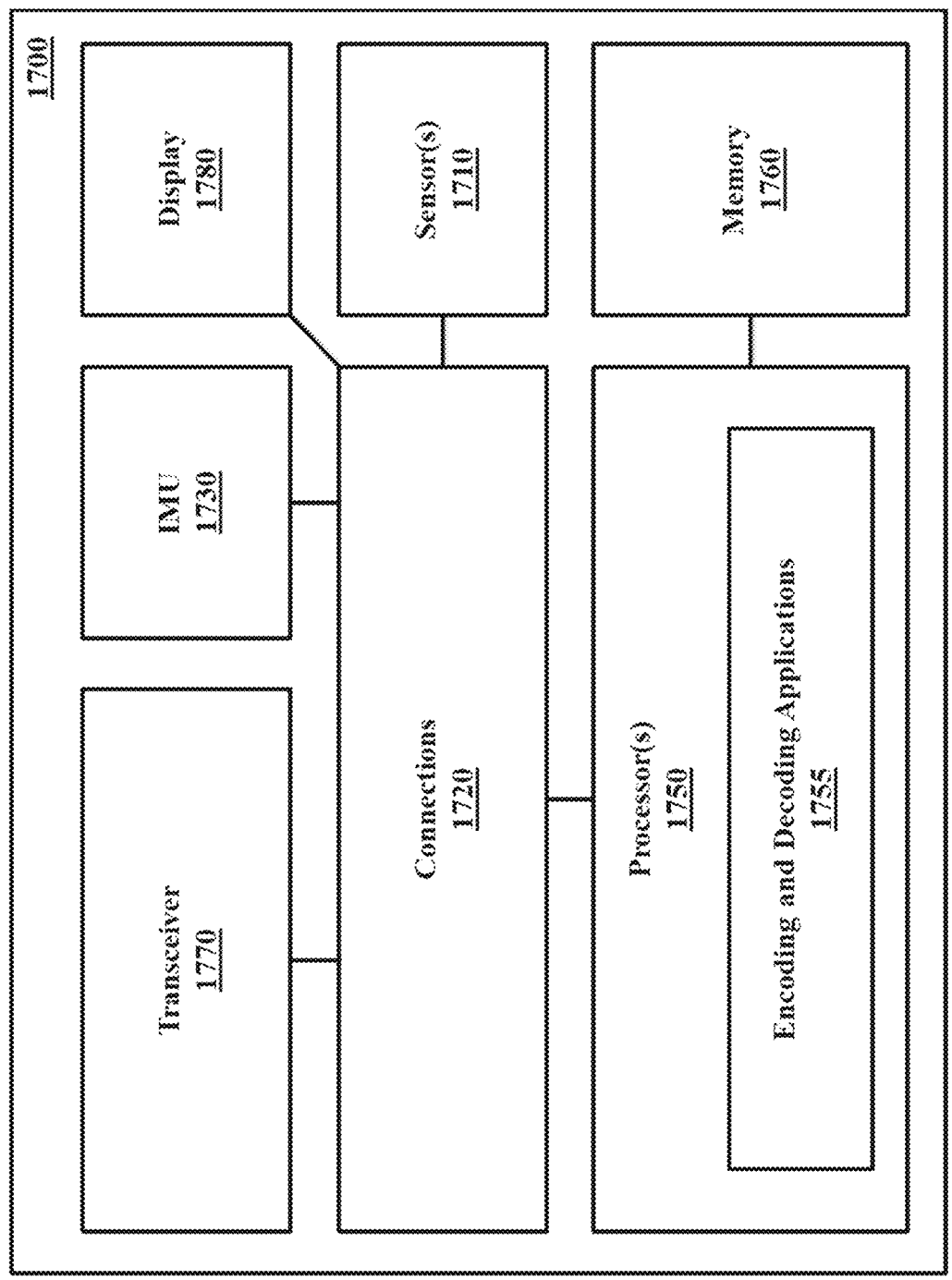
FIG. 17A is a block diagram of a system suitable for implementing different components of the receiver for performing the decoding according to some embodiments and/or the transmitter for encoding a data message according to some embodiments.

FIG. 17A shows an exemplar block diagram of a system suitable for implementing different components of the receiver for performing the soft decoding according to some embodiments and/or the transmitter for encoding the codeword according to some embodiments. The system 1700 can include one or combination of a sensor 1710, an inertial measurement unit (IMU) 1730, a processor 1750, a memory 1760, a transceiver 1770, and a display/screen 1780, which can be operatively coupled to other components through connections 1720. The connections 1720 can comprise buses, lines, fibers, links or combination thereof.

The transceiver 1770 can, for example, include a transmitter enabled to transmit one or more signals over one or more types of communication networks and a receiver to receive one or more signals transmitted over the one or more types of communication networks. The transceiver 1770 can permit communications with wired or wireless networks based on a variety of technologies such as, but not limited to, femtocells, Wi-Fi networks or wireless local area networks (WLANs), which may be based on the IEEE 802.11 family of standards, wireless personal area networks (WPANS) such Bluetooth, near field communication (NFC), networks based on the IEEE 802.11 family of standards, and/or wireless wide area networks (WWANs) such as LTE, WiMAX, etc. The system 400 can also include one or more ports for communicating over wired networks such as fiber-optic communications.

In some embodiments, the processor 1750 can also receive input from IMU 1730. In other embodiments, the IMU 1730 can comprise 3-axis accelerometers, 3-axis gyroscopes, and/or magnetometers. The IMU 1730 can provide velocity, orientation, and/or other position related information to the processor 1750. In some embodiments, the IMU 1730 can output measured information in synchronization with the capture of each image frame by the sensor 1710. In some embodiments, the output of the IMU 1730 is used in part by the processor 1750 to fuse the sensor measurements and/or to further process the fused measurements.

The system 1700 can also include a screen or display 1780 rendering images, such as color and/or depth images. In some embodiments, the display 1780 can be used to display live images captured by the sensor 1710, fused images, augmented reality images, graphical user interfaces (GUIs), and other program outputs. In some embodiments, the display 1780 can include and/or be housed with a touch-screen to permit users to input data via some combination of virtual keyboards, icons, menus, or other GUIs, user gestures and/or input devices such as styli and other writing implements. In some embodiments, the display 1780 can be implemented using a liquid crystal display or a light emitting diode (LED) display, such as an organic LED display. In other embodiments, the display 1780 can be a wearable display.

Exemplary system 1700 can also be modified in various ways in a manner consistent with the disclosure, such as, by adding, combining, or omitting one or more of the functional blocks shown. For example, in some configurations, the system 1700 does not include the IMU 1730 or the sensors 1770. In some embodiments, portions of the system 1700 take the form of one or more chipsets, and/or the like.

The processor 1750 can be implemented using a combination of hardware, firmware, and software. The processor 1750 can represent one or more circuits configurable to perform at least a portion of a computing procedure or process related to sensor fusion and/or methods for further processing the fused measurements. The processor 1750 retrieves instructions and/or data from memory 1760. The processor 1750 can be implemented using one or more application specific integrated circuits (ASICs), central processing units (CPUs), graphical processing units (GPUs), digital signal processors (DSPs), DSP devices, programmable logic devices (PLDs), field programmable gate arrays (FPGAs), controllers, micro-controllers, microprocessors, embedded processor cores, electronic devices, other electronic units designed to perform the functions described herein, or a combination thereof.

The memory 1760 can be implemented within the processor 1750 and/or external to the processor 1750. As used herein the term "memory" refers to any type of long term, short term, volatile, nonvolatile, or other memory and is not to be limited to any particular type of memory or number of memories, or type of physical media upon which memory is stored. In some embodiments, the memory 1760 holds program codes that facilitate the soft decoding and polar encoding.

In some embodiments, additionally or alternatively to the soft decoding, the processor 1750 can perform one or combination of the soft-decoding applications 1755. For example, the soft output of the decoding can be used for decoding concatenated ECCs, which are formed from multiple component ECCs that are combined into a higher performance code. Another example is a system employing iterative equalization and decoding, where soft-decision output from decoder is fed back to demodulator to refine the decoder input iteratively. Yet another example is acting on the decoded output, e.g., showing the output on the display 1780, storing the output in the memory 1760, transmitting the output using the transceiver 1770, and/or performing the actions based on the output and measurements of the sensor 1710.

Figure 17B:
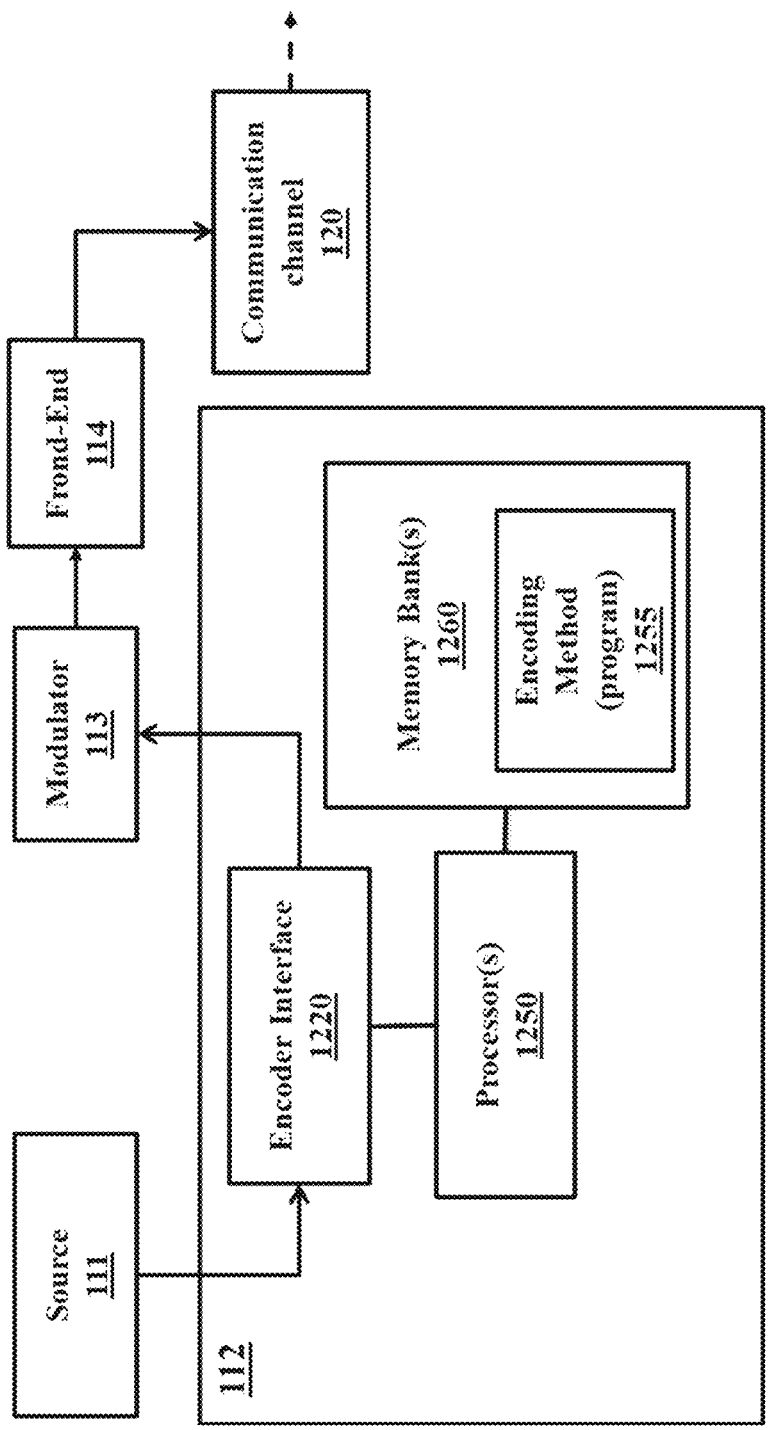
FIG. 17B is a schematic illustrating a block diagram of an encoder circuit for generating an encoded digital data from an input digital data, according to some embodiments of the present invention.

Further, another embodiment of the present invention can provide an encoder circuit for generating an encoded digital data from an input digital data. FIG. 17B is a schematic illustrating a block diagram of an encoder circuit 112 for generating an encoded digital data from an input digital data. The encoder circuit 112 may be referred to as an encoder 112. The encoder circuit 112 is configured to generate an encoded digital data from a source bit stream as an input digital data. The encoder circuit 112 may include an encoder interface 1120 configured to receive the source bit stream 111, at least one memory bank 1260 configured to store a computer-executable encoding method 1255 (program/computer-executable instructions/or equivalent circuit), and one or more computing processors 1250 configured to generate a codeword as an encoded digital data from the input digital data by performing steps of the computer-executable encoding method. In this case, the computer-executable encoding method 1255 is configured to cause the processor 1250 to perform steps that include defining a protograph structure of a polar-type low-density generator matrix (LDGM) code based on a code specification, where the code specification comprises at least two stages of proto-polarizations, at least one rule of frozen bits allocation, at least one rule of protograph permutation, and at least one rule of a message passing. The steps of the method computer-executable encoding method 1255 further include initializing a data array with the source bit stream and a set of frozen bits according to the at least one rule of frozen bits allocation, propagating the data array according to the at least one rule of the message passing over entire stages of the proto-polarizations. Further, the steps include steps of (a) feeding the data array into the at least two stages of the proto-polarizations sequentially from one stage to another stage, wherein each stage of the proto-polarizations comprises at least one proto-polarization unit, (b) permuting the data array at each of the proto-polarization unit according to the at least one rule of the protograph permutation, and (c) modifying the data array at each of the proto-polarization unit according to the at least one rule of the message passing, generating the codeword based on a specified order as the encoded digital data by arranging the modified data array. In some embodiments, the generated digital data is modulated by the modulator 113 and transmitted from the communication channel 120 via the front-end circuit 114.

Figure 17C:
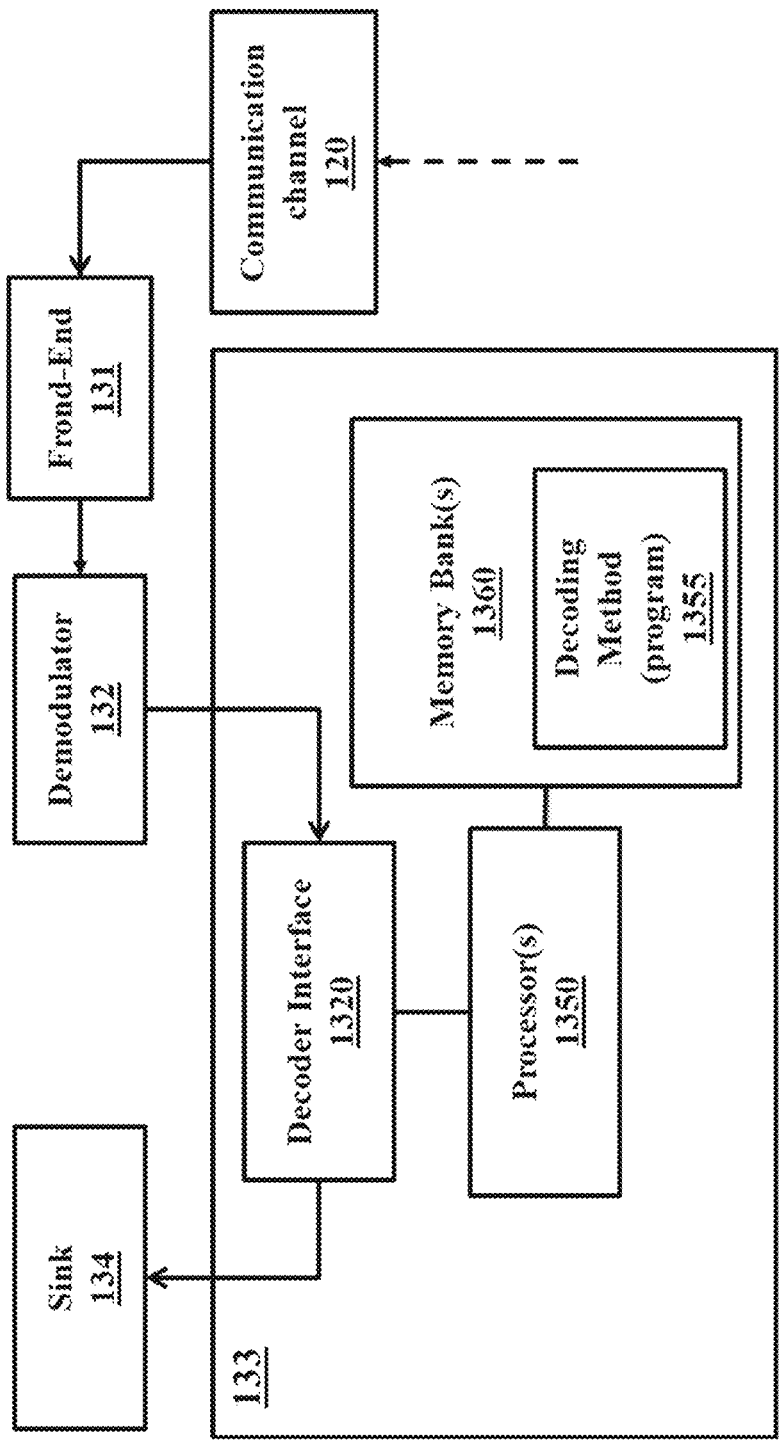
FIG. 17C is a schematic illustrating a block diagram of a decoder circuit for decoding an encoded digital data, according to some embodiments of the present invention.

FIG. 17C is a schematic illustrating a block diagram of a decoder circuit (or simply, decoder) 133 for decoding an encoded digital data, according to some embodiments of the present invention. The decoder circuit 133 is configured to generate decoded digital data from an encoded digital data represented by an encoded (noisy) codeword received from the communication channel 120.

The decoder circuit 133 includes a decoder interface 1320 configured to receive the encoded codeword as an input data from a demodulator 132 that demodulates a noisy version of a modulated encoded digital data, at least one memory bank 1360 configured to store a computer-executable decoding method (program/computer-executable instructions/or equivalent circuit) 1355 and one or more computing processors 1350. In this case, the computer-executable decoding method (program) 1355 causes the one or more computing processors 1350 to generate the decoded digital data from the encoded codeword from the decoder interface 1320 by performing steps of the computer-executable decoding method. According to the computer-executable decoding method, the one or more computing processors 1350 perform the steps that include defining a protograph structure of a polar-type low-density generator matrix (LDGM) code based on a code specification. The code specification comprises at least two stages of proto-polarizations, at least one rule of frozen bits allocation, at least one rule of protograph permutation, and at least one rule of a message passing, initializing an array of leftward and rightward messages associated with each edge in the protograph structure. In this case, the rightward messages feeding into a first stage of the proto-polarizations are fixed based on the at least one rule of the frozen bits allocation and the leftward messages feeding into a last stage of the proto-polarizations are fixed based on the encoded codeword in a specified order, propagating the leftward and rightward messages according to the at least one rule of the message passing across the at least two stages of the proto-polarizations comprising at least one variable node and at least one check node, wherein the leftward and rightward messages are updated by an iterative method. The iterative method comprises steps of (a) selecting a parallelizable set of variable and check nodes according to the at least one rule of message passing, (b) feeding a set of the leftward and rightward messages as incoming messages into the selected variable and check nodes according to the at least one rule of the protograph permutation, (c) calculating a set of outgoing messages based on the incoming messages at the selected variable and check nodes, according to the at least one rule of the message passing, (d) replacing the set of the leftward and rightward messages with the set of outgoing messages at the selected variable and check nodes, and (e) repeating the steps (a)-(d) for a specified number of times according to the at least one rule of the message passing. Further, the one or more processors 1350 generate an output message as a decoded digital data by selecting a set of the leftward messages in a specified order according to the computer-executable decoding method 1355.

All the above-described embodiments of the present invention can be implemented in any of numerous ways. For example, the embodiments may be implemented using hardware, firmware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

What is claimed is:

1. A computer-implemented method for encoding digital data, performed by one or more computing processors, comprising:
   defining a protograph structure of a polar-type low-density generator matrix (LDGM) code based on a code specification, wherein the code specification comprises at least two stages of proto-polarizations, at least one rule of frozen bits allocation, at least one rule of a protograph permutation, and at least one rule of a message passing;
   accessing a source bit stream as an input digital data;
   initializing a data array with the source bit stream and a set of frozen bits according to the rule of frozen bits allocation;
   propagating the data array according to the rule of the message passing over the all stages of the proto-polarizations, further comprising the steps of:
   (a) feeding the data array into the proto-polarization stages sequentially from one stage to another stage, wherein the proto-polarization stage comprises at least one proto-polarization unit;
   (b) permuting the data array at each of the proto-polarization unit according to the rule of the protograph permutation; and
   (c) modifying the data array at each of the proto-polarization unit according to the rule of the message passing;
   arranging the modified data array into a codeword in a specified order; and
   providing the codeword as an encoded digital data of the input digital data.

2. The method according to claim 1, wherein the proto-polarization unit comprises
   at least one proto-check node; and
   at least one proto-variable node;
   wherein at least one pair of the proto-check node and the proto-variable node is mutually connected to pass a multi-bit message according to the rule of the protograph permutation.

3. The method according to claim 1, wherein the modifying the data array based on the rule of the message passing comprises applying a set of algebraic arithmetic operations at each of the proto-polarization unit, wherein the algebraic arithmetic operation is based on a finite ring, a finite Galois field, a look-up table, or a combination thereof.

4. The method according to claim 1, wherein the code specification defining the protograph structure of the polar-type LDGM code is based on a lifting operation for a generator matrix of a base code, wherein the lifting operation applies a replication and a permutation of the base code by replacing each element of the generator matrix with a permutation matrix, and wherein the generator matrix is decomposed into at least two sub-generator matrices to define multiple proto-polarization stages.

5. The method according to claim 1, wherein the rule of the protograph permutation comprises a set of parameters defining a circulant permutation with a shift value, a reversed circulant permutation with a shift value, a polynomial permutation with a set of polynomial coefficients, a random weight-one permutation matrix, a random weight-two permutation matrix, a random weight-three permutation matrix, or a combination thereof, associated with each of the proto-polarization.

6. The method according to claim 1, wherein the rule of the frozen bits allocation and the rule of the protograph permutation are determined by an iterative method, comprising the steps of:
   (a) initializing frozen bits locations, a skeleton base matrix, and a set of permutation parameters;
   (b) pruning a set of the proto-polarization units depending on the skeleton base matrix;
   (c) calculating an upper bound of error rate based on a protograph extrinsic information transfer (P-EXIT) method, wherein the P-EXIT method further comprises the steps of:
      (b1) initializing a set of extrinsic information associated with each edge in the protograph, depending on the frozen bits locations and the permutation parameters given a set of channel mutual information;
      (b2) updating the extrinsic information at a proto-polarization unit based on a set of P-EXIT rules defining an evolution of the extrinsic information;
      (b3) repeating the updating step (b2) for a set of the proto-polarization units in a specified order depending on a decoding schedule; and
      (b4) calculating the upper bound of error rate based on the updated extrinsic information and the frozen bits locations;
   (c) calculating a score at each of proto-polarization unit, wherein the score is calculated by the steps of:
      (c1) finding a cycle departing from a proto-polarization unit and returning the same proto-polarization unit through the protograph;
      (c2) determining a cycle length depending on the frozen bits locations, the skeleton base matrix, and the permutation parameters;
      (c3) adding a weighted value depending on the cycle length into all the scores associated with the proto-polarization units participated in the cycle;
      (c4) repeating the above steps (c1) through (c3) for a specified set of paths in the protograph;
   (d) modifying the frozen bits locations, the skeleton base matrix, and the permutation parameters based on the upper bounds and the scores; and
   (e) repeating the above steps (b) through (d) until a specified condition meets for the upper bounds and the scores.

7. The method according to claim 1, wherein the initializing the data array based on the rule of the frozen bits allocation further comprises the steps of:
   (a) forming a bit sequence selectively chosen from a part of the data array;
   (b) calculating a parity sequence from the bit sequence based on a linear code, comprising a cyclic redundancy check (CRC) code, a Bose-Chaudhuri-Hocquenghem (BCH) code, a cyclic code, a quasi-cyclic code, a convolutional code, or a combination thereof;
   (c) embedding the parity sequence into a selected part of the data array;
   (d) repeating the above steps (a) through (c) to embed a plurality of the parity bits into the data array for a specified number of times.

8. The method according to claim 4, wherein the base code is a polar code, comprising at least two polarization stages based on at least two Kronecker power of a kernel matrix, wherein the kernel matrix is a full-rank matrix of an order size greater than one, and wherein the kernel matrix is based on a finite Galois field, a finite ring, or a combination thereof.

9. The method according to claim 1, wherein the protograph structure defined by the code specification is based on a spatial coupling of the proto-polarization units, wherein the spatial coupling forms the protograph structure in a homogeneous or inhomogeneous manner to construct a rectangular, a cubic, a braided, a staircase, or a torus shape of the protograph with or without a tail biting.

10. A computer-implemented method for decoding a noisy codeword, performed by one or more computing processors, comprising:
defining a protograph structure of a polar-type low-density generator matrix (LDGM) code based on a code specification, wherein the code specification comprises at least two stages of proto-polarizations, at least one rule of frozen bits allocation, at least one rule of a protograph permutation, and at least one rule of a message passing;
accessing an input data which represents a belief message for a noisy codeword;
initializing an array of leftward and rightward messages associated with each edge in the protograph, wherein the rightward messages feeding into a first stage of the proto-polarizations are fixed based on the rule of the frozen bits allocation and the leftward messages feeding into a last stage of the proto-polarizations are fixed based on the input data in a specified order;
propagating the leftward and rightward messages according to the rule of the message passing across multiple stages of the proto-polarizations comprising at least one variable node and at least one check node, wherein the leftward and rightward messages are updated by an iterative method comprising the steps of:
(a) selecting a parallelizable set of variable and check nodes according to the rule of message passing;
(b) feeding a set of the leftward and rightward messages as incoming messages into the chosen variable and check nodes according to the rule of the protograph permutation;
(c) calculating a set of outgoing messages based on the incoming messages at the chosen variable and check nodes, according to the rule of the message passing;
(d) replacing a set of the leftward and rightward messages with the outgoing messages at the chosen variable and check nodes; and
(e) repeating the above steps (a) through (d) for a specified number of times according to the rule of the message passing;
selecting a set of the leftward messages as an output message in a specified order; and
providing the output message as a decoded digital data.

11. The method according to claim 10, wherein the proto-polarization unit comprises
at least one proto-check node; and
at least one proto-variable node;
wherein at least one pair of the proto-check node and the proto-variable node is mutually connected to pass a multi-bit message according to the rule of the protograph permutation.

12. The method according to claim 10, wherein the calculating the outgoing message at a variable node and a check node is based on the rules of the message passing, a rule defining a variable node decoder and a rule defining a check node decoder based on a sum-product algorithm, a delta-min algorithm, a min-sum algorithm, an offset min-sum algorithm, a normalized min-sum algorithm, a modified min-sum algorithm, an attenuated min-sum, an extended min-sum, a quantized look-up table, or a variant thereof.

13. The method according to claim 10, wherein the code specification defining the protograph structure of the polar-type LDGM code is based on a lifting operation for a generator matrix of a base code, wherein the lifting operation applies a replication and a permutation of the base code by replacing each element of the generator matrix with a permutation matrix, and wherein the generator matrix is decomposed into at least two sub-generator matrices to define multiple proto-polarization stages.

14. The method according to claim 10, wherein the rule of the protograph permutation comprises a set of parameters defining a circulant permutation with a shift value, a reversed circulant permutation with a shift value, a polynomial permutation with a set of polynomial coefficients, a random weight-one permutation matrix, a random weight-two permutation matrix, a random weight-three permutation matrix, or a combination thereof, associated with each of the proto-polarization.

15. The method according to claim 14, wherein the propagating the leftward and rightward messages further comprises the steps of:
(a) generating a finite list of hard-decision codewords based on the leftward messages coining from a first stage of proto-polarizations in a deterministic or stochastic manner;
(b) forming a bit sequence selectively chosen from a part of the hard-decision codewords list;
(c) calculating a reliability of the bit sequence based on a linear code, comprising a cyclic redundancy check (CRC) code, a Bose-Chaudhuri-Hocquenghem (BCH) code, a cyclic code, a quasi-cyclic code, a convolutional n code, or a combination thereof;
(d) repeating the above steps (b) and (c) for a specified number of times;
(e) determining a most likely sequence of the hard-decision codeword based on the calculated reliabilities; and
(f) updating a part of the rightward messages feeding into the first stage of the proto-polarizations based on the most likely sequence of the hard-decision codeword depending on the reliability.

16. The method according to claim 13, wherein the base code is a polar code, comprising at least two polarization stages based on at least two Kronecker power of a kernel matrix, wherein the kernel matrix is a full-rank matrix of an order size greater than one, and wherein the kernel matrix is based on a finite Galois field, a finite ring, or a combination thereof.

17. The method according to claim 14, wherein the protograph structure defined by the code specification is based on a spatial coupling of the proto-polarization units, wherein the spatial coupling forms the protograph structure in a homogeneous or inhomogeneous manner to construct a rectangular, a cubic, a braided, a staircase, or a torus shape of the protograph with or without a tail biting.

18. The method according to claim 14, wherein the rule of the message passing further comprises a decoding schedule based on a round-robin schedule, a flooding schedule, an adaptive schedule, a windowed decoding schedule, a randomized schedule, a serialized schedule, a successive cancelling schedule, or a combination thereof.

19. A system for transferring a digital data over a communication channel, comprising:
at least one computing processor;
at least one memory bank;

a transmitter comprising:
  a source to accept a source data to be transferred;
  an encoder to encode the source data, wherein the encoder generates an encoded codeword by executing a method of claim 1;
  a modulator to convert an encoded codeword into a modulated signal, wherein the modulated signal is based on an amplitude modulation, a phase modulation, a quadrature-amplitude modulation, a phase-shift keying, a frequency modulation, an orthogonal frequency-division multiplexing, a spatial-division multiplexing, a pulse position modulation, or a variant thereof; and
  a front-end interface to transmit the modulated signal into the communication channel;
a communication channel comprising a wired medium channel, a wireless medium channel, an optical fiber channel, a vacuum free-space channel, a data storage medium, or a variant thereof;
a receiver comprising:
  a front-end interface to receive an output signal from the communication channel;
  a demodulator to demodulate the output signal of the channel, wherein the demodulator generates a likelihood information as an input belief message;
  a decoder to decode the input belief message, wherein the decoder generate a decoded codeword by executing a method of claim 10; and
  a sink to provide the decoded codeword; and
a controller to define a code specification of a polar-type low-density generator matrix (LDGM) code to be used in the encoder and the decoder, depending on a knowledge of the channel, wherein the code specification comprises at least two stages of proto-polarizations, at least one rule of frozen bits allocation, at least one rule of a protograph permutation, and at least one rule of a message passing for encoding and decoding.

20. The system according to claim 10, wherein the decoder further comprises an un-rolled set of pipelined decoders with a set of serialized interconnects, wherein each of the pipelined decoder further comprises a set of parallel decoders with a set of permutation interconnects.

21. The system according to claim 19, wherein the encoder further comprises an un-rolled set of pipelined encoders with a set of serialized interconnects over multiple stages of proto-polarizations, wherein each of the pipelined encoder further comprises a set of parallel encoders with a set of permutation interconnects.

22. An encoder circuit configured to generate an encoded digital data from a source bit stream as an input digital data, comprising:
  an encoder interface configured to receive the source bit stream;
  at least one memory bank configured to store a computer-executable encoding method;
  one or more computing processors configured to generate a codeword as an encoded digital data from the input digital data by performing steps of the computer-executable encoding method, wherein the steps comprise:
    defining a protograph structure of a polar-type low-density generator matrix (LDGM) code based on a code specification, wherein the code specification comprises at least two stages of proto-polarizations, at least one rule of frozen bits allocation, at least one rule of protograph permutation, and at least one rule of a message passing;
    initializing a data array with the source bit stream and a set of frozen bits according to the at least one rule of frozen bits allocation;
    propagating the data array according to the at least one rule of the message passing over entire stages of the proto-polarizations, wherein the steps further comprising:
      (a) feeding the data array into the at least two stages of the proto-polarizations sequentially from one stage to another stage, wherein each stage of the proto-polarizations comprises at least one proto-polarization unit;
      (b) permuting the data array at each of the proto-polarization unit according to the at least one rule of the protograph permutation; and
      (c) modifying the data array at each of the proto-polarization unit according to the at least one rule of the message passing; and
    generating the codeword based on a specified order as the encoded digital data by arranging the modified data array.

23. The encoder circuit according to claim 22, wherein the encoder interface is configured to transmit the codeword to a modulator circuit that modulates the codeword to transmit the codeword as the encoded digital data via a communication channel.

24. The encoder circuit according to claim 22, wherein the performing steps of the computer-executable encoding method are parallelized and serialized over a set of encoding methods with a data exchange according to the rules of protograph permutations.

25. A decoder circuit configured to generate a decoded digital data from a noisy version of an encoded codeword, comprising:
  a decoder interface configured to receive the noisy encoded codeword as an input data;
  at least one memory bank configured to store a computer-executable decoding method;
  one or more computing processors configured to generate the decoded digital data from the encoded codeword from the decoder interface by performing steps of the computer-executable decoding method, wherein the steps comprise:
    defining a protograph structure of a polar-type low-density generator matrix (LDGM) code based on a code specification, wherein the code specification comprises at least two stages of proto-polarizations, at least one rule of frozen bits allocation, at least one rule of protograph permutation, and at least one rule of a message passing;
    initializing an array of leftward and rightward messages associated with each edge in the protograph structure, wherein the rightward messages feeding into a first stage of the proto-polarizations are fixed based on the at least one rule of the frozen bits allocation and the leftward messages feeding into a last stage of the proto-polarizations are fixed based on the encoded codeword in a specified order;
    propagating the leftward and rightward messages according to the at least one rule of the message passing across the at least two stages of the proto-polarizations comprising at least one variable node and at least one check node, wherein the leftward and rightward messages are updated by an iterative method, wherein the iterative method comprises steps of:

(a) selecting a parallelizable set of variable and check nodes according to the at least one rule of message passing;

(b) feeding a set of the leftward and rightward messages as incoming messages into the selected variable and check nodes according to the at least one rule of the protograph permutation;

(c) calculating a set of outgoing messages based on the incoming messages at the selected variable and check nodes, according to the at least one rule of the message passing;

(d) replacing the set of the leftward and rightward messages with the set of outgoing messages at the selected variable and check nodes; and (e) repeating the steps (a) through (d) for a specified number of times according to the at least one rule of the message passing; and generating an output message as a decoded digital data by selecting a set of the leftward messages in a specified order.

26. The decoder circuit according to claim 25, wherein the decoder interface is connected to a demodulator circuit that demodulates the encoded codeword from a communication channel to provide an initial belief message for decoding, wherein the initial belief message is based on a log-likelihood ratio, a log-likelihood, a likelihood, a soft-decision value, a hard-decision value, or a variant thereof.

27. The decoder circuit according to claim 25, wherein the performing steps of the computer-executable decoding method are un-rolled into pipelined steps to execute the decoding method with a set of serialized interconnects over multiple iterations, wherein each of the pipelined decoding methods is further parallelized into a set of decoding methods with a set of permutation interconnects for increasing a throughput of the decoder.

* * * * *